United States Patent
Tsuji et al.

(10) Patent No.: US 6,255,740 B1
(45) Date of Patent: *Jul. 3, 2001

(54) SEMICONDUCTOR DEVICE HAVING A LEAD PORTION WITH OUTER CONNECTING TERMINALS

(75) Inventors: Kazuto Tsuji; Yoshiyuki Yoneda; Hideharu Sakoda; Ryuji Nomoto; Eiji Watanabe; Seiichi Orimo; Masanori Onodera, all of Kawasaki; Masaki Waki, Satsuam-gun, all of (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/847,222

(22) Filed: May 1, 1997

Related U.S. Application Data

(62) Division of application No. 08/611,007, filed on Mar. 5, 1996, now Pat. No. 5,656,550, which is a continuation of application No. 08/463,050, filed on Jun. 5, 1995, now abandoned.

(30) Foreign Application Priority Data

| Aug. 24, 1994 | (JP) | 6-199845 |
| Mar. 9, 1995 | (JP) | 7-050054 |
| Aug. 22, 1995 | (JP) | 7-213287 |
| Aug. 24, 1995 | (JP) | 7-216127 |

(51) Int. Cl.$^7$ .................................................. H01L 23/29
(52) U.S. Cl. .......................... 257/792; 257/668; 257/684; 257/690; 257/692; 257/734; 257/737; 257/766; 257/778
(58) Field of Search ..................................... 257/792, 778, 257/697, 779, 734, 737, 738, 666, 735, 668, 684, 690, 692, 693, 730

(56) References Cited

U.S. PATENT DOCUMENTS

| 3,699,010 | * | 10/1972 | Nash | 257/766 |
| 5,224,021 | * | 6/1993 | Takada et al. | 361/406 |
| 5,363,279 | * | 11/1994 | Cha | 361/767 |
| 5,436,500 | * | 7/1995 | Park et al. | 257/696 |
| 5,508,556 | * | 4/1996 | Lin | 257/691 |
| 5,557,143 | * | 9/1996 | Seiji | 257/666 |
| 5,569,955 | * | 10/1996 | Chillara et al. | 257/666 |
| 5,616,953 | * | 4/1997 | King et al. | 257/766 |
| 5,719,440 | * | 2/1998 | Moden | 257/697 |
| 5,760,471 | * | 6/1998 | Fujisawa et al. | 257/692 |

* cited by examiner

Primary Examiner—Carl Whitehead, Jr.
Assistant Examiner—Matthew E. Warren
(74) Attorney, Agent, or Firm—Armstrong, Westerman, Hattori, McLeland & Naughton, LLP

(57) ABSTRACT

This invention relates to a semiconductor device in which a plurality of outer terminals are arranged in a lattice formation on a flat surface. The semiconductor device has a semiconductor chip, a lead member having a lead portion and an outer connecting terminal connected integrally to the lead portion, the lead portion electrically connected to the semiconductor chip, the lead portion extending outwardly from the semiconductor chip, the outer connecting terminal extending downwardly from the lead portion, a sealing resin sealing the semiconductor chip and the lead portion, a bottom face of the semiconductor chip and a bottom face of the lead portion being exposed from the sealing resin, and an insulating member covering the bottom face of the semiconductor chip and the bottom face of the lead portion. Also, the semiconductor device has a semiconductor chip having a predetermined number of electrode pads, a predetermined number of leads electrically connected to the electrode pads, each of the leads having a projecting terminal portion formed by bending the lead, and a resin portion sealing the semiconductor chip and the leads, wherein the terminal portions are exposed from one face of the resin portion.

7 Claims, 49 Drawing Sheets

SEMICONDUCTOR DEVICE HAVING A LEAD PORTION WITH OUTER CONNECTING TERMINALS

CROSS-REFERENCE TO THE RELATED APPLICATION

This is a divisional of application Ser. No. 08/611,007 filed Mar. 5, 1996, now U.S. Pat. No. 5,656,550, which is a Continuation-in-Part of application Ser. No. 08/463,050, filed Jun. 5, 1995, now abandoned.

The present invention is a continuation-in-part (CIP) of copending application, Ser. No. 08/463,050 filed on Jun. 5, 1995.

BACKGROUND OF THE INVENTION

1. Field of the Invention

The present invention generally relates to a semiconductor device and a method for producing thereof, and more particularly to a semiconductor device in which a plurality of outer terminals are arranged in a lattice formation on a flat surface and a method for producing thereof.

2. Description of the Prior Art

Currently, with a need for small, thin, high-speed and high-performance electrical appliances, a demand for small, high-density and high-performance semiconductor devices is increasing. In order to respond to the demand, a QFP (Quad Flat Package) type semiconductor device and a QTP (Quad Tape-carrier Package) type semiconductor device have been gradually replaced by μBGA-type semiconductors using BGA (Ball Grid Array) techniques or TAB (Tape Automated Bonding) techniques. Also, a reliability and electrical characteristics of the small-size semiconductor devices are desired to be improved.

Presently, a semiconductor device of a surface-package type is widely used in order to provided a high-density semiconductor device. In the QFP semiconductor devices of the surface-package type, a terminal has various shapes such as a gull-wing shape or a J-shape. The QFP semiconductor devices having a J-shaped terminal is called QFJ (Quad Flat J-Leaded Package). In the QFJ semiconductor device, BGA technique has been widely used, as described above.

FIG. 1 is a schematic illustration showing a QFJ-type semiconductor device. In the semiconductor device 10 shown in FIG. 1, leads (outer leads) 10b extend from four edges of the package 10a in which a semiconductor chip is molded. Each of the leads is bent in a J-shape. The semiconductor device 10 is mounted on the pattern of the substrate through solder.

FIGS. 2A and 2B are schematic illustrations showing a conventional μBGA-package-type semiconductor device. FIG. 2A is a sectional view and FIG. 2B is a plan view.

In a semiconductor device 11 shown in FIGS. 2A and 2B, a prescribed number of pads 13 are provided on a semiconductor chip 12. On the semiconductor chip 12 except where the pads 13 are provided, an elastic adhesive 14 is applied. Around the semiconductor chip 12, a frame member 16 made of, for example, a metal, for protecting the semiconductor chip 12 and for releasing heat generated by the semiconductor chip 12, is secured through an adhesive 15a. An adhesive 15b is supplied on the frame member 16.

On the other hand, a pattern 18 of copper foil is provided on a resin film 17 of, for example, polyimide (PI). The pattern 18 comprises outer pads 18a and leads 18b extended from the outer pads 18a in order to constitute a TC (Tape Carrier) structure. Also, holes 19 are formed in the resin film 17 at positions corresponding to the outer pads 18a. In the holes 19, ball electrodes 20 of gold or solder connected to the outer pads 18a are provided in a lattice formation. A pitch of the ball electrodes is, for example, 0.5 mm. These ball electrodes 20 function as outer terminals.

The resin film 17 is bonded on the above-mentioned adhesive 14, 15b. The lead 18b extended from the pattern 18 is connected to the pads 13 of the semiconductor chip 12 by, for example, welding. These portions are sealed by a resin 15c of, for example, epoxy resin. The semiconductor device 11 is formed in the μBGA package structure in which the ball electrodes 20 are provided in a size similar to the semiconductor chip size.

A flat size of the semiconductor device 11 is determined by the semiconductor chip size, a number of terminals and a terminal pitch.

That is, when an area determined by the number of the pads and the terminal pitch does not exceed an area of the semiconductor chip 12, the flat size of the semiconductor device 12 is determined by the pads provided on the semiconductor chip 12 being outside of the outer terminals arranged in a lattice formation.

On the contrary, when an area determined by the number of the pads and the terminal pitch exceeds the area of the semiconductor chip 12, the pads are not always outside of the outer terminal, and a flat area of the semiconductor device is determined by an area surrounded by the outer terminals arranged in a lattice formation.

However, in the semiconductor device 10 shown in FIG. 1, since the leads extend from the side faces of the package 10, the number of pins is limited and the production cost cannot be easily reduced.

Also, since the TAB method is used for the connection between the semiconductor chip 12 and the outer terminals, the semiconductor device 11 does not have a flexibility.

Also, when all the outer terminals are provided on the semiconductor chip 12, packing is difficult. For example, when more than 324 pins are provided, and a pitch for the pads is less than 80 μm, a pitch for the outer terminals is required to be less than 0.4 mm. On the other hand, when a pitch for the outer terminals is more than 0.5 mm, the semiconductor chip 12 is required to be increased in size, and a total cost therefore becomes higher.

Also, since the outer terminals (bump electrodes 20) are required to be plated in a production of the semiconductor device 11, a cost for the production is increased.

Further, since a part of the semiconductor chip 12 is exposed in the conventional semiconductor device 11, a reliability thereof is lowered.

SUMMARY OF THE INVENTION

Accordingly, it is a general object of the present invention to provide a novel and useful semiconductor device and a method for producing thereof by which a cost for production is reduced and a reliability and electrical characteristics can be improved.

The above object of the present invention is also achieved by a semiconductor device comprising a semiconductor chip, a lead member having a lead portion and an outer connecting terminal connected integrally to the lead portion. The lead portion is electrically connected to the semiconductor chip, the lead portion extending outwardly from the semiconductor chip and the outer connecting terminal extending downwardly from the lead portion, a sealing resin seals the semiconductor chip and the lead portion. A bottom face of the semiconductor chip and a bottom face of the lead portion being exposed from the sealing resin, and an insulating member covering the bottom face of the semiconductor chip and the bottom face of the lead portion. According to the invention, since the lead member has the lead portion extending outwardly from the semiconductor chip and the outer connection terminal extending downwardly from the lead portion, a position of the outer connecting terminal is determined by the length of the lead portion which can be freely determined. Therefore, the position of the outer connecting terminal is determined regardless of the size of the semiconductor chip and adaptability of the semiconductor device can be improved. Also, since the lead portion and the outer connecting terminal are formed integrally, through holes or wires for the electrical connection between the lead portion and the outer connecting terminal are not required. Therefore, the production cost of the semiconductor device can be reduced.

In the above invention, the outer connecting terminal of the lead member may have a pole terminal portion and a terminal end portion provided under the pole terminal portion, the lead portion and the terminal end portion made of material which functions as a resist to the pole terminal portion. In the above invention, the lead portion may have a lower layer made of a material selected from the group consisting of nickel, aluminum and titanium and an upper layer made of a material selected from the group consisting of gold, silver and palladium. The pole terminal portion is made of copper, and the terminal end portion has an upper layer made of a material selected from the group consisting of nickel, aluminum and titanium and an upper layer made of a material selected from the group consisting of gold, silver and palladium. According to the invention, the lead portion and the terminal end portion function as resist when the pole terminal portion is produced. Thus, the pole terminal portion is produced easily and economically.

The above invention may further include a second insulating member between the semiconductor chip and the insulating material. According to the invention, an outer connecting terminal or a cooling member for the semiconductor chip can be provided under the second insulating member.

In the above invention, the outer connecting terminal is provided under the semiconductor chip. Also, in the above invention, a plurality of outer connecting terminals may be provided, at least one of the outer connecting terminal is provided under the semiconductor chip and at least one of the outer connecting terminals is provided outwardly of the semiconductor chip. According to the invention, the number of terminals provided in the semiconductor device can be increased and the semiconductor device can be highly-integrated.

The above object of the present invention is also achieved by a method for producing a semiconductor device comprising a lead frame production step for providing a lead portion on an upper face of a substrate as a pole terminal portion and a terminal end portion on a bottom face of the substrate, a semiconductor chip mounting step for mounting a semiconductor chip on the lead frame through a soluble insulating material and electrically connecting the semiconductor chip to the lead portion, a resin sealing step for sealing the semiconductor chip and the lead portion with a sealing resin, a substrate removal step for removing the substrate and the soluble insulating material except where the terminal end portion is provided, an insulating material providing step for sealing the bottom face of the semiconductor chip and the bottom face of the lead portion except where the outer connecting terminal is provided with an insulating member, and a sheathing step for providing an outer layer on the outer connecting terminal having the pole terminal portion and the terminal end portion both of which protrude from the insulating material.

According to the invention, since the semiconductor device is produced from the lead frame prepared in the lead frame production step, the semiconductor device can be produced efficiently and accurately. Also, in the semiconductor chip mounting step, since the semiconductor chip is mounted in the lead frame through the soluble insulating material, which is removed in the substrate removal step, the bottom surface of the semiconductor chip is exposed. Thus, the bottom face of the semiconductor chip directly contacts the insulating material, which improve heat-release characteristics. Further, after the insulating material providing step, since the outer layers are provided in the outer connecting terminal, a short circuit between the lead portions and a short circuit between the lead portion and the semiconductor chip, due to the outer layer stuck to the lead portion or semiconductor chip, can be avoided.

The above object of the present invention is also achieved by a method for producing a semiconductor device comprising a lead frame production step for providing a lead portion on an upper face of a substrate as a pole terminal portion and a terminal end portion in a bottom face of the substrate, a semiconductor chip mounting step for mounting a semiconductor chip on the lead frame through an insoluble insulating material and electrically connecting the semiconductor chip to the lead portion, a resin sealing step for sealing the semiconductor chip and the lead portion with a sealing resin, a substrate removal step for removing the substrate except where the terminal end portion is provided, an insulating material providing step for sealing the bottom face of the semiconductor ship and the bottom face of the lead portion except where the outer connecting terminal is provided with an insulating member, and a sheathing step for providing an outer layer on the outer connecting terminal provided with the pole terminal portion and the terminal end portion both of which protrude from the insulating material.

According to the invention, since the semiconductor device is produced from the lead frame prepared in the lead frame production step, the semiconductor device can be produced efficiently and accurately. Also, after the insulating material providing step, since the outer layers are provided in the outer connecting terminal, a short circuit between the lead portions and a short circuit between the lead portion and the semiconductor chip, due to the outer layer stuck to the lead portion or semiconductor chip, can be avoided. Further, since the semiconductor chip is mounted on the lead frame through insoluble insulating material, which is not removed in the substrate removal step, a heat release material or outer connecting terminal can be provided under the insoluble insulating material.

In the above invention, the lead portion and the terminal end portion may be resist material, and dissolving the substrate in an etching liquid using the terminal end portion as a resist in the substrate removal step. According to the invention, the resist is not required to produce the pole terminal portion. Therefore, the number of steps to produce the pole terminal portion can be reduced and the production of the semiconductor device can be conducted easily and economically.

In the above invention, cut portions corresponding to a shape of the outer connecting terminal may be formed in the terminal end portion before the substrate is removed in the substrate removal step. According to the invention, when the etching does not reach the cut portions, the terminal end portion outside of the cut portion is connected to the substrate. However, when the etching reach the cut portions, the terminal end portion outside of the cut portion is removed from the substrate. Thus, the terminal end portion is prevented from being extended from the pole terminal portion after etching.

In the above invention, the sheathing step may include the steps of preparing a dimple plate having a dimple portion at a position corresponding to the outer connecting terminal, filling a solder paste in the dimple portion of the dimple plate, inserting the outer connecting terminal in the dimple portion in which the solder paste is filled, and heating the outer connecting terminal inserted in the dimple portion and forming the outer layer on the outer connecting terminal. According to the invention, the sheathing step can be conducted easily.

In the above invention, a resin stopper portion can be provided on the substrate around a portion where the sealing resin is provided in the lead frame production step, the resin is potted on the substrate in the resin sealing step, and the resin stopper is removed with the substrate in the substrate removal step. According to the invention, since the resin stopper portion is provided on the substrate, the sealing resin can be prevented from leaking out of the resin stopper portion. Also, a mold is not required in this method, the resin sealing step can be simplified and the production cost of the semiconductor device can be reduced. Further, since the resin stopper portion is removed with the substrate in the substrate removal step, the resin stopper portion does not interfere with the method for production.

In the above invention, the lead frame production step may include the steps of applying a resist having openings at positions corresponding to the lead portion and the terminal end portion on the substrate, forming the lead portion and the terminal end portion at the openings by a plating method, and removing the resist to form the lead portion and the terminal end portion at certain positions on the substrate. Also, in the above invention, the lead frame production step may include the steps of providing a metal mask having openings at positions corresponding to the lead portion and the terminal end portion on the substrate, forming the lead portion and the terminal end portion in the opening by a vaporization method, and removing the metal mask to form the lead portion and the terminal end portion at predetermined positions in the substrate. Further, in the above invention, the lead frame production step may include the steps of providing electro-conductive material to be the lead portion and the terminal end portion on the whole surface of the upper layer and lower layer of the substrate by a plating method, providing resist covering the electro-conductive material formed on the whole surface of the upper layer and the lower layer of the substrate at positions of the lead portion and the terminal end portion, and removing the electro-conductive material which is not covered by the resist by etching to form the lead portion and the terminal end portion. According to the invention, the lead frame can be produced efficiently and accurately.

In the above invention, the lead frame production step may include the steps of forming a plurality of the lead portions and the terminal end portions from a substrate, and dividing the substrate into several parts to prepare a plurality of the lead frames for a plurality of semiconductors. According to the invention, a plurality of lead frames can be produced efficiently and accurately.

The above object of the present invention is also achieved by a method for producing a semiconductor device comprising the steps of, producing a lead frame by providing a substrate having an upper face and a bottom face, forming a lead portion on the upper face as a pole terminal portion and a terminal end portion on the bottom face, mounting a semiconductor chip on the lead frame through a soluble insulating material and electrically connecting the semiconductor chip to the lead portion, sealing the semiconductor chip and the lead portion with a sealing resin, removing the substrate and the soluble insulating material except where the terminal end portion is provided, insulating the bottom face of the semiconductor chip and the bottom face of the lead portion with an insulating material except where the outer connecting terminal is located, and sheathing the outer connecting terminal provided with the pole terminal portion and the terminal end portion by providing an outer layer thereon, the terminal end portion and the pole terminal portion protruding from the insulating material.

The above object of the present invention is also achieved by a semiconductor device comprising a semiconductor chip having a predetermined number of electrode pads, a predetermined number of leads electrically connected to the electrode pads, each of the leads having a projecting terminal portion formed by bending the lead, and a resin portion sealing the semiconductor chip and the leads, so that the terminal portions are exposed from one face of the resin portion.

The above object of the present invention is also achieved by a method for producing a semiconductor device comprising the steps of, preparing a predetermined number of leads, each of the leads having a terminal portion of projecting shape, connecting electrically the leads to a semiconductor chip mounted thereon, sealing the semiconductor chip and leads with resin to form a resin portion, and grinding one face of the resin portion facing the terminal portions and exposing the terminal portion from the one face of the resin portion. In the above invention, the resin may be ground by a blasting method or an etching method.

According to the above invention, a semiconductor chip is electrically connected to a predetermined number of the leads having a terminal portion formed in a bent and projecting shape. The semiconductor chip and the leads are sealed by a molded resin. The molded resin is ground by, for example, a blasting method or an etching method so that the terminal portions are exposed from resin. Therefore, the semiconductor device can be made highly-integrated, compared to a semiconductor device in which terminals are arranged on the same surface as that of the semiconductor chip and extend from the side faces thereof. Also, the preparation of the substrate or the solder bump, which is required in the production of the BGA-type semiconductor, can be omitted and the number of the parts is reduced. Thus, the production cost is reduced.

In the above invention, the terminal portions of the leads are arranged in a staggered configuration. According to the invention, the pads on the substrate can be arranged in a staggered configuration also to improve the package density.

The above invention further comprises a step of removing the resin inside the projecting portion of the terminal portions. Thus, the terminal can be fixed to the substrate through, for example, solder.

In the above invention, the lead may have a expansion portion which absorbs the elongation of the lead when the lead is bent to form the terminal portion. Therefore, the terminal portions are accurately formed.

Other objects and further features of the present invention will be apparent from the following detailed description when read in conjunction with the accompanying drawings.

DESCRIPTION OF THE PREFERRED EMBODIMENTS

The preferred embodiments of the present invention will now be described in further detail with reference to the accompanying drawings.

Figure 3A:
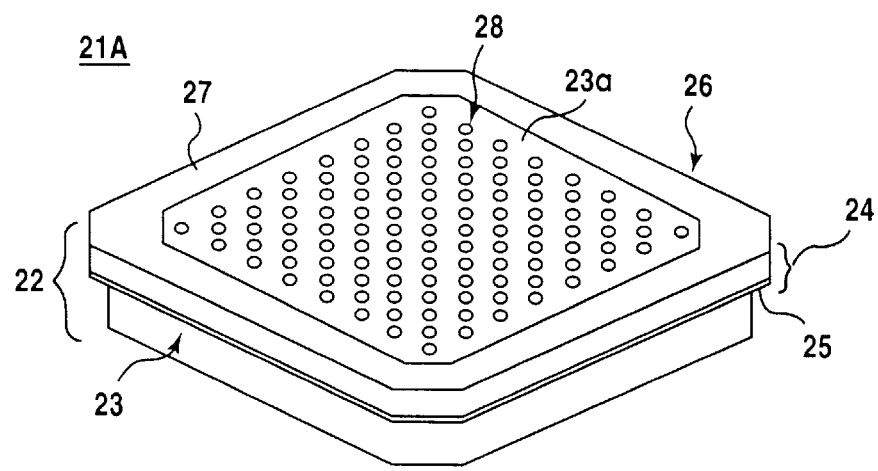
FIG. 3A is a perspective view showing a semiconductor device of a first embodiment.
Figure 3B:
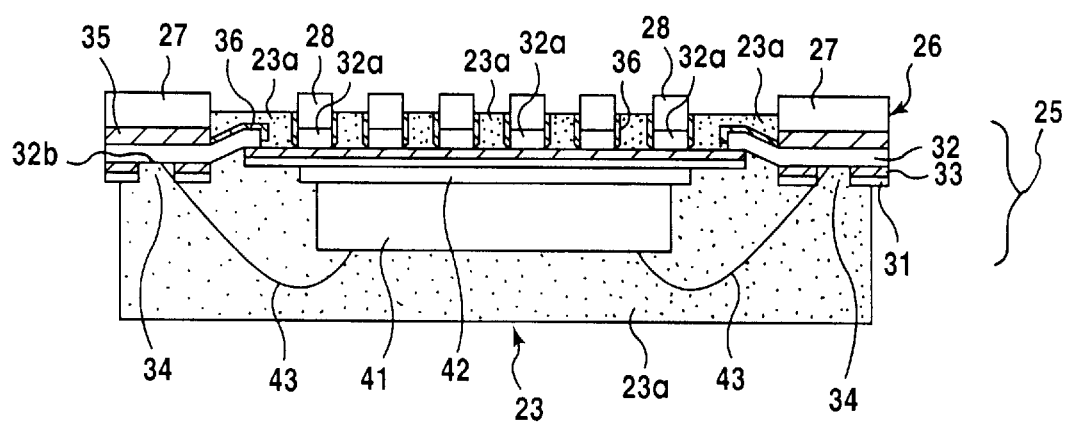
FIG. 3B is a sectional view the semiconductor device of the first embodiment.

FIGS. 3A and 3B are schematic illustrations showing a first embodiment of the present invention, in which FIG. 3A is a perspective view showing a bottom surface of a semiconductor device of the first embodiment and FIG. 3B is a sectional view thereof.

Figure 1:
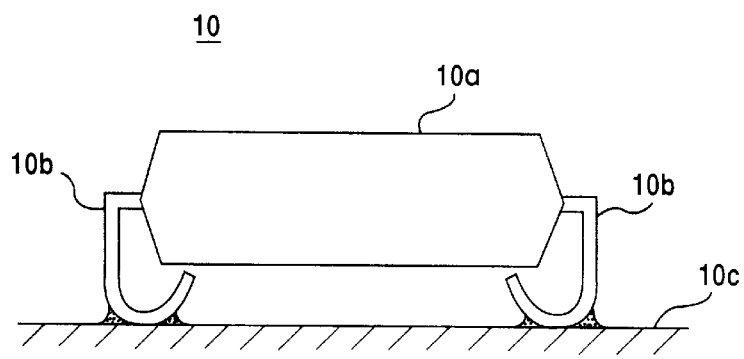
FIG. 1 is a schematic illustration showing a conventional QFJ-semiconductor device.
Figure 2A:
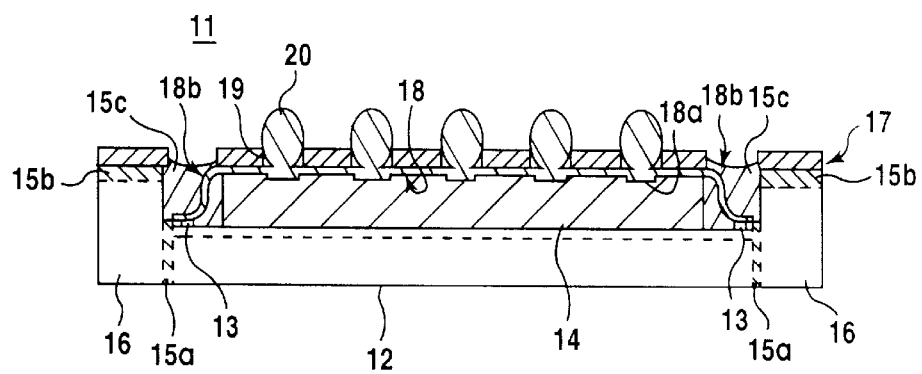
FIG. 2A is a sectional view showing a conventional μBGA-package-type semiconductor device.
Figure 2B:
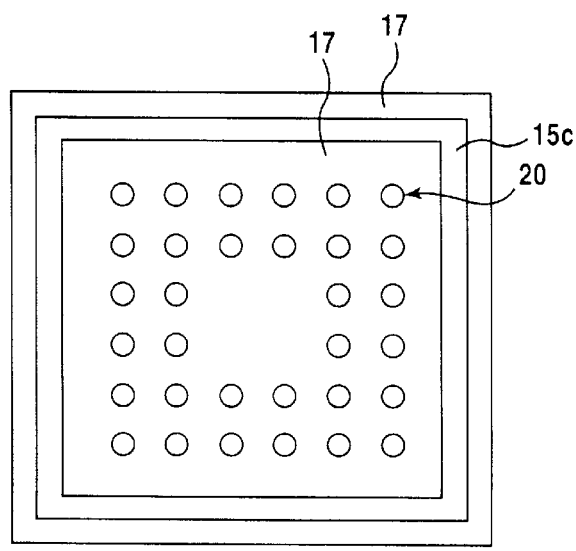
FIG. 2B is a plan view showing the conventional μBGA-package-type semiconductor device.

A semiconductor device 21A shown in FIGS. 3A and 2B comprises a resin portion 23 in which a package 22 is molded and a terminal portion 24. The terminal portion 24 comprises a pattern portion 25 formed by a flexible PWB (Print Wiring Board) and an outer terminal portion 26.

The outer terminal portion 26 is made of a conductive metal, such as copper. In a periphery of the outer terminal 26, a frame terminal 27 is formed. Inside of the frame terminal 27, a prescribed number (for example, 324) of pole terminal portions 28 which are insulated by a resin 23a respectively are arranged in a lattice formation. The frame terminal 27 functions as a base when wire bonding to be described later is conducted. Also, the frame terminal 27 functions as a power supply pattern or a grounding pattern to improve anti-noise characteristics, as will be described later.

As shown in FIG. 3B, the pattern portion 25 comprises a base layer 31 of an insulating film or metal frame, a pattern layer 32 made of, for example, a copper foil and an insulating layer 33 of an epoxy resin arranged between them. In a center of the base layer 31, a semiconductor chip 41 is mounted through an adhesive 42 of, for example, a silver paste. In the pattern layer 32, terminal connecting portions 32a and wire connecting portions 32b are formed respectively corresponding to the pole terminal portions 28.

In the base layer 31, opening portions 34 through which the wire connecting portions 32b are exposed are formed around the semiconductor chip 41. Pads provided in a periphery of the semiconductor chip 41 are connected to the wire connecting portions 32b through wires 43, as will be described later referring to FIGS. 4A and 4B.

The pattern layer 32 of the pattern portion 25 and the outer terminal portion 26 (frame terminal 27) are bonded through an insulating layer 35 of an epoxy adhesive or an insulating film. In this case, the terminal connecting portions 32a of the pattern layer 32 are electrically connected to the pole terminal portions 28 of the outer terminal portion 26 through plating layer 36. An exposed surface of the frame terminal 27 and the pole terminal portion 28 is plated, as will be described later.

Figure 4A:
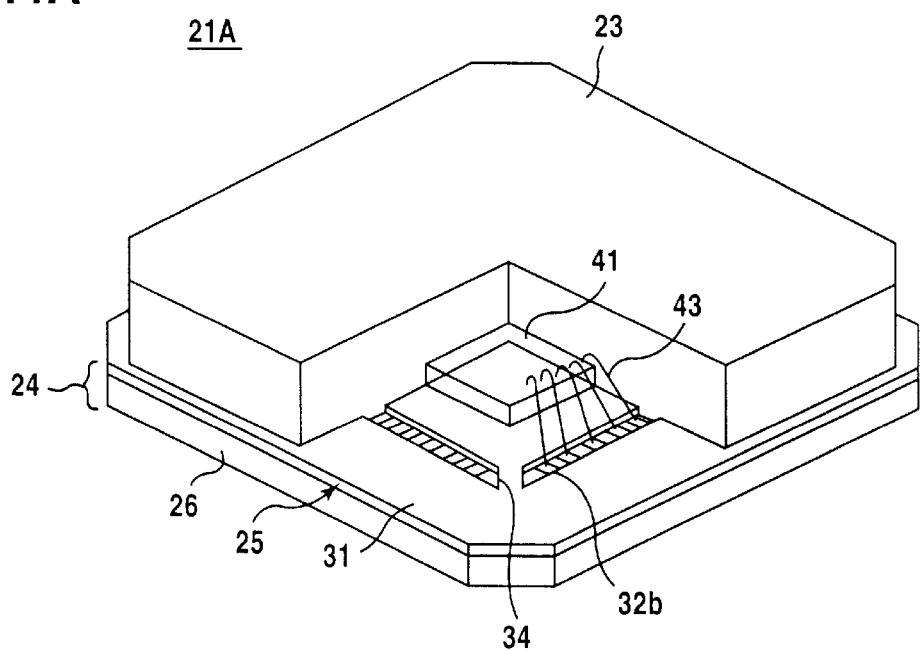
FIG. 4A is a perspective broken view showing the semiconductor device of the first embodiment.
Figure 4B:
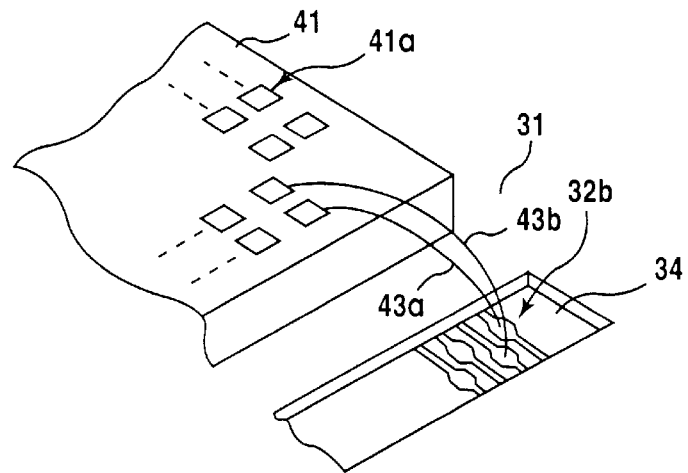
FIG. 4B is an enlarged perspective view showing wire-bondings.

FIG. 4A is a perspective broken view showing the semiconductor device of the first embodiment and FIG. 4B is an enlarged view of wire bonding.

As shown in FIG. 4A, the semiconductor chip 41 is mounted in the center of the base layer 31, and the wire connecting portions 32b of the pattern layer 32 exposed through the opening portions 34 are electrically connected to the semiconductor chip 41 through the wires 43, as described above in FIGS. 4A and 4B.

As shown in FIG. 4B, pads 41a are arranged on the semiconductor chip 41 in two lines along the opening portions 34 of the base layer 31. The wire connecting portions 32b of the pattern layer 32 exposed from the opening portions 34 are arranged in a staggered formation for the wire bonding.

The pads arranged close to the opening portions 34 are connected to the wire connecting portions 32b arranged close to the semiconductor chip 41 through the wires 43a. The pads apart from the opening portions 34 are electrically connected to the wire connecting portions 32b apart from the semiconductor chip 41 through the wires 43b forming arcs of a larger radius than that of the wires 43a. According to the structure thereof, a contact between the wires 43a, 43b is prevented and a wiring density can be improved.

Figure 5A:
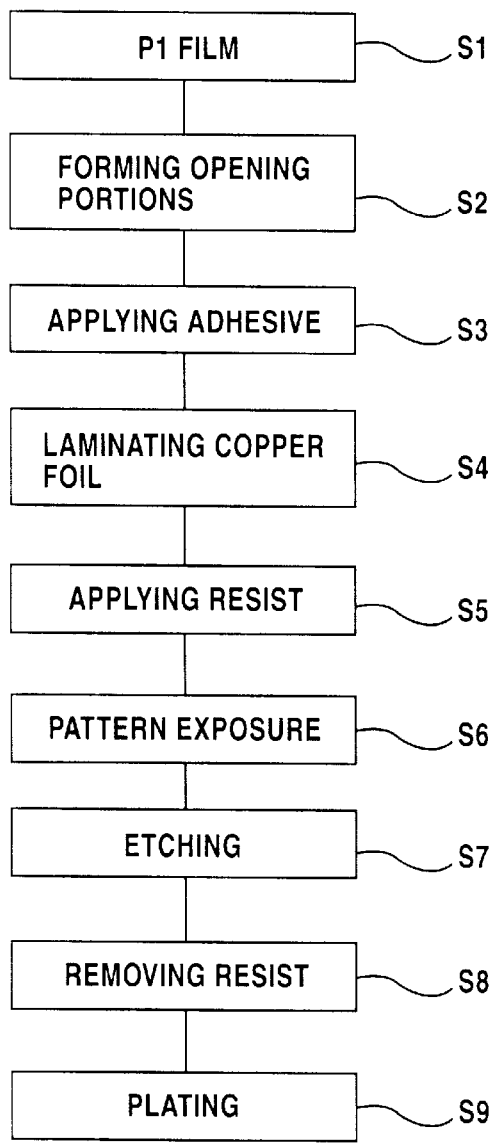
FIG. 5A is a flowchart showing a method for producing a pattern portion shown in FIGS. 3A and 3B in which a base thereof is an insulating film.
Figure 5B:
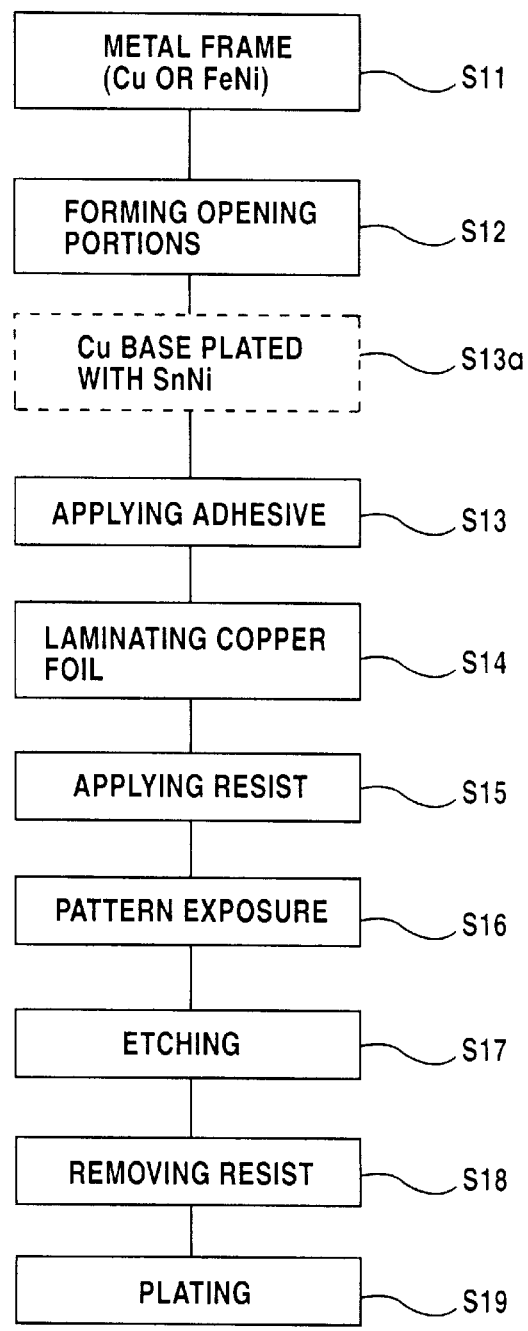
FIG. 5B is a flowchart showing a method for producing a pattern portion shown in FIGS. 3A and 3B in which the base thereof is a metal member.

FIGS. 5A and 5B are flowcharts showing processes for producing the pattern portion 25 shown in FIGS. 3A and 3B. FIG. 5A shows a process for producing the pattern portion in which a base thereof is an insulating film and FIG. 5B shows a process for producing the pattern portion in which the base thereof is a metal (i.e. copper or tin/nickel alloy) frame.

In FIG. 5A, at first, a polyimide (PI) film to be the base layer 31 is prepared (Step S1). The PI film is punched in order to form the opening portions 34 to expose the wire connecting portions 32b (Step S2). After an epoxy insulating adhesive to be the insulating layer 33 is applied on the PI film (Step S3), a copper foil to be the pattern layer 32 is laminated on the adhesive (Step S4). Next, after a resist is applied on the copper foil (Step S5), a prescribed pattern is exposed (Step S6). After the exposure, as an etching process, a chemical grinding is conducted on the exposed surface (Step S7). After that, the resist applied is removed (Step S8). Through the above steps, the wire connecting portions 32b are exposed through the opening portions 34 of the base layer 31. After that, a plating (gold, silver or palladium) for the wire bonding is conducted on the wire connecting portions 32b (Step S9).

On the other hand, when the base layer 31 is a metal frame, a metal frame of copper or iron/nickel is prepared (Step S11), as shown in FIG. 5B. The opening portions 34 for exposing the wire connection portions 32b are formed by a punching or an etching process (Step S12). After that, when the base is a copper, the base is plated with SnNi (Step S13a). After the opening portions 34 are formed or the base layer 31 is plated with SnNi, an insulating epoxy adhesive to be the insulating layer 33 is applied on the base layer 31 (Step S13). On the insulating epoxy layer, a copper foil to be the pattern layer 32 is laminated (Step S14). On the copper foil, a resist is applied according to the prescribed pattern (Step S15). The copper foil is exposed in order to form the pattern (Step S16). After the exposure, an etching process is conducted on the exposed surface (Step S17). After that, the resist is removed (Step S18). The wire connecting portions 32b exposed through the opening portion 34 of the base layer 31 are plated with gold, silver or palladium for the wire bonding (Step S19).

Figure 6:
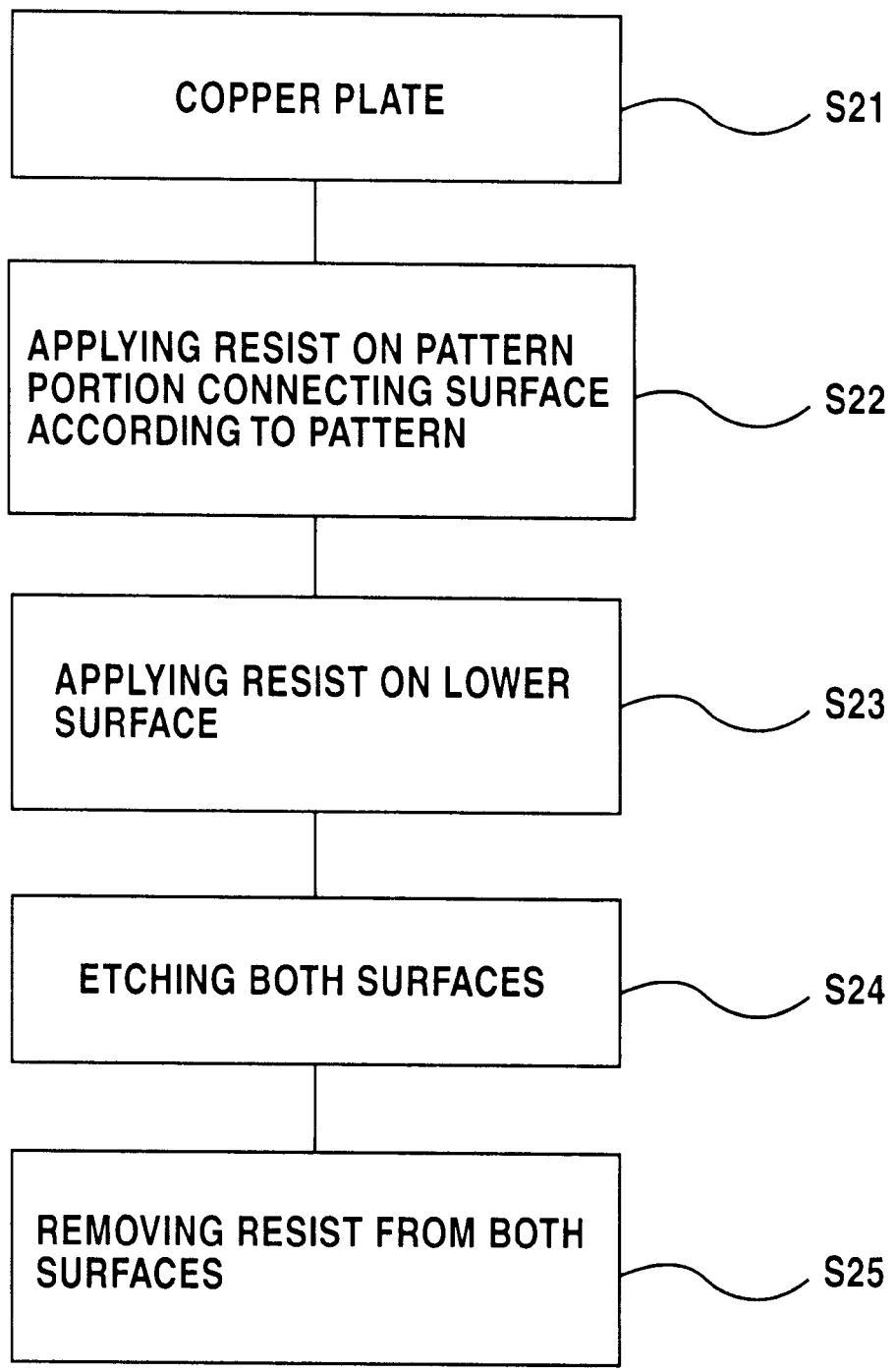
FIG. 6 is a flowchart showing a method for producing an outer terminal portion shown in FIGS. 3A and 3B.

FIG. 6 is a flowchart showing a process for producing the outer terminal portion 26 shown in FIGS. 3A and 3B. FIG. 6 shows a process in which the outer terminal is formed by an etching process. In FIG. 6, a copper plate is prepared (Step S21). A resist is applied on a contacting surface to the pattern portion 25 of the copper plate according to the pattern in which the frame terminal 27 and the pole terminal portions 28 are formed (Step S22). A resist is applied to an opposite surface to the contacting surface to the pattern portion of the copper plate (Step S23). After both surfaces are etched (Step S24), the resist on both surfaces is removed (Step S25). In this case, the contacting surface to the pattern portion is half-etched, and the frame terminal 27 is connected to the pole terminal portions 28 through thin plate portions.

Figure 7A:
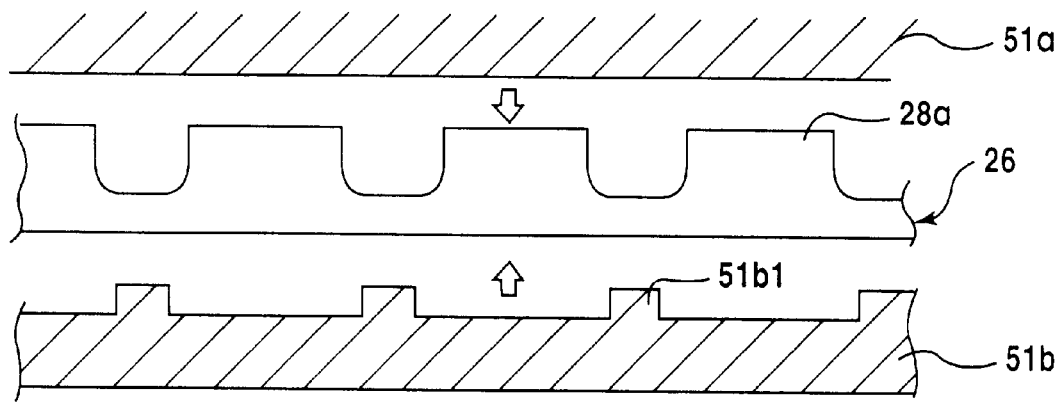
FIGS. 7A and 7B are schematic illustrations showing a post treatment to the outer terminal shown in FIGS. 5A and 5B.
Figure 7B:
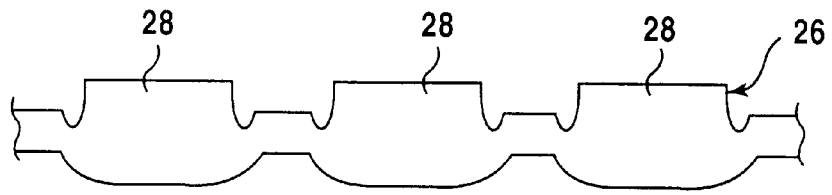
Figure 8A:
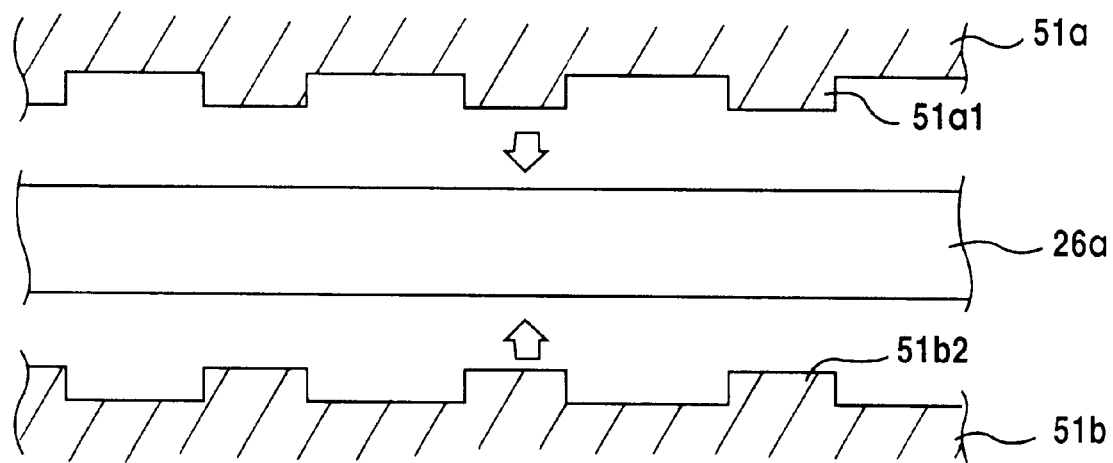
FIGS. 8A and 8B are schematic illustrations showing a method for producing a variation of the outer terminal.
Figure 8B:
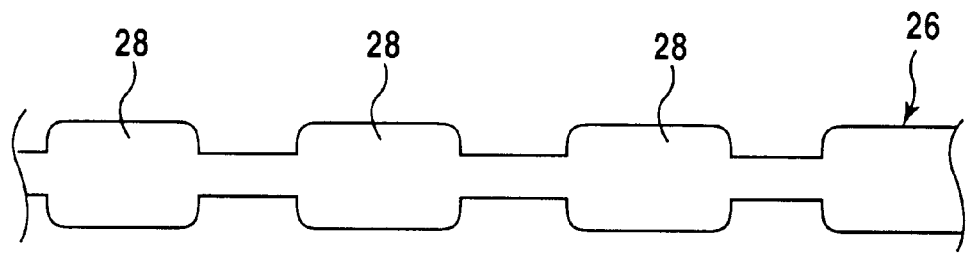

FIGS. 7A and 7B are schematic illustrations showing a post-treatment to the outer terminal portion 26. FIGS. 8A and 8B are schematic illustrations showing a method for producing a variation of the outer terminal 26.

As shown in FIG. 7A, in the outer terminal 26 formed by the process shown in FIG. 6, projections 28a to be pole terminal portions 28 are formed in the contacting surface to the pattern portion. An opposite surface is a flat plate which is not etched.

The outer terminal portion 26 is placed in a press 51 comprising a punch 51a and a die 51b. In this case, the contacting surface to the pattern portion faces the flat punch 51a and the opposite surface thereof faces the die 51 in which projection $51b_1$ corresponding to the recess portions between the projections 28 are provided. As shown in FIG. 7B, the pole terminal portion 28 is formed to protrude from the opposite surface by the stamping of the press 51.

In FIG. 8A, the outer terminal 26 in which the projections 28a are formed as shown in FIG. 7A is not used. In this case, a copper plate 26a is placed between the punch 51a and the die 51b, in which projections $51a_1$ formed in the punch 51a and projections $51b_2$ formed in the die 51b face each other. As shown in FIG. 8B, the outer terminal 26 having the pole terminal portions 28 protruding from both surfaces thereof is formed by stamping of the press 51. In this case, either surface can be used as a contacting surface to the pattern portion.

Figure 9A:
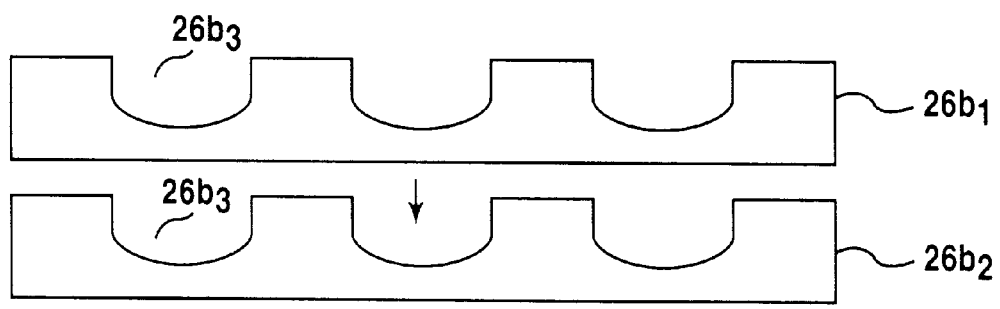
FIGS. 9A and 9B are schematic illustrations showing a method for producing another variation of the outer terminal.
Figure 9B:
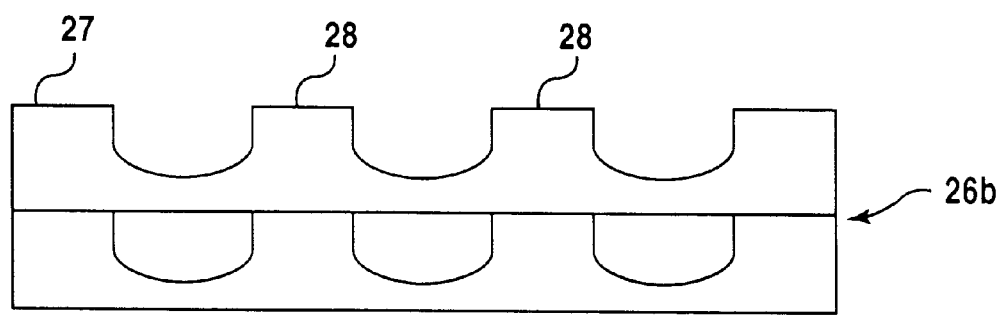
Figure 10A:
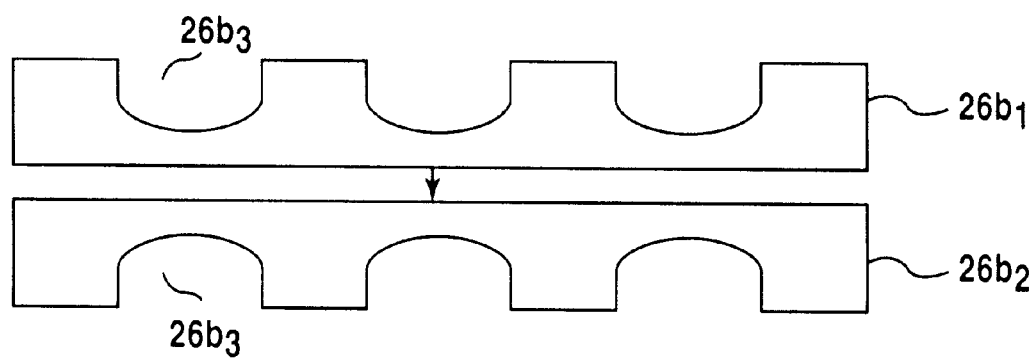
FIGS. 10A and 10B are schematic illustrations showing a method for producing another variation of the outer terminal.
Figure 10B:
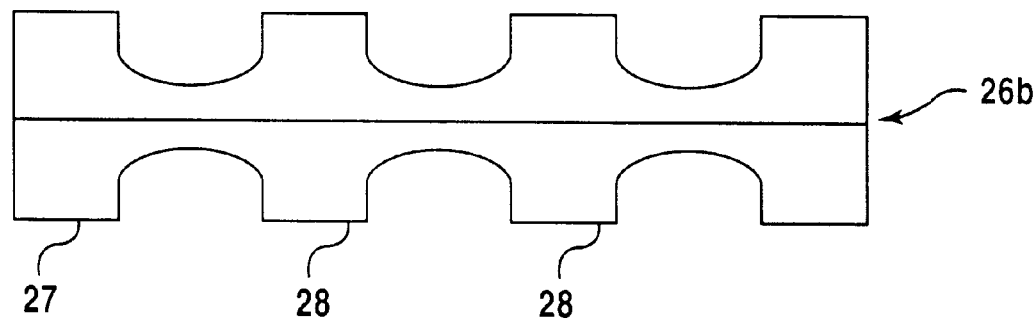
Figure 11A:
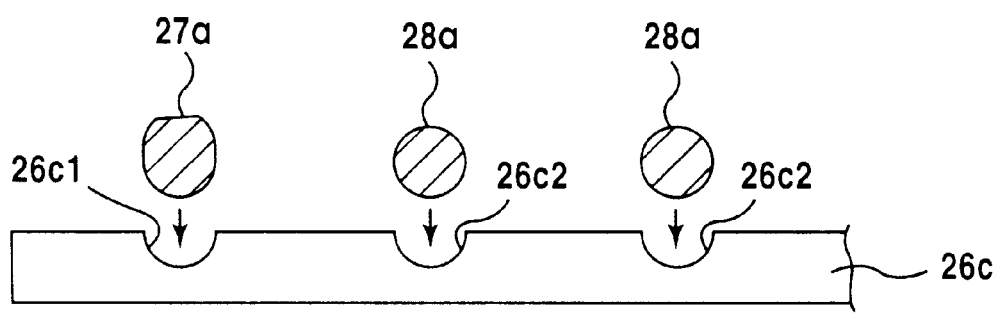
FIGS. 11A and 11B are schematic illustrations showing a method for producing another variation of the outer terminal.
Figure 11B:
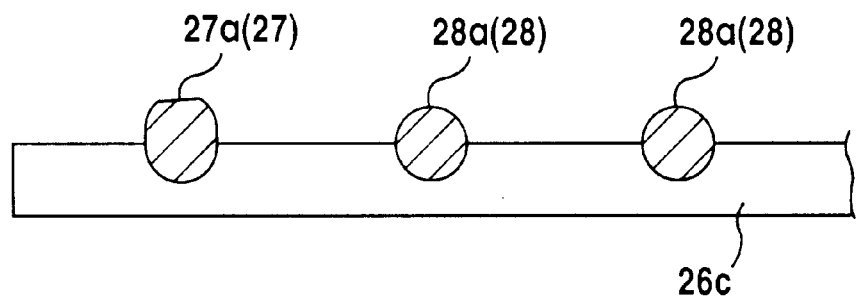

FIGS. 9–11 show methods for producing varieties of the outer terminal portion shown in FIG. 6.

FIG. 9A shows two conductive metal plates $26b_1$, $26b_2$ (i.e. copper alloy) in which a prescribed number of recesses $26b_3$ are prepared. The conductive metal plate $26b_1$ is laminated on the conductive metal plate $26b_2$ so as that a surface of the conductive metal plate $26b_1$ in which the recesses $26b_3$ are not formed faces a surface of the conductive metal plate $26b_2$ in which the recess $26b_3$ are formed, as shown in FIG. 9B. These two conductive metal plates $26b_1$, $26b_2$ are bonded together by ultrasonic machining in order to form the outer terminal 26. The outer terminal 26 in which the frame terminal 27 is connected to the pole terminal portions 28 through thin portions, as will be described later in FIG. 13B, is formed by, after the exposed surface on which the recesses $26b_3$ are not formed are sealed by resin, the surface being etched.

Also, as shown in FIG. 10A, two conductive metal plates $26b_1$, $26b_2$ shown in FIG. 9A are bonded by an ultrasonic machining in a manner in which the surfaces in which the recesses $26b_3$ are not formed are facing each other. The pole terminal portions 27 formed in the frame terminal 28 are arranged in series through the thin plate portions on both surfaces of the outer terminal portion 26. In this case, both surfaces can be used as the pattern portion connecting surface.

In FIG. 11A, metal wire frame 27a of a ring structure made of solder or tin, which is equivalent to the frame terminals 27 in thickness, is prepared. The metal wire frame 27a will be the frame terminal 27 later. Also, metal balls 28a, which are equivalent to the pole terminal portions 28 in thickness, made of solder or tin, are prepared. The metal balls will be pole terminal portions 28 later. Further, a metal plate 26c, which is a metal plate of copper alloy in which a groove $26c_1$ (which corresponds to the metal wire frame 27a) and recess portions $26c_2$ (which correspond to the metal balls 28a) are formed therein is prepared. After the metal wire frame 27a is inserted into the groove $26c_1$ and the metal balls 28a are inserted into the recess portions $26c_2$, these elements are heated to be jointed. That is, the frame terminal portion 27 of the metal wire frame 27a and the pole terminal portions 28 of the metal balls 28a are formed in series through thin portions. After a surface of the outer terminal 26 on which the metal wire frame 27a and the metal balls 28a are not provided is exposed and sealed by a resin, an etching process for removing the metal conductive plate 26c completely is conducted in order to form the frame terminal 27 and the pole terminal portions 28, which are connected each other through thin portions, as will be described later with reference to FIG. 13B.

Figure 12:
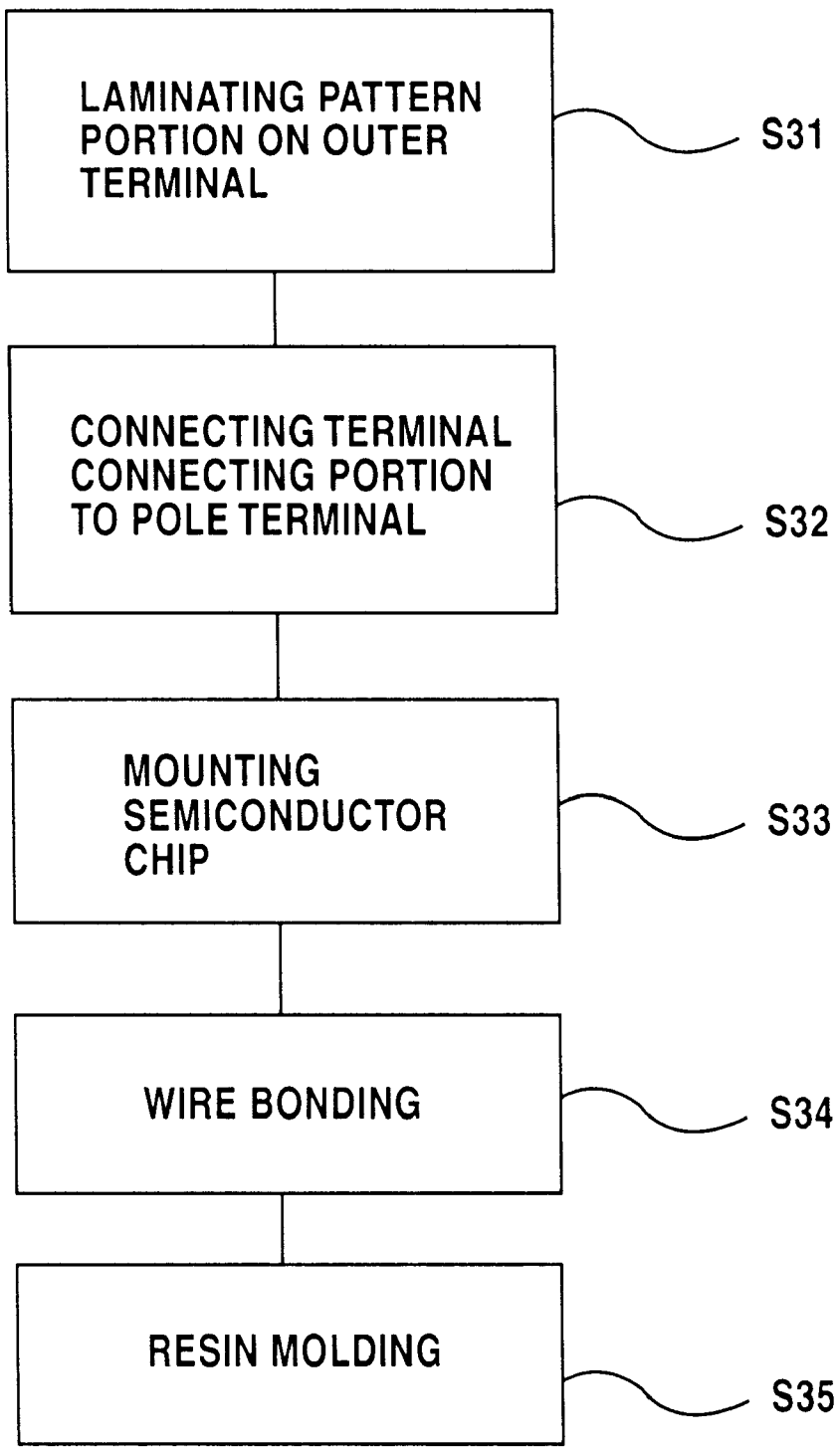
FIG. 12 is a flowchart describing a method for chip bonding in the first embodiment.

FIG. 12 is a flowchart describing a method for bonding the semiconductor chip in the first embodiment. In FIG. 12, the pattern portion 25 is attached to the outer terminal portion 26 through an adhesive (i.e. thermosetting epoxy resin) or insulating film which will be an insulating layer 35 in a manner that the terminal connecting portions 32a face the corresponding pole terminal portions 28 (Step S31). After that, the outer terminal 26 is plated with copper to form a plating layer 36, which electrically connects the terminal connecting portions 32a to the pole terminal portions 28 (Step S32). After the semiconductor chip 41 is mounted on the pattern portion 25 through the adhesive 42 (Step S33), the pads 41a on the semiconductor chip 41 are bonded to the wire connecting portions 32b exposing from the opening portions 34 through the wires 43a, 43b (Step S34, Cf. FIG. 4B). After the frame terminal 27 and the pole terminal portions 28 of the outer terminal 26 are exposed, the semiconductor chip side is molded by the resin 23a to form the resin portion 23 (Step S35), as shown in FIG. 13A.

Figure 13A:
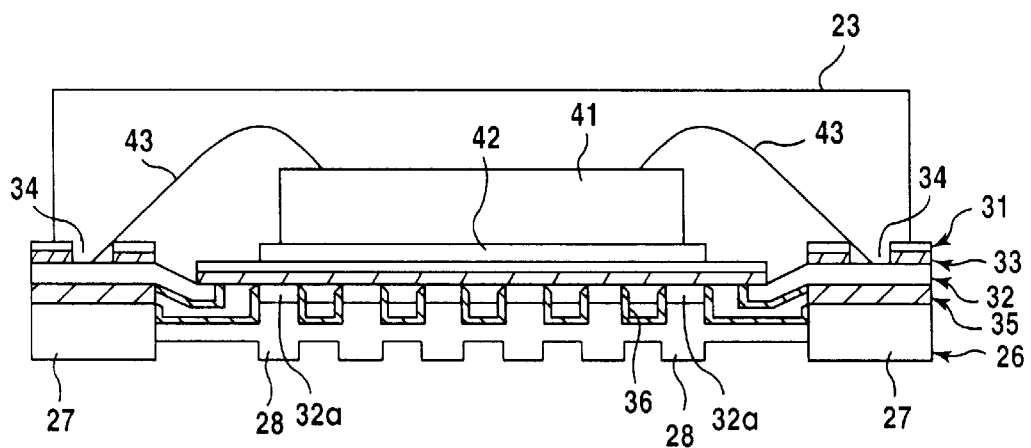
FIGS. 13A and 13B are schematic illustrations showing a final step of the method for producing a semiconductor device.
Figure 13B:
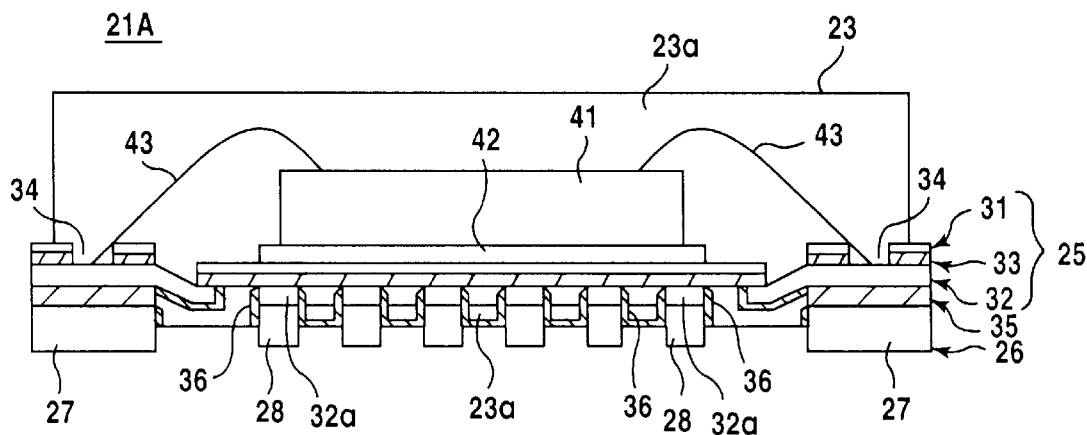

FIGS. 13A and 13B are schematic illustrations showing a final step of producing the semiconductor device of the first embodiment. FIG. 13A shows the semiconductor device formed through the steps shown in FIGS. 9A and 9B.

In this step, the frame terminal 27 is still electrically connected to the pole terminal portions 28 in the outer terminal portion 26. In order to separate the frame terminal 27 from each of the pole terminal portions 28, an exposed surface of the outer terminal 26 is etched to a surface of the resin 23a. The separated frame terminal 27 and the pole terminal portions 28 are plated with gold, silver, tin or palladium. When the pattern portion 25 and the outer terminal portion 26 are formed in series, each semiconductor device $21_A$ can be separated after various steps such as the packaging, the etching and the plating are done.

According to the semiconductor device of this embodiment, the terminal portion 24 is arranged at the bottom side of the semiconductor chip 41, the pole terminal portions 28 are arranged at the bottom of the semiconductor chip 41 and an electrical connection between the terminal portion 24 and the semiconductor chip 41 is achieved by using the wires 43a, 43b instead of the TAB techniques. Accordingly, a size of the semiconductor chip 41 or a layout of the pads is not limited and the package structure can be made flexible. Also, the outer terminals (pole terminal portions 28) can be formed after all terminals which are still electrically connected to each other are sealed by the resin to form the resin portion. Accordingly, the production of the outer terminal can be conducted easily and economically, and the resin can be used for the protection of the semiconductor chip 41. Further, the frame terminal 27 is provided in the outer terminal portion 26. The frame terminal 27 functions as a base for grounding or as a terminal for connecting power source or grounding. According to the feature, a number of terminals for an electrical source and a grounding can be reduced. Also, anti-noise characteristics can be improved.

Figure 14A:
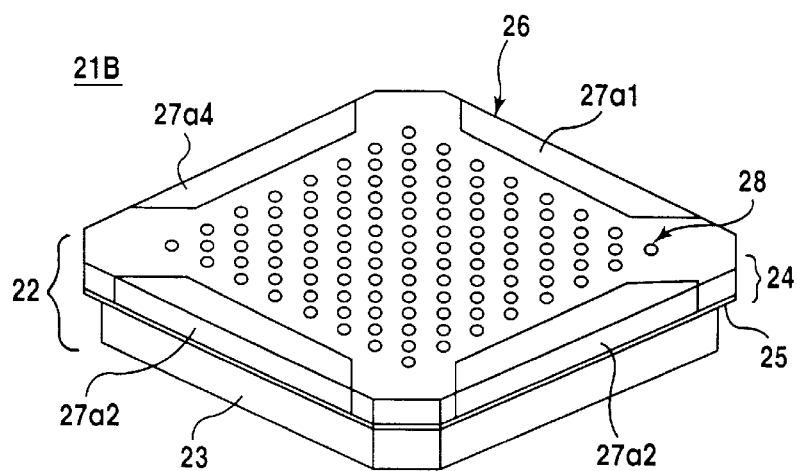
FIGS. 14A, 14B and 14C are schematic illustrations showing variations of a package structure of the first embodiment.
Figure 14B:
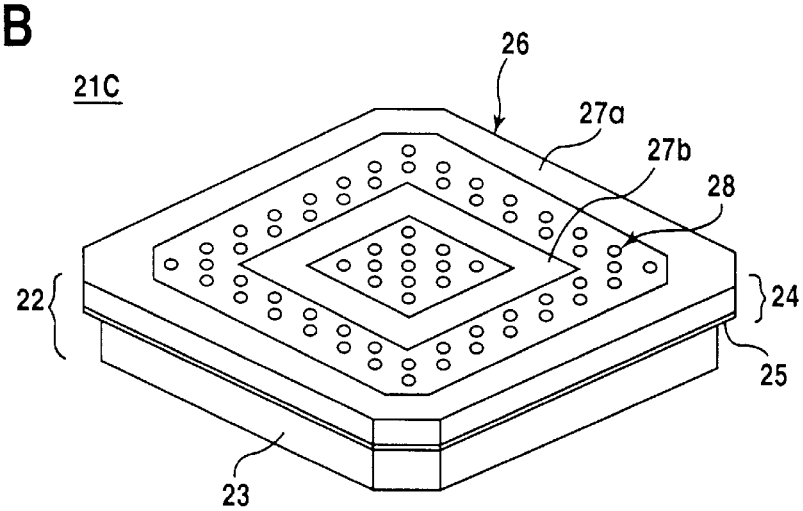
Figure 14C:
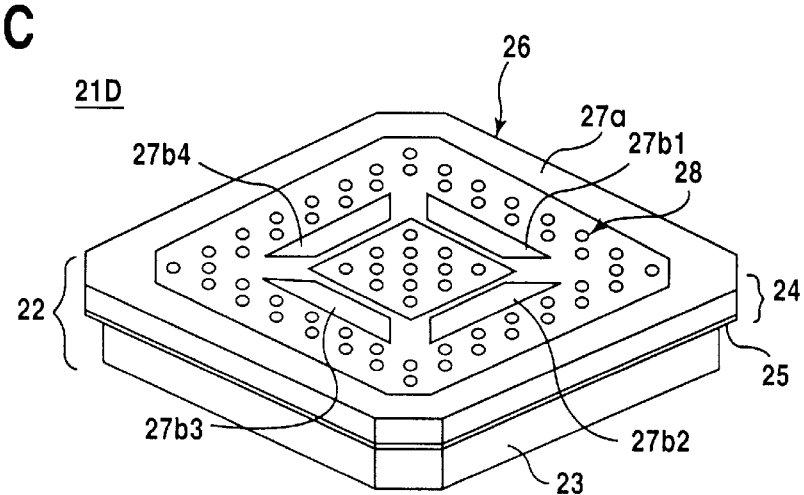

FIGS. 14A, 14B and 14C are perspective views showing variations of the package of the first embodiment.

In the semiconductor device 21B shown in FIG. 14A, separate frame portions $27a_1$–$27a_4$ are provided in the periphery of the outer terminal 26. Another features are the same as those shown in FIGS. 3A and 3B. By dividing the frame terminal into a plurality of (in this case, four) parts $27a_1$–$27a_4$, each of the frame terminals $27a_1$–$27a_4$ has a different role, for example, an power supply terminal, a grounding terminal or a signal terminal.

In a semiconductor 21C shown in FIG. 14B, the frame terminal 27 comprises a first frame terminal 27a provided in the periphery of the outer terminal portion 26 and a second frame terminal 27b formed in a ring-shape inside the first frame terminal 27a. The other portions are the same as those shown in FIGS. 3A and 3B. In this case, the second terminal portion 27b can have one of various roles such as a power supply terminal or a grounding terminal, and anti-noise characteristics can be improved.

In a semiconductor device 21D shown in FIG. 14C, second terminal portions $27a_1$–$27a_4$, which is the second frame terminals 27b shown in FIG. 14B divided into four parts, are provided. According to the semiconductor device 21D, anti-noise characteristics can be improved. Also, a variety of a layout of a power supply terminals or grounding terminals can be available.

Figure 15A:
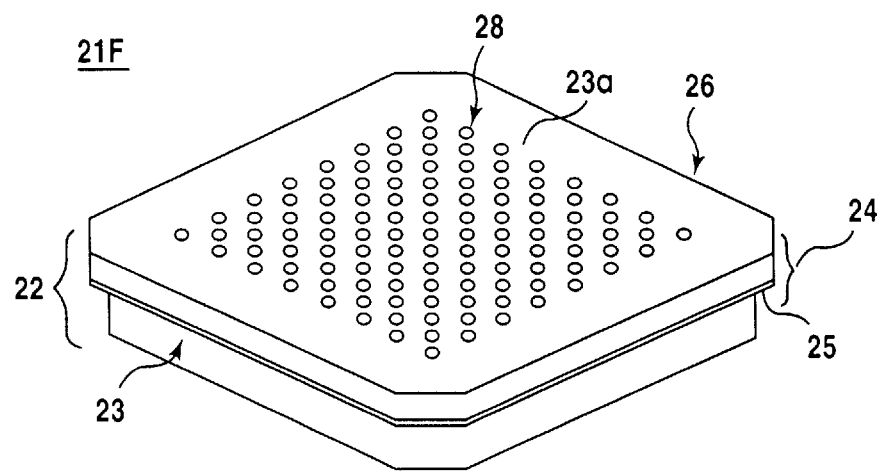
FIGS. 15A and 15B are schematic illustrations showing another variation of the package structure of the first embodiment.
Figure 15B:
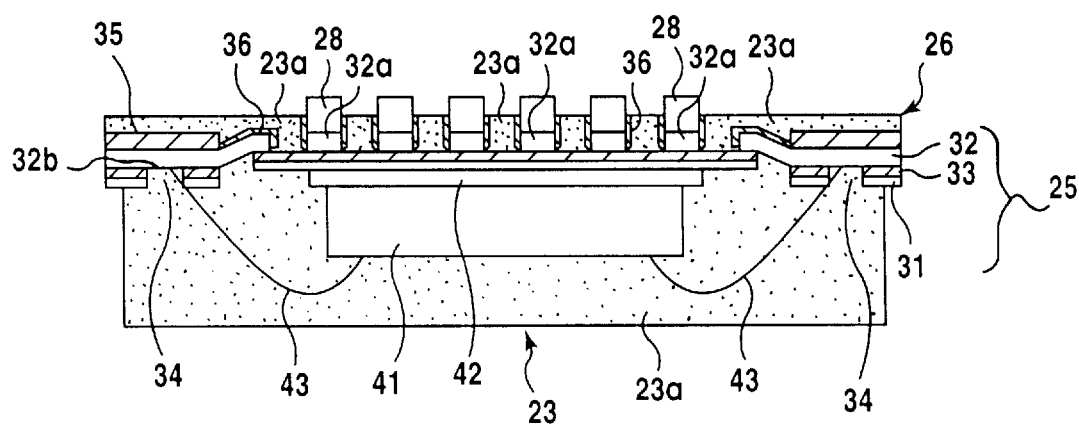

A semiconductor device 21F shown in FIGS. 15A and 14B is characterized in that the frame terminal 27 is removed from the semiconductor device 21A shown in FIGS. 3A and 3B and the pole terminal portions 28 are the only terminals provided therein. When a number of the power supply terminals and the grounding terminals is relatively small and an electrical power used therein is small, the semiconductor device 21F having no frame terminal 27 shown in FIGS. 15A and 15B can be used. The semiconductor device 21F can be decreased in size and can have a greater number of pins.

It goes without saying that features of the semiconductor devices 21B, 21C, 21D shown in FIGS. 14A, 14B and 14C can be combined properly.

Figure 16A:
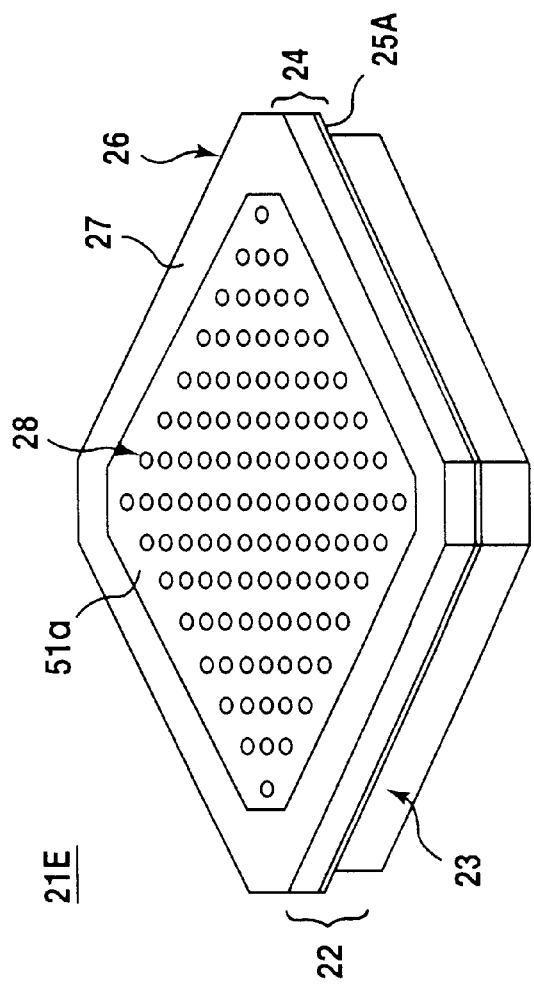
FIG. 16A is a perspective view showing a semiconductor device of a second embodiment.
Figure 16B:
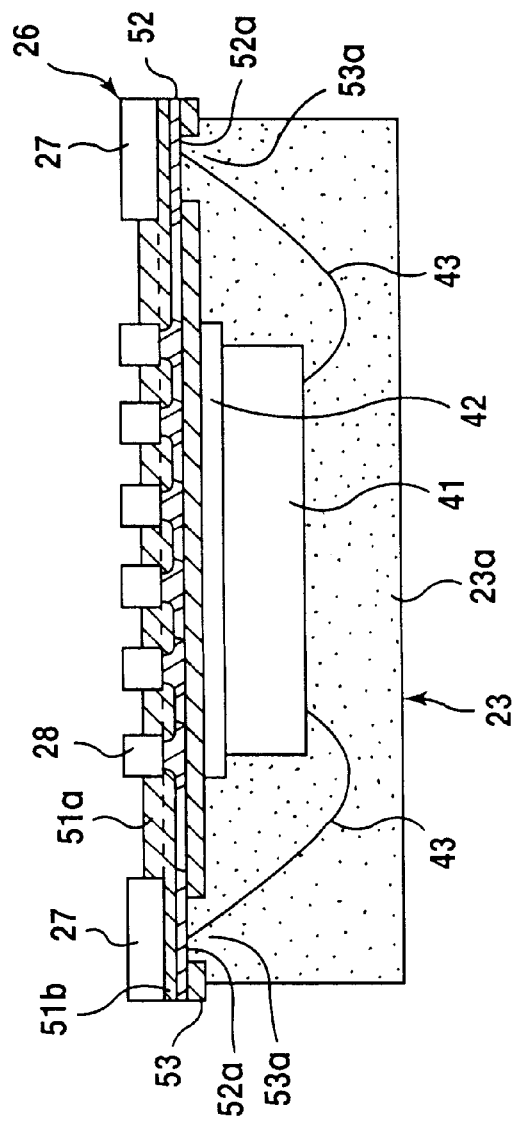
FIG. 16B is a sectional view showing the semiconductor device of the second embodiment.

FIGS. 16A, 16B are schematic illustrations showing a second embodiment of the present invention. FIG. 16A is a perspective view and FIG. 16B is a sectional view. A semiconductor device 21E shown in FIGS. 16A and 16B has a different pattern portion 25 from that of semiconductor device $21_A$ shown in FIGS. 3A and 3B. That is, a pattern portion 25A of the semiconductor device 21E is connected to the outer terminal portion 26 by using a vapor deposition method. In this embodiment, the same features as those previously described in the first embodiment are donated by the same reference numerals and descriptions thereof are omitted.

In the semiconductor device 21E shown in FIGS. 16A and 16B, the package 22 comprises the resin portion 23 and the terminal portion 24 as in the semiconductor device 21A shown in FIGS. 3A and 3B. The resin portion 23 is made of the resin 23a for protecting the semiconductor chip 41.

The terminal portion 24 comprises the pattern portion 25A and the outer terminal 26. The outer terminal portion 26 comprises the frame terminal 27 provided in the periphery thereof and the pole terminal portions 28 arranged in a lattice formation inside the frame terminal 27. The frame terminal 27 is insulated from the pole terminal portions 28 by a first insulting layer 51a. A second insulating layer 51b from which the frame terminal 27 and the pole terminal portions 28 are protruded is applied on the first insulating layer 51a.

On the second insulating layer 51b provided on the frame terminal 27 and the exposed pole terminal portions 28, a pattern layer 52 is formed by vapor deposition of aluminum. In this case, in the pattern layer 52 above the frame terminal 27, wire connecting portions 52a are formed as shown in FIG. 16B. A connecting portion of the pattern layer 52 to the pole terminal portions 28 corresponds to the terminal connecting portion 26 of the first embodiment.

On the pattern layer 52, a third insulating layer 53 as an upper insulating layer is formed. In the third insulating layer 53, opening portions 53a are formed at a position corresponding to the wire connecting portions 52a. On the third insulating layer 53, the semiconductor chip 41 is mounted through the adhesive 42. On the semiconductor chip 41, the pads 41a arranged in two lines are formed. The pads 41a are electrically connected to the wire connecting portions 52a through wires 43 (43a, 43b) forming arcs of different radius in order to avoid contact between the wires. Among the pads 41a, for power supply pads are electrically connected to the frame terminal 27 through wires 43. The semiconductor chip 41 is sealed by the resin 23a on the third insulating layer 53 to protect the semiconductor chip 41. The outer terminal 26 can be made by a method similar to that described in FIGS. 6–10.

Figure 17A:
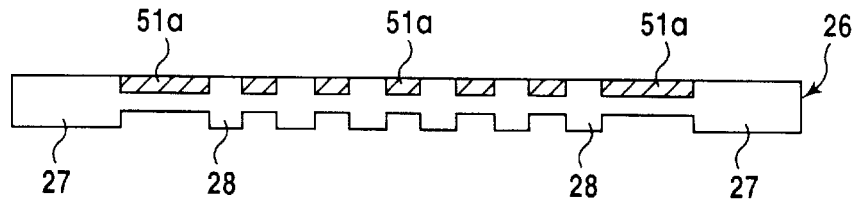
FIGS. 17A, 17B, 17C and 17D are schematic illustrations showing a method for producing a pattern portion of the second embodiment.
Figure 17B:
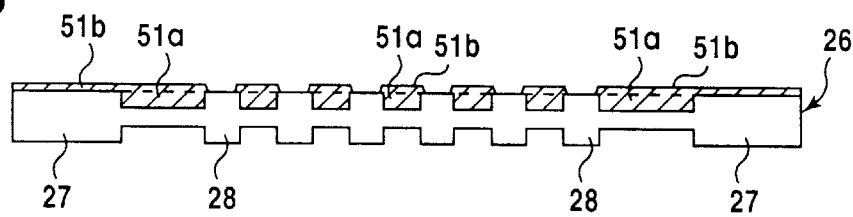

FIGS. 17A, 17B, 17C and 17D are schematic illustrations showing a method for producing the pattern layer in the second embodiment. In the outer terminal 26 formed by the method described in FIGS. 6–8, the frame terminal 27 is electrically connected to the pole terminal portions 28. In recesses between the frame terminal 27 and the pole terminal portions 28 on one side, a powdered glass, a glass paste or an epoxy resin as the first insulating layer 51a is filled, as shown in FIG. 17A. As shown in FIG. 17B, after the pole terminal portions 28 are exposed, a glass or a resin the same as those used as the first insulating layer 51a is applied in order to form the second insulating layer 51b.

In FIGS. 17A and 17B, the first insulating layer 51a and the second insulating layer 51b are laminated sequentially. However, a glass melted on the exposed surface of the pole terminal portions 28 can be the first insulating layer 51a and a silicon oxide (SiOn) coated by a CVD (Chemical Vapor Deposition) method on the exposed surface of the pole terminal portions 28 can be the second insulating layer 51b. Also, after the first insulating layer 51a is formed by applying a resin on the whole surface and the surfaces of the pole terminal portions 28 are exposed, the second insulating layer 51b can be formed by a printing on the first insulating layer 51a except the exposed surfaces thereof.

Figure 17C:
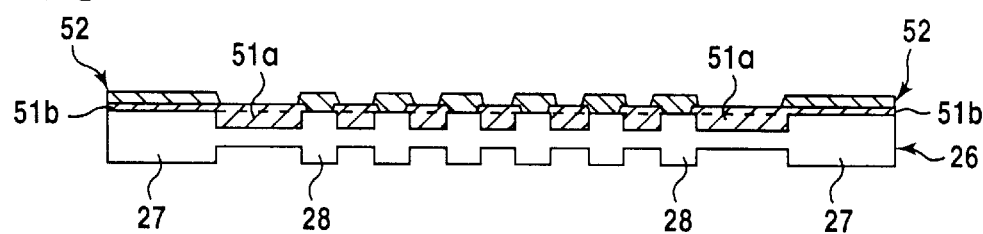
Figure 17D:
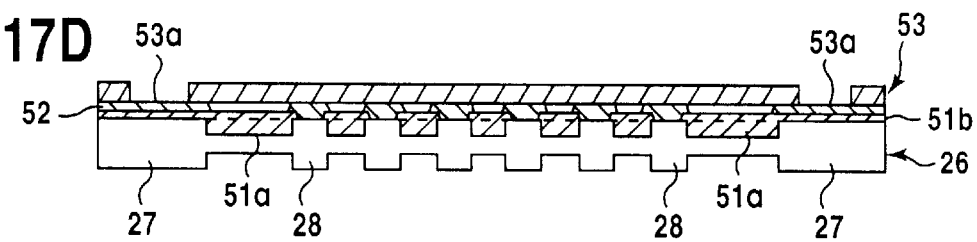

After the exposed surface of the second insulating layer 51b and the pole terminal portions 28 are vapor-deposited by aluminum using a mask of a predetermined pattern, the surface is plated by a metal which is suitable for wire-connection such as gold or palladium in order to form the pattern layer 52 as shown in FIG. 17C. In this case, after aluminum is vapor-deposited and the pattern is formed by a photo-etching process, the above plating can be conducted. Subsequently, an insulating film having opening portions 53, a SiOn layer formed by a CVD method or a printed resin paste can be formed inside the frame terminal 27 as the third insulating layer 53, as shown in FIG. 17D.

Figure 18A:
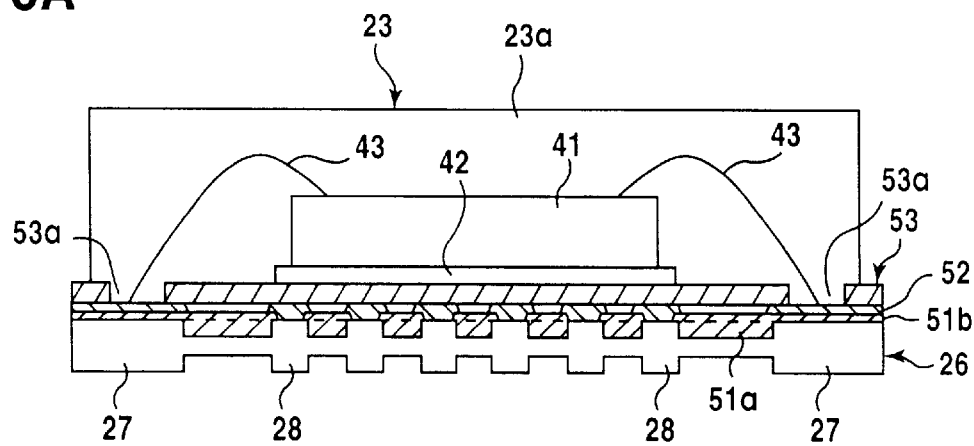
FIGS. 18A and 18B are schematic illustrations showing a final step of the method for producing the semiconductor device of the second embodiment.
Figure 18B:
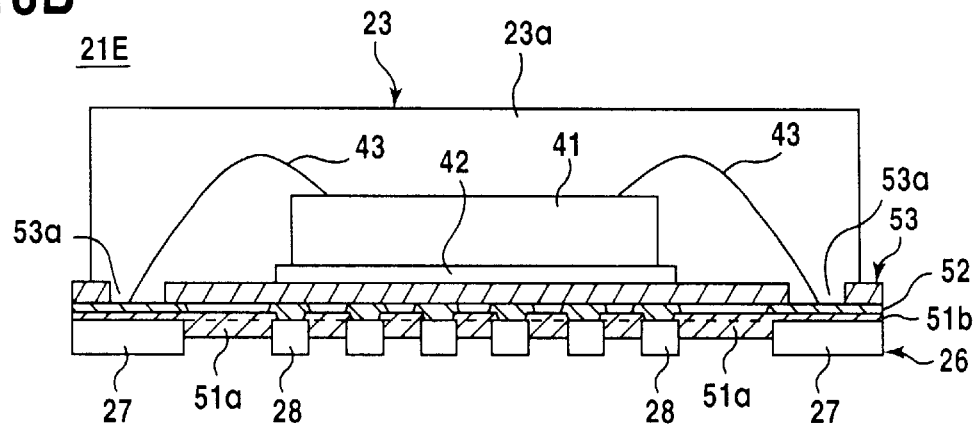

FIGS. 18A, 18B are sectional views showing a final step of producing the second embodiment. In FIG. 18A, the semiconductor chip 41 is mounted on the pattern portion 25 formed by the method described with reference to FIGS. 17A, 17B, 17C and 17D through the adhesive 42 (i.e. silver paste) and the pads 41a are electrically connected to the wire connecting portions 52a through the wires 43 (43a, 43b) in the manner shown in FIGS. 4A and 4B.

Above the terminal portion 24, the semiconductor chip 41 is sealed by the resin 23a in order to form the resin portion 23. Subsequently, a bottom surface of the outer terminal 26 is etched in order to separate each of the pole terminal portions 28 and the frame terminal 27. The surface of the frame terminal 27 and the pole terminal portions 28 is plated with solder, gold, silver, tin or palladium to be connected to a substrate.

When the pattern portion 25A and the outer terminal 26 are formed in series, various steps such as packaging, etching and gilding are conducted in series. In the final step, each semiconductor device can be separated. Also, the outer terminal portion 26 can be divided into a plurality of parts at the periphery or inside, as shown in FIGS. 14A, 14B and 14C. In this case, each divided outer terminal can have a different role, such as an power supply terminal or a grounding terminal, and anti-noise characteristics can be improved.

Figure 33A:
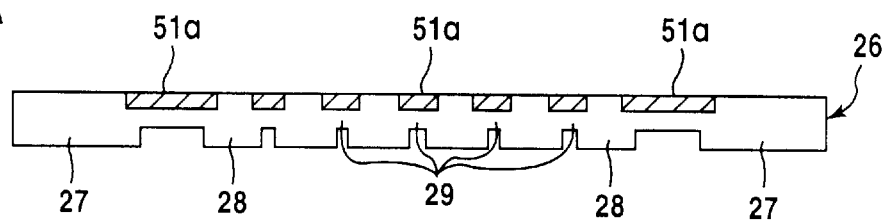
FIGS. 33A and 33B are schematic illustrations showing another method for producing the pole terminal portion.
Figure 33B:
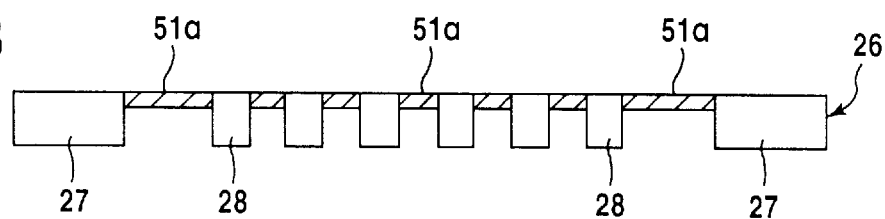

When the thin portions 29 are removed by the etching, upper parts from the thin portions 29 of the pole terminal portions 28 are smaller in cross section than lower parts thereof, as shown in FIG. 33A. Thus, after the thin portions 29 are removed by the etching, the upper parts of the pole terminal portions are almost equal in cross section to the lower parts thereof, as shown in FIG. 33B.

Figure 19A:
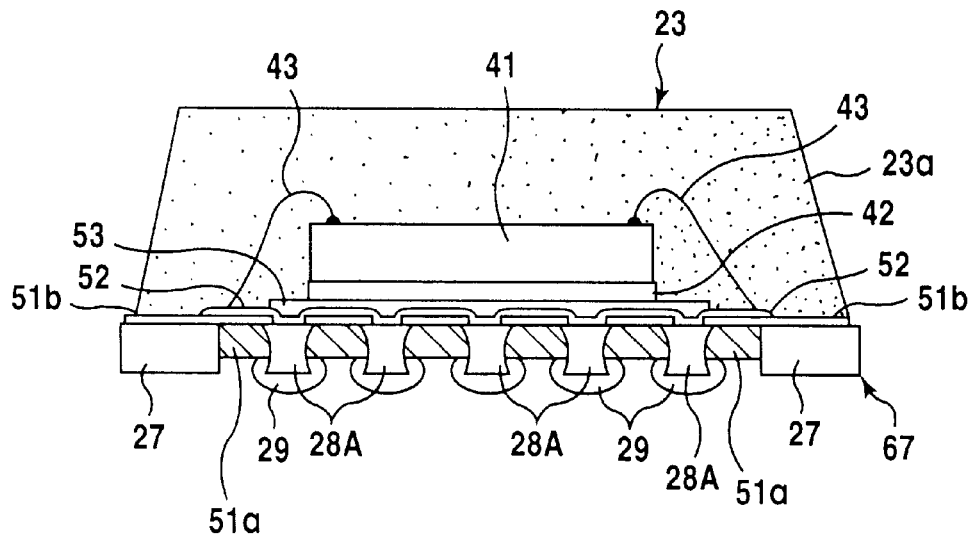
FIG. 19A is a sectional view showing a semiconductor device of a third embodiment.
Figure 19B:
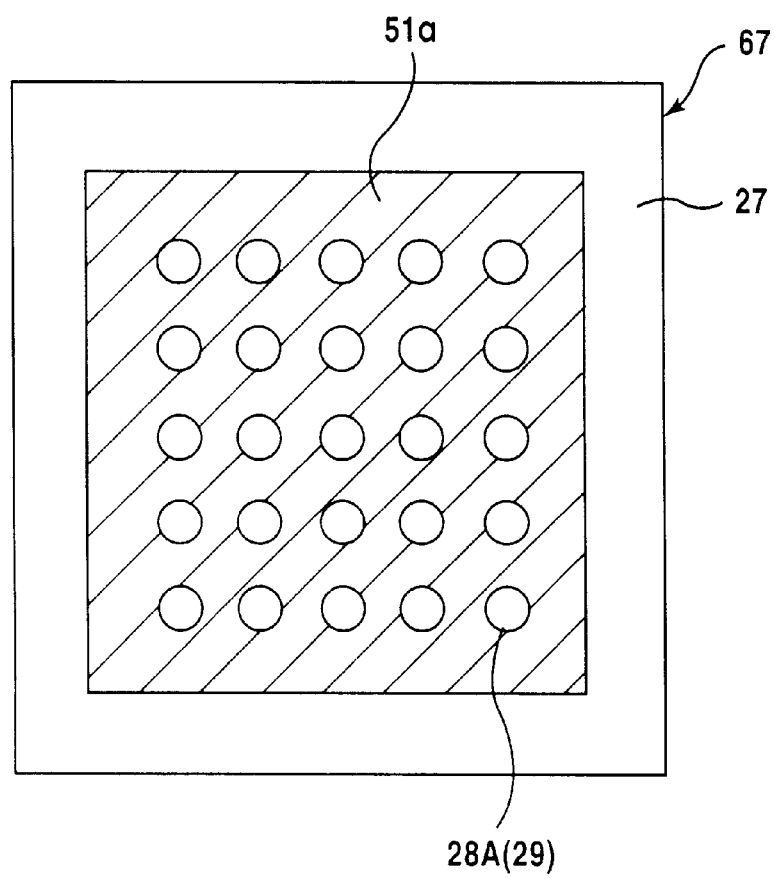
FIG. 19B is a rear view showing the semiconductor device of the third embodiment.

Next, referring to FIGS. 19A and 19B, a semiconductor device 21G of a third embodiment of the present invention will be described. FIG. 19A is a sectional view showing a semiconductor device 21G and FIG. 19B is a rear view thereof. In FIGS. 19A and 19B, the same features as those previously described in the semiconductor device 21E of the second embodiment with reference to FIGS. 16A and 16B are donated by the same reference numerals and descriptions thereof are omitted.

Figure 22A:
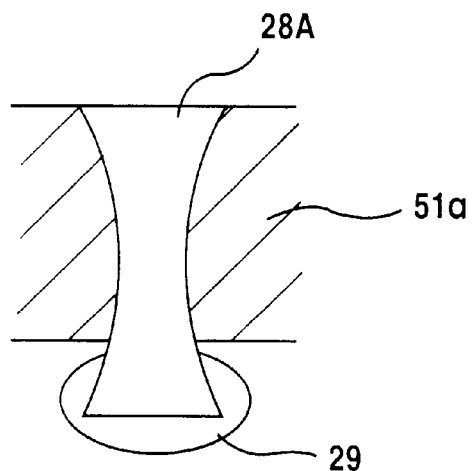
FIGS. 22A, 22B and 22C are schematic illustrations showing variations of a mechanism for preventing separation.

The semiconductor device 21G of this embodiment is characterized in that a mechanism for preventing separation is provided in order to prevent pole terminal portions 28A from being separated from a first insulating layer 51a which constitutes a part of the resin portion 23. In the embodiment shown in FIG. 19A, the mechanism for preventing separation is realized by the pole terminal portions 28A whose cross-sectional shape is a reel shape. FIG. 22A is an enlarged view showing the pole terminal portion 28A. As shown in FIG. 22A, by making a cross-sectional shape of the pole terminal portion 28A a reel shape (cross-sectional area of the central portion being smaller than that of either end), the pole terminal portions 28A have an anchor effect to the first insulating layer 51a, and the pole terminal portions 28A are securely prevented from being separated from the first insulating layer 51a. Since the pole terminal portions 28A, are prevented from being separated from the first insulating layer 51a as described above, the reliability of the semiconductor device 21G can be improved. A reference numeral 29 in FIG. 22A refers to a solder formed in the pole terminal portion 28A.

Next, a method for producing the semiconductor device 21G is described referring to the FIGS. 20A, 20B and 20C and FIGS. 21A, 21B and 21C.

The pole terminal portions 28A shown in FIGS. 19A and 19B are made of one metal member. However, a method for producing a pole terminal portion having a triple-layer structure in which two different metals are used is described hereinafter.

In order to produce the semiconductor device 21G, a metal plate (hereinafter, referred to as a clad metal 60) shown in FIG. 19A is prepared. The clad metal 60 will be the pole terminal portions 28A and frame terminal 27. The clad metal 60 is a triple-layer member comprising an inner layer portion 61 of a metal plate and outer layer portions 62, 63 laminated on both surfaces of the inner layer portion 60. The outer layer portions 62, 63 are made of a metal having a lower etching rate than the inner layer portion 61. That is, the outer layer portions 62, 63 are not etched easily. Accordingly, the pole terminal portions 28A and the frame terminal 27 have the triple-layer structure consisting of a pair of outer layer portion 62, 63 and the inner layer portion 61 placed between the outer layer portions 62, 63. As a metal combination of the inner layer portion 61 and the outer layer portions 62, 63, when a copper or a copper alloy is used in the inner layer portion 61, an iron-nickel alloy (i.e. 42 alloy), a nickel alloy, an iron or an iron alloy can be used as the outer layer portions 62, 63.

In the clad metal 60 having the above-mentioned structure, the outer layer portions 62, 63 are patterned. In this step, the clad metal is etched so that outer layer portions 62, 63 remain at positions where the pole terminal portions 28 are formed (for example, etched by ferric chloride). The outer layer portions 62, 63 remaining in the positions at which the pole terminal portions 28A are formed function as resists when the inner portion 61 is etched, as described later. As shown in FIG. 19A, when the pole terminal portion 28A does not have the triple-layer structure, the outer layer portions 62, 63 are replaced by a resist material (i.e. resin), and the patterning process is conducted so as that the resist material remains in the positions at which the pole terminal portions 28A are formed.

After the patterning to the outer layer portions 62, 63, etching portions 64, 65 are formed in the clad metal 60 by a half-etching procession both sides of the clad metal 60. In this case, since the etching rate of the outer layer portions 62, 63 is lower than that of the inner layer portion 61, that is, the outer layer portions 62, 63 are etched less easily, the outer layer portions 62, 63 are barely etched, but the inner layer portion 60 is very etched. Also, since the clad metal 60 is half-etched on both sides, thin portions 66 are formed in the middle of the inner layer portion 61. In the above-mentioned etching process, by controlling an etching time or by conducting an aeolotropic etching, the inner layer portion 60 is designed to be excessively etched horizontally near the outer layer portions 62, 63. By this process, over-etched portions 64a, 65a are formed in the etching portions 64, 65.

Figure 20A:
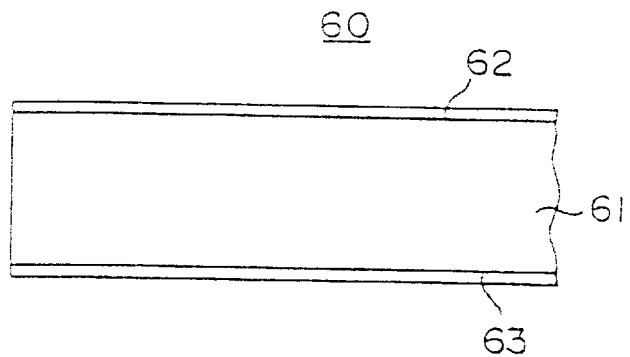
FIGS. 20A, 20B and 20C are schematic illustrations showing a method for producing the semiconductor device of the third embodiment of the present invention.
Figure 20B:
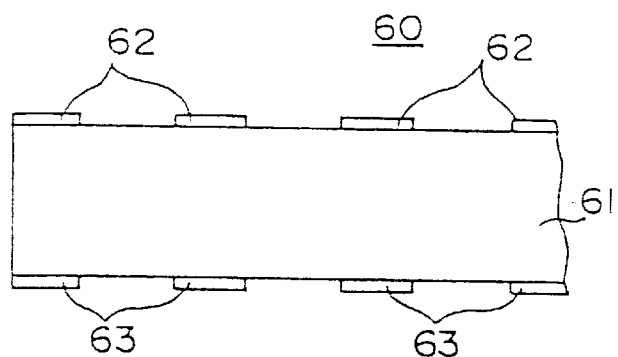
Figure 20C:
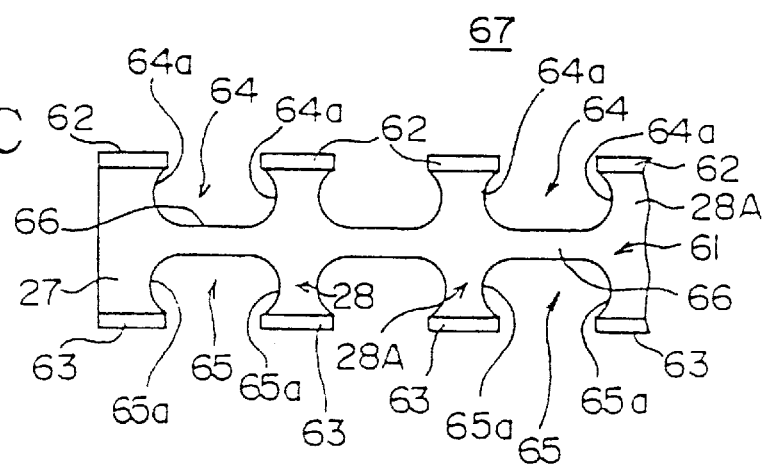

By the above-mentioned processes, an outer terminal portion 67 shown in FIG. 20C is formed. As shown in FIG. 20C, a plurality of the pole terminal portions 28A are connected to each other and are connected to the frame terminal 27 through the thin portions 66. The pole terminal portion 28 is not straight in cross-sectional shape because of the over-etched portions 64a, 65a, and cross-sectional areas of the over-etched portions 64a, 65a are smaller than other portions of the pole terminal portions 28A. When the pole terminal portions 28A do not have the triple-layer structure, the resist which is applied to the positions where the pole terminal portions 28A are formed is removed after the above-mentioned etching process is conducted.

Figure 21A:
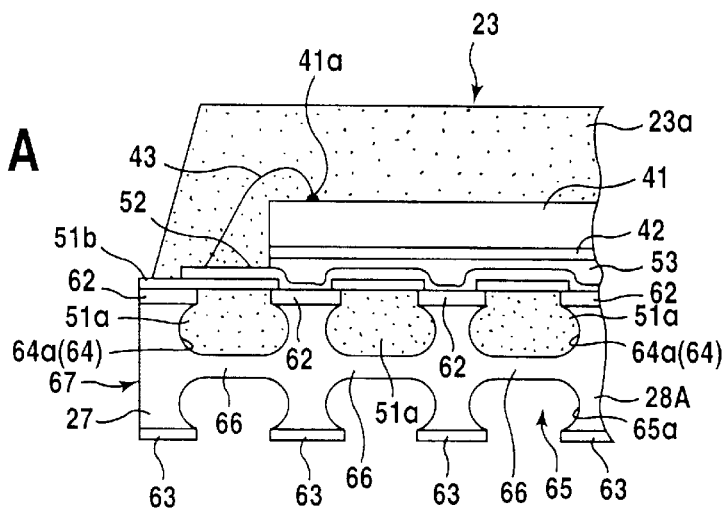
FIGS. 21A, 21B and 21C are schematic illustrations showing a continuation of the method for producing the semiconductor device of the third embodiment of the present invention.

Subsequently, in the etching portions 64 formed in the outer terminal 67, which are etching portions on which the semiconductor chip 41 is mounted, a glass or an epoxy resin is filled to form the first insulating layer 51a. Next, by conducting the steps similar to those described in FIGS. 17B, 17C and 17D, the second insulating layer 51b, the pattern layer 52 and the third insulating layer 53 are formed sequentially. The semiconductor chip 41 is mounted on the third insulating layer 51b through the adhesive 42 (i.e. silver paste). The pads 41a provided in the semiconductor chip 41 are electrically connected to the pattern layer 52 through the wires 43. After that, the semiconductor chip 41 is sealed by the resin 23a to form the resin portion 23. The semiconductor device at this stage is shown in FIG. 21A.

Figure 21B:
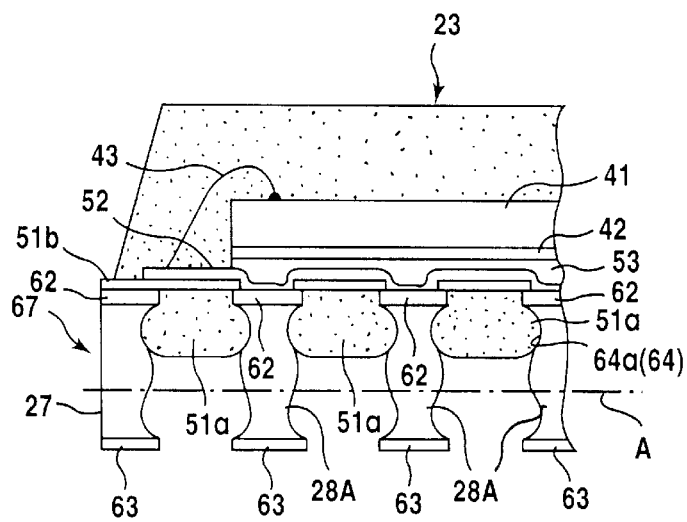

Next, the thin portions 66 are removed by an etching process. FIG. 21B shows the semiconductor device in which the thin portions 66 are removed by the etching process. As an etching liquid in this case, an ammonia etching liquid, which does not etch the outer layer portion 63, can be used. By using the etching liquid which does not etch the outer layer portion 63, only the inner layer portion 61 can be etched and only the thin portions can be removed.

Although the above etching liquid also etches the pole terminal portions 28A and the frame terminal 27, an amount etched thereof is less than that of the thin portions since the outer layer portions 63 function as resists. Accordingly, the pole terminal portions 28A and the frame terminal 27 is not etched vertically, and a height of the pole terminal portions 28A and the frame terminal 27 remains the same as that of the clad metal 60 shown in FIG. 20A.

By the outer terminal 67 being made from the triple-layer structure clad metal 60 shown in FIG. 20A, the pole terminal portions 28A and the frame terminal 27 can be made uniform in height and a reliability and packaging characteristics of the semiconductor device 21G can be improved.

Figure 21C:
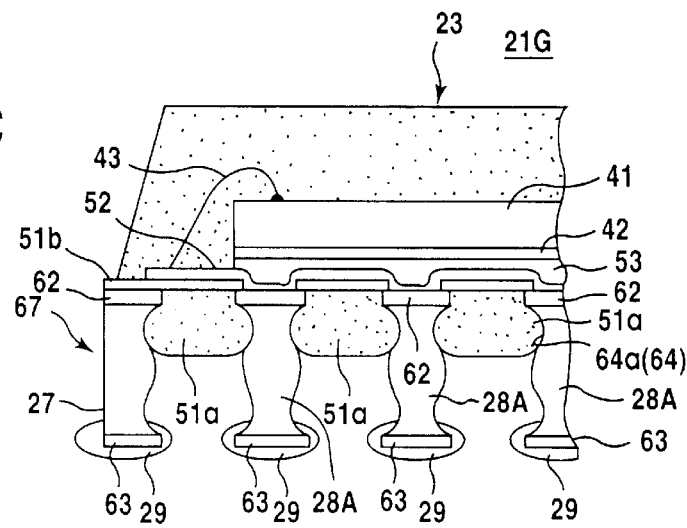

Next, the solder portions 29 are provided on the exposed portions of the pole terminal portions 28A from the first insulating layer 51a and a prescribed portion of the frame terminal 27 by dipping the portions in solder. In this case, since the over-etched portions 65a are formed in the pole terminal portions 28A and the frame terminal 27, the solder is properly placed in the portions and the solder portions 29 can be provided securely. Also, thin layers instead of the solder portions 29 can be provided in the exposing portion of the pole terminal portion 28A from the first insulating layer 51a and the prescribed portion of the frame terminal 27 by a plating process or a sputtering process. Through the above processes, the semiconductor device 21G shown in FIG. 21C is produced.

Hereinafter, the pole terminal portions 28A and the first insulating layer 51a of the semiconductor device 21G is described.

In the half-etching process shown in FIG. 20C of this embodiment, since the over-etched portions 64a are formed in the etching portions 64, the pole terminal portion has a wavy shape. The wavy portions of the pole terminal portions 28A are filled with the first insulating layer 51a. Accordingly, the wavy portions of the pole terminal portion 28A functions as a mechanism for preventing a separation for preventing the pole terminal portion 28A from being separated from the resin portion 23. Therefore, the pole terminal portions 28A can be prevented from being separated from the resin portion 23 and a reliability of the semiconductor device 21G can be improved.

Figure 22B:
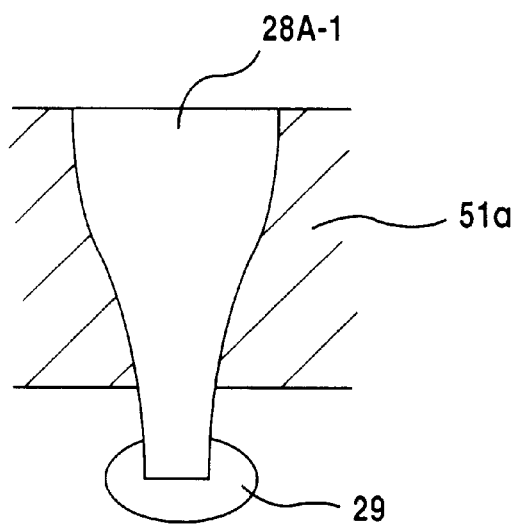
Figure 22C:
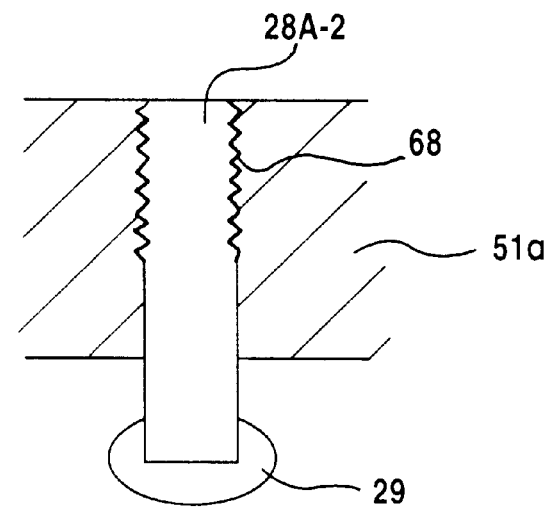

FIGS. 22A, 22B and 22C show variations of the mechanism for preventing a separation. FIG. 22A shows the mechanism for preventing a separation in which the pole terminal portion 28A is formed in a reel shape. The pole terminal portion 28A of this shape is prepared when it is made from one simple metal member. That is, in the process shown in FIG. 21B, when the etching for removing the thin portions 66 is conducted without the outer layer portions 63, the pole terminal portions 28A and the frame terminal 27 are also etched. When the etching is done to the position shown as a one dotted chain line in FIG. 21B, the pole terminal portion 28A is formed in a reel shape. By making the pole terminal portion in the reel shape, the pole terminal portion can be prevented from being separated from the resin portion 23.

In FIG. 22B, a pole terminal portion 28A-1 is formed in a trapezoid shape. In order to make the pole terminal portion 28A-1 a trapezoid in shape, a width of the outer layer portion 63 located under the inner layer 61 is formed greater than that of the outer layer portion 62 located above the inner layer in the patterning process shown in FIG. 20B. In this manner, the pole terminal portion 28A-1 having the trapezoid shape can be formed easily. By the pole terminal portion 28A-1 being shaped as the trapezoid, the pole terminal portion 28A-1 has an anchor effect since a sectional area of an upper part of the pole terminal portion 28A-1 is smaller than that of a lower part thereof. Accordingly, the pole terminal portion 28A-1 can be prevented from being separated from the resin portion 23 and a reliability of the semiconductor device 21G can be improved.

In FIG. 22C, a mechanism for preventing a separation is realized by a rough face 68 formed in the surface of a pole terminal portion 28A-2. The rough face 68 can be formed by using a powerful acid after the half-etching process shown in FIG. 20C is conducted. By forming the rough face 68 in the pole terminal portion 28A-2, the pole terminal portion 28A-2 can have an anchor function and be prevented from being separated form the resin portion 23.

Figure 23:
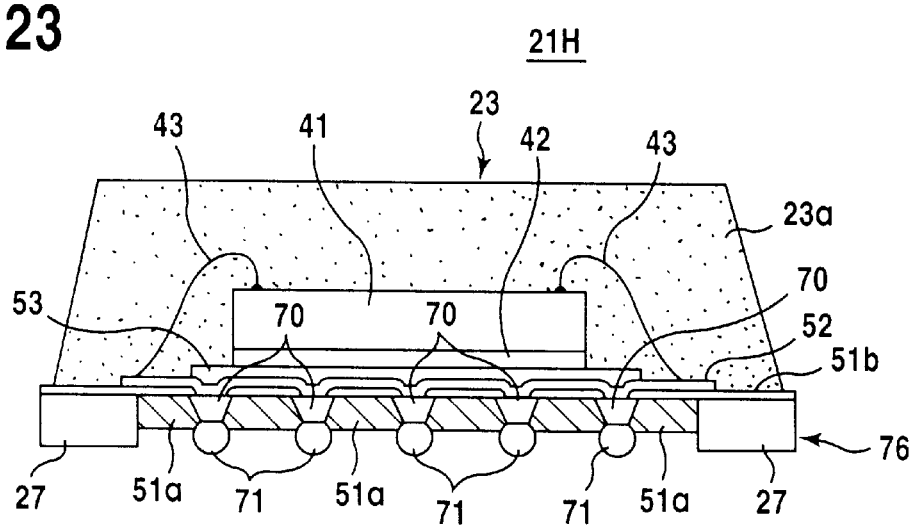
FIG. 23 is a sectional view showing a semiconductor of a fourth embodiment of the present invention.

Next, referring to FIG. 23, a semiconductor device 21H of a fourth embodiment of the present invention will be described. FIG. 23 is a sectional view showing a semiconductor device 22H. In this embodiment, the same features as those previously described in the third embodiment shown in FIGS. 19–21 are donated by the same reference numerals and descriptions thereof are omitted.

A semiconductor device 21H of this embodiment is characterized in that solder bumps 71 are provided in pole terminal portions 70. By providing the solder bumps 71 in the pole terminal portions 70, the semiconductor devices 21A–21G described in the above embodiment can be mounted on a substrate in the manner that the conventional BGA-type semiconductor device (FIG. 3) is mounted. Accordingly, a flexibility of the semiconductor device 21H can be improved.

Figure 24A:
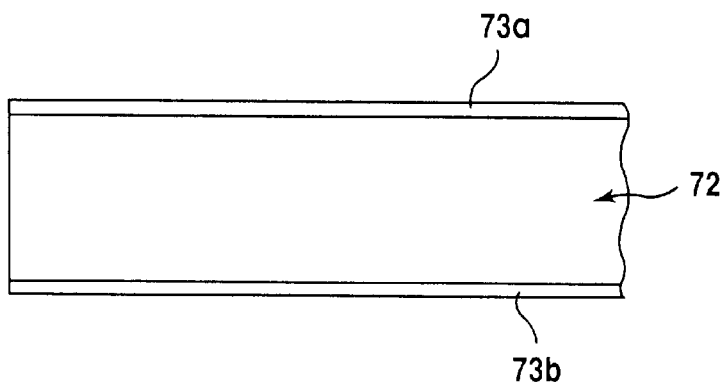
FIGS. 24A, 24B are schematic illustrations showing a method for producing the semiconductor device of the fourth embodiment.
Figure 25A:
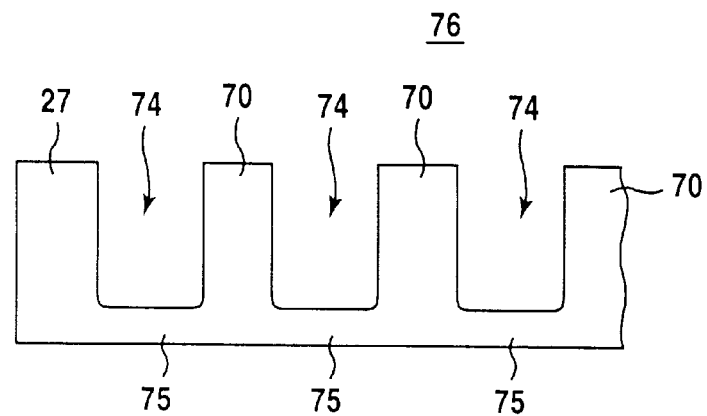
FIGS. 25A, 25B and 25C are schematic illustrations showing a continuation of the method for producing the semiconductor device of the fourth embodiment.
Figure 25B:
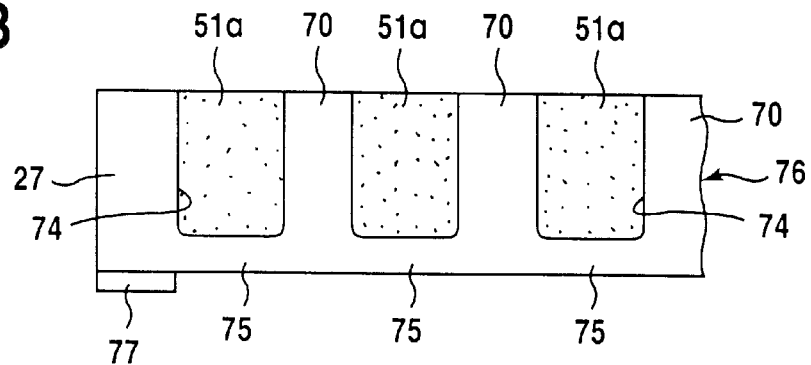
Figure 25C:
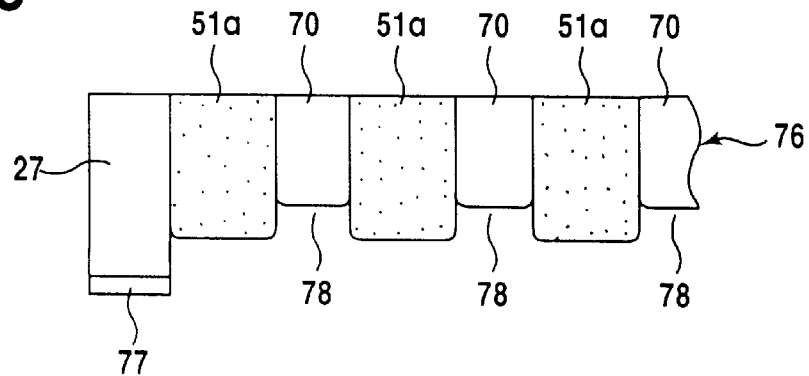
Figure 26A:
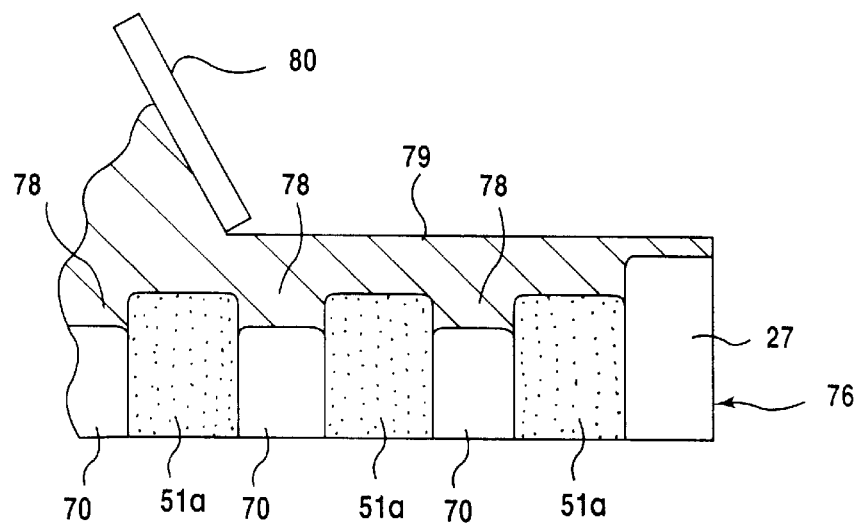
FIGS. 26A and 26B are schematic illustrations showing a continuation of the method for producing the semiconductor device of the fourth embodiment.
Figure 26B:
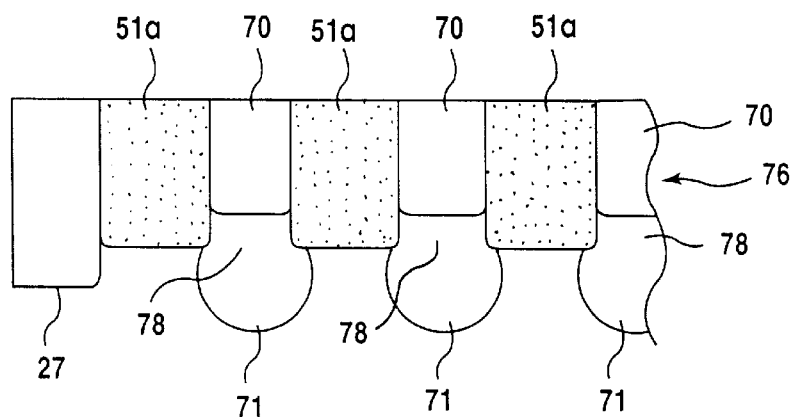

Referring to FIGS. 24–26, a method for producing the semiconductor device 21H will be described. In a process for producing the semiconductor device 21H, a metal plate 72 made of, for example, copper or copper alloy is prepared. On both surfaces of the metal plate 72, resists 73a, 73b are supplied, as shown in FIG. 24A.

Figure 24B:
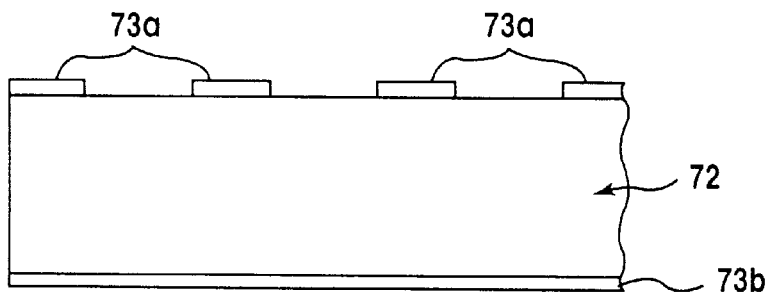

Next, a patterning process is conducted on the resists 73a, 73b. The patterning process is conducted only on the resist 73a applied on an upper surface of the metal plate 72 so that the resist 73a facing the position at which the existing pole terminal portions 70 are formed remains as shown in FIG. 24B. The resist 73b applied on the lower surface of the metal plate 72 is not patterned but covers the whole lower surface of the metal plate 72.

After the patterning to the resist 73a described above, the upper surface on which the resist 73a is provided and a semiconductor chip 41 will be mounted is half-etched to form etching portions 74. By the half-etching process, thin portions 75 are formed under the etching portion 74. That is, a prescribed number of the pole terminal portions 70 formed by the half-etching are connected via the thin portions 75. After the above half-etching process, the resists 73a, 73b are removed to form pole terminal portions 76 shown in FIG. 25A.

Next, a glass or an insulating resin is filled into the etching portions 74 formed in the outer terminal 76 to form the first insulating layer 51a. On the lower surface of the outer terminal 76 at positions which correspond to the frame terminals 27, a resist 77 is applied as shown in FIG. 25B.

Subsequently, the second insulating layer 51b, the pattern layer 52 and the third insulating layer 53 are formed sequentially by similar processes to that described with reference to FIGS. 17B and 17C. The semiconductor chip 41 is mounted on the third insulating layer 53 through the adhesive 42. The wires 43 are provided between the pads 41a and the pattern layer 52.

The surface of the outer terminal 76 on which the resist 77 is applied is etched to remove the thin portions 75. In this case, the etching is continued even after the thin portions 75 are removed, as shown in FIG. 25C. By the etching process, the pole terminal portions become shorter than the first insulating layer 51a and recess portions 78 are formed between the first insulating layers 51a and the pole terminal portions 70. After the etching for removing the thin portions 75 and the part of the pole terminal portion 70, the resist 77 is removed.

On the surface of the outer terminal 76 on which the recess portions 78 are formed, a solder paste 79 is applied using a squeegee 80. After the solder paste 79 is applied on the surface of the outer pole terminal portions on which recess portions 78 are formed, a reflowing treatment is conducted. In this step, a binder included in the solder paste 79 is vapored and removed and only the solder remains. Also, the remaining solder is melted and formed in a spherical shape by a surface tension thereof and attached to the pole terminal portion 70 to form the solder bump 71. In this case, since solder is not attachable to the first insulating layer 51a made of glass or resin and the melted solder flows into the recess portions 78 in which the pole terminal portions 70 are provided, the solder bumps 71 are formed only at a position at which the pole terminal portions 70 are provided.

The solder bumps 71 are formed at desired positions at which the pole terminal portions 70 are provided by simply applying the solder paste 79 in the outer terminals 76 and conducting the ordinal reflowing treatment. Accordingly, the solder bumps 71 can be formed easily and economically. Through the above processes, the semiconductor device 21H is produced.

In the above-described processes (reflowing-soldering method), the solder paste 79 is applied on the outer terminal 76 and the reflowing treatment is conducted in order to form the solder bumps 71. However, the method for producing the solder bumps 71 is not limited to the above-described method. For example, a dipping soldering method can be used in order to form the solder bumps 71.

Figure 27A:
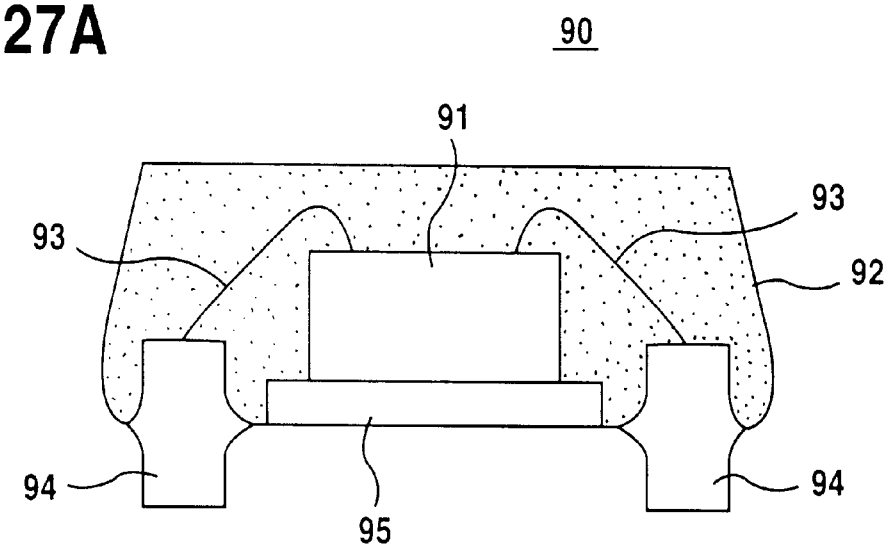
FIG. 27A is a sectional view showing a semiconductor device of a fifth embodiment of the present invention.
Figure 27B:
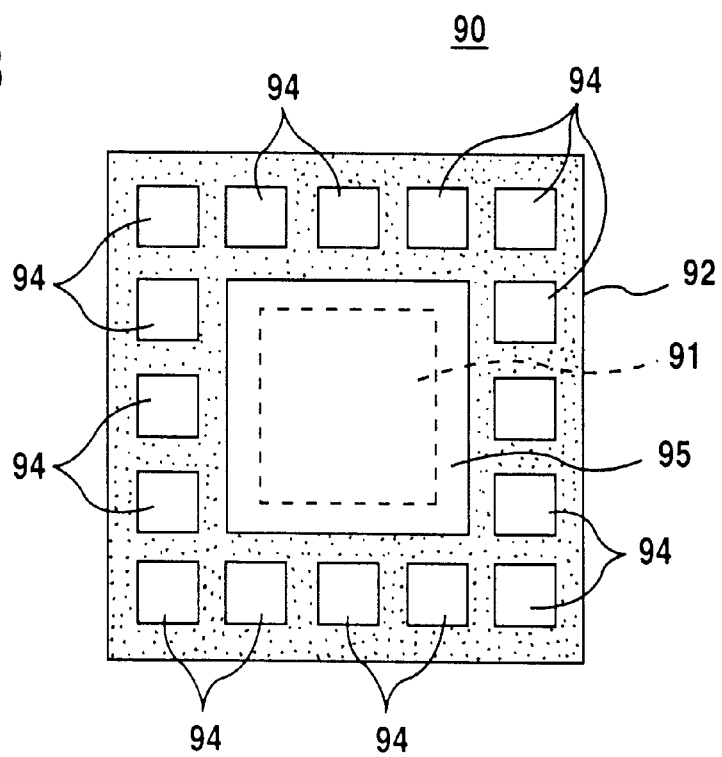
FIG. 27B is a rear view showing the semiconductor device of the fifth embodiment.

Next, referring to FIGS. 27A and 27B, a semiconductor device 90 of a fifth embodiment of the present invention is described. FIG. 27A is a sectional view showing the semiconductor device 90 and FIG. 27B is a rear view thereof.

The semiconductor device 90 of this embodiment has a simple structure comprising a semiconductor chip 91, a resin package 92, wires 93 and pole terminal portions 94. As is apparent in FIG. 27A, the semiconductor device 90 has a structure similar to the plastic PGA (Pin Grid Array) package. However, the semiconductor device 90 is characterized in that no circuit substrate is provided in a package, as will be, described later.

The semiconductor chip 91 is mounted on a pad material made of an adhesive, which is exposed from the resin package 92. Accordingly, since heat generated in the semiconductor chip 91 can be released, a heat release efficiency can be improved. A plurality of (in this embodiment, 16) pole terminal portions 94 are arranged close around the semiconductor chip 91. The pole terminal portions 93 are extending vertically. A top end of the pole terminal portion 94 is plated with, for example, silver, gold or palladium, which makes it possible to apply a bonding treatment thereon. The pole terminal portions 94 are made of, for example, a copper or a copper alloy.

Between the top ends of the pole terminal portions 94 and pads (not shown) provided on the semiconductor chip 91, the wires 93 are provided in order to electrically connect the pole terminal portions to the semiconductor chip 91. Top portions of the pole terminal portions 93 and the semiconductor chip 91 except a connecting surface to the pad materials is sealed by the resin package 92. By this structure, the semiconductor chip 91, connecting portions of the wires 93 and the top portions of the pole terminal portions are protected by the resin package 92. The lower ends of the pole terminal portions 93 protrude downward from the resin package 92. The protruding portions of the pole terminal portions 93 from the resin package 92 function as outer connection terminals when the semiconductor device 90 is mounted on a substrate (not shown).

Next, the semiconductor device 90 having such a structure is compared with conventional semiconductor devices which are commercially available. Comparing the semiconductor device 90 having such a structure with the plastic PGA-package-type semiconductor device, in the plastic PGA-package-type semiconductor device, since a semiconductor chip is electrically connected to pins, a circuit substrate is provided in a resin package. On the other hand, in the semiconductor device 90, the semiconductor chip 91 and the pole terminal portions 93 are connected in series through the wires 93. Accordingly, the semiconductor device 90 of this embodiment is simple in structure, and is low in height, and can be produced economically.

Comparing a semiconductor device 90 with a QFP (Quad Flat Package) type semiconductor, in the QFP-type semiconductor device, outer leads are outward extending from a periphery of a resin package. On the other hand, in the semiconductor 90, the pole terminal portions are extending vertically. Accordingly, by the semiconductor device 90, a mounting area can be reduced and the package structure can be decreased in size.

The semiconductor device 90 of this embodiment is compared with TQFP (Thin Quad Flat L-Leaded Package) 80-pin type semiconductor device and SSOP (Shrink Small Outline L-Leaded Package) 20-pin type semiconductor, which are semiconductors commercially available having a small-size package.

A results are shown in TABLE 1.

TABLE 1

| PACKAGE | TPFP 80 PINS | PRESENT EMBODIMENT 80 PINS | SSOP 20 PINS | PRESENT EMBODIMENT 20 PINS |
|---|---|---|---|---|
| TERMINAL PITCH | 0.40 | 0.50 | 0.65 | 0.65 |
| PACKAGE WIDTH | 12.00 | 10.00 | 6.50 | 4.40 |
| PACKAGE LENGTH | 12.00 | 10.00 | 6.65 | 6.65 |
| PACKAGE HEIGHT | 1.20 | 0.75 | 1.20 | 0.75 |

(unit: mm)

As is apparent from the TABLE 1, the semiconductor device 90 of this embodiment can be decreased in size and in height compared to the conventional semiconductor device having the small-size package.

Next, referring to FIGS. 28 and 29, a method for producing the semiconductor device 90 of this embodiment will be described.

Figure 29A:
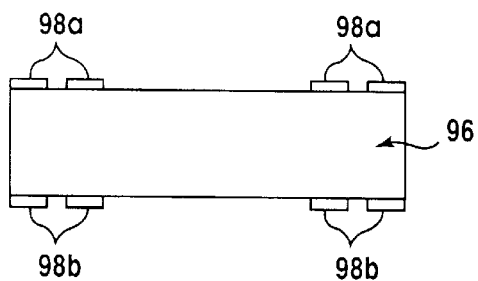
FIGS. 29A, 29B, 29C and 29D are schematic illustrations showing a method for producing the semiconductor device of the fifth embodiment.

In the method for producing the semiconductor device 90, a metal plate 96 of copper or copper alloy, shown in FIG. 29A is prepared. The pole terminal portion 94 and frame portion 97 are made from the metal plate 96. At positions of the metal plate 96 which will be the pole terminal portions 94 and the frame portion 97, resists 98a, 98b are applied.

Figure 29B:
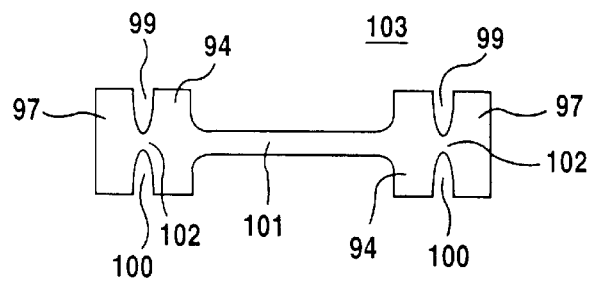
Figure 29C:
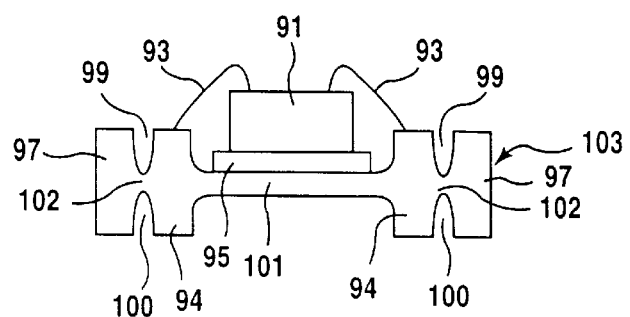

After the resists 98a, 98b are applied on the metal plate 96, both surfaces or one (in this embodiment, both) surface of the metal plate is half-etched to form grooves 99, 100 in the metal plate 96, as shown in FIG. 29B. In this case, since both surfaces of the metal plate 96 are half-etched, thin portions 101, 102 are formed in central portions of the metal plate 96. By forming grooves 99, 100, the pole terminal portions 94 and the frame portions 97 are formed. However, in this step shown in FIG. 29B, each of the terminal portions 94 and the frame portions is not completely independent, but is connected to the others through the thin portions 101, 102.

After the half-etching process, the resist 98a, 98b applied in the metal plate is removed. Next, in upper ends of the pole terminal portions 94 on which the semiconductor chip 91 is mounted, bonding pads 104 to which wires 93 are bonded are formed by plating. The upper ends of the pole terminal portions 94 are plated by, for example, silver (Ag), gold (Au) or palladium (Pd). By the above-mentioned processes, the outer terminal 103 is formed.

In this embodiment, only the upper-end portion of the pole terminal portions are plated to form the bonding pads 104 for wire bonding. However, the whole surface of the outer terminal 103 on which the semiconductor chip 91 is mounted (pole terminals 94, frame portions 97, inner surfaces of grooves 99, 100 and an upper surface of the thin portion 104) can be plated.

Figure 28A:
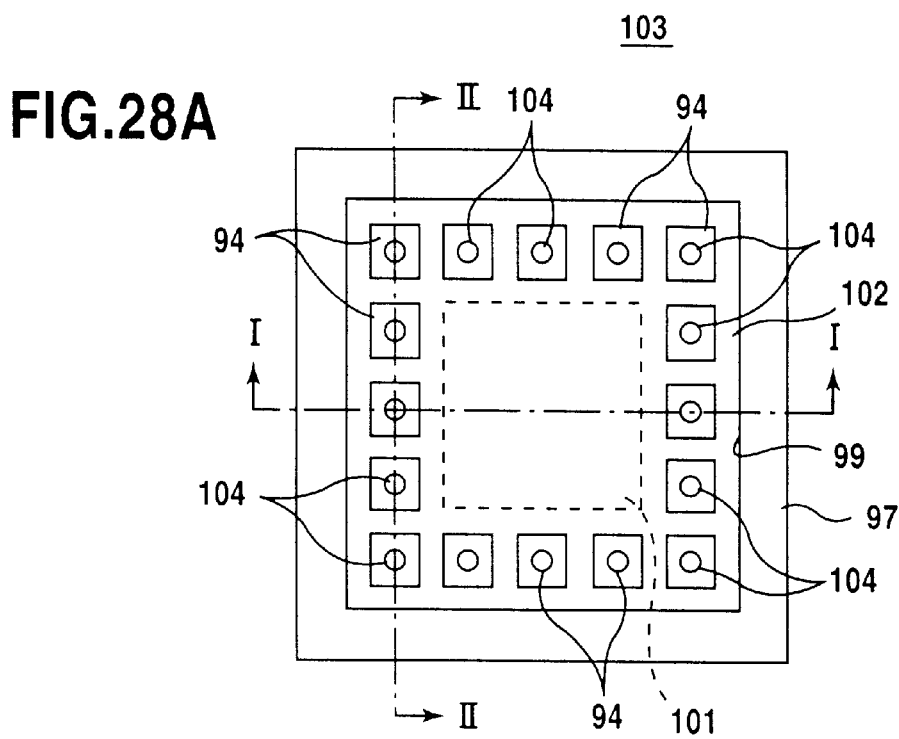
FIG. 28A is a plan view showing an outer terminal portion of the fifth embodiment.
Figure 28B:
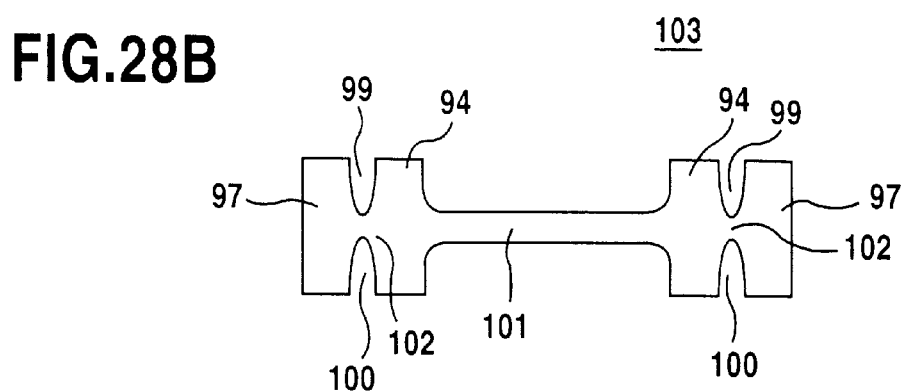
FIG. 28B is a sectional view taken on line I—I in FIG. 28A.
Figure 28C:
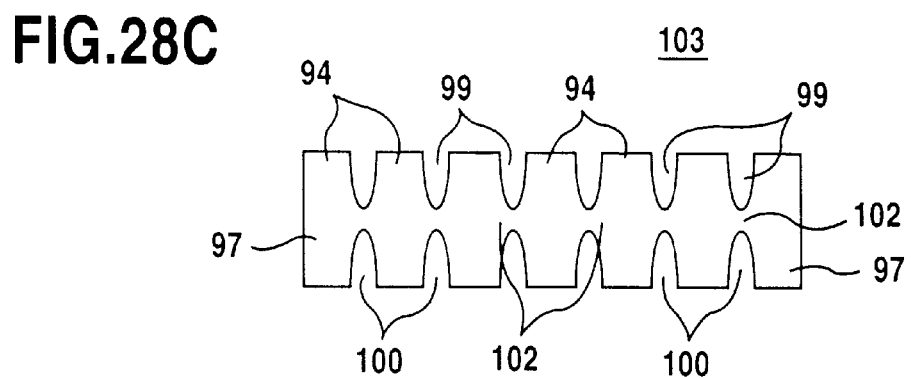
FIG. 28C is a sectional view taken on line II—II in FIG. 28A.

FIGS. 28A, 28B and 28C are enlarged views showing the outer terminal 103. FIG. 28A is a plan view, FIG. 28B is a sectional view taken on line I—I in FIG. 28A and FIG. 28C is a sectional view taken on line II—II in FIG. 28A.

As shown in FIGS. 28a, 28B and 28C, the pole terminal portions 94 are arranged close to the semiconductor device 91 (shown as dotted line in FIG. 28A) so as to surround the semiconductor chip 91. Also, the pole terminal portions 94 are surrounded by the frame portion 97 through the grooves 99, 100. Since the thin portion 101 on which the semiconductor chip 91 is mounted is a plate portion, the semiconductor chip 91 can be mounted easily.

Referring back to FIGS. 29A, 29B, 29C and 29D, the method for producing the semiconductor device is described.

After the outer terminals 103 are formed as described above, the semiconductor chip 91 is mounted on the upper surface on the thin portion 101 (the surface on which the bonding pads are formed) through the pad material 95 of an adhesive. As described above, the thin portion 101 is a flat plate and the semiconductor chip 91 is mounted on the thin portion through the pad material 95, so that the semiconductor chip 91 can be properly mounted without the semiconductor chip being declined.

The wires 93 are provided between the pads (not shown) and the bonding pads plated on the upper end of the pole terminal portions 94. By the wires 93, the semiconductor chip 91 is electrically connected to the pole terminal portions 94.

Figure 29D:
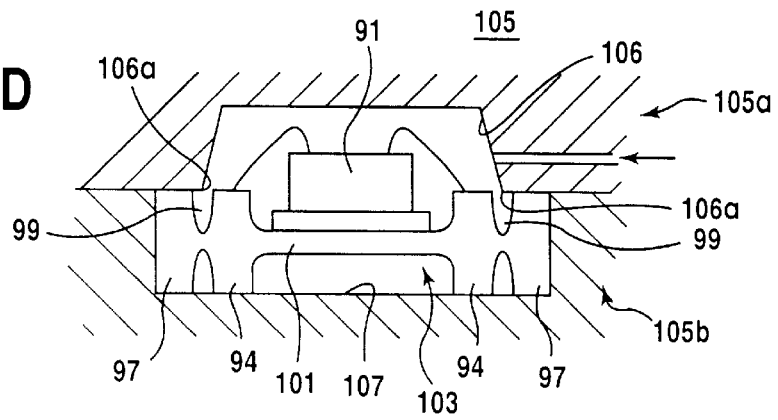

After the semiconductor chip 91 and the outer terminals 103 on which wires are provided are placed in a mold 105 as shown in FIG. 29D, a resin molding is conducted in order to form the resin package 92. The mold 105 comprises an upper mold 105a and a bottom mold 105b. In the upper mold 105a, a cavity 106 corresponding to a shape of the package 92 is formed.

In the cavity 106 formed in the mold 105, the outer terminal portion 103 is clamped between the upper mold 105a and the bottom mold 105b. An edge portion 106a of the cavity 106 is positioned in the groove 99 formed between the frame portion 97 and the pole terminal portions 94. That is, the edge portion 106b of the cavity 106 is positioned in the middle of the groove 99.

As described later, the frame portion 97 is separated and removed from the pole terminal portions 94 at the position where the groove 99 is formed. By setting the edge portion 106a of the cavity 106 in the central portion of the groove 99, the thickness of the separating portion can be thinner and the separation process of the frame portion 97 from the pole terminal portions 94 can be conducted easily.

In the resin molding process shown in FIG. 29D, the resin is filled only into the cavity 106 formed by the upper mold 105a but not into the cavity 106 formed by the bottom mold 105b.

Figure 30A:
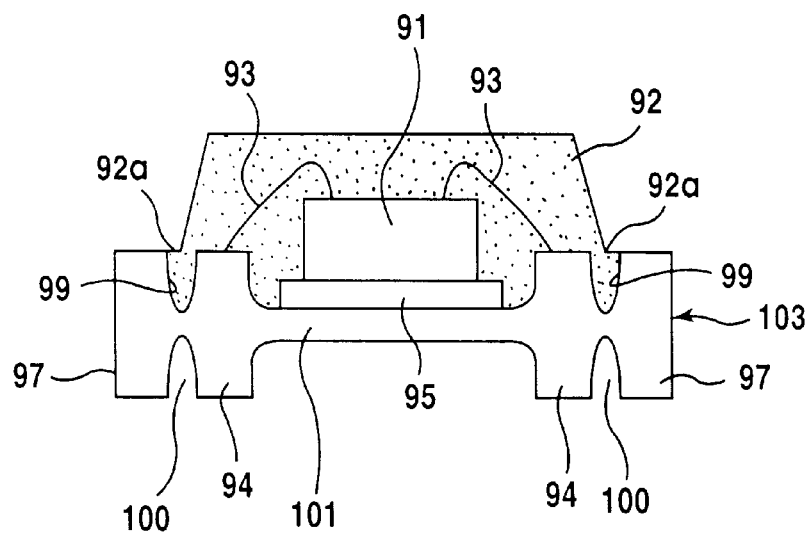
FIGS. 30A and 30B are schematic illustrations showing the method for producing the semiconductor device of the fifth embodiment.

FIG. 30A shows the outer terminal 103 in which the resin package 92 is formed. As described above, by setting the edge portion 106a of the cavity 106 to the central portion of the groove 99, the edge portion of the resin package is positioned on the central portion of the groove 99. Since the resin is filled into the groove 99 also, an upper side of the outer terminal 103 is covered with the resin package 92.

Subsequently, the thin portions 101, 102 are removed by an etching process. In this case, the etching process is conducted to an opposite surface of the outer terminal 103 to that on which the resin package is formed. That is, the etching process to the thin portions 101, 102 is conducted only to one surface of the outer terminal 103.

Figure 30B:
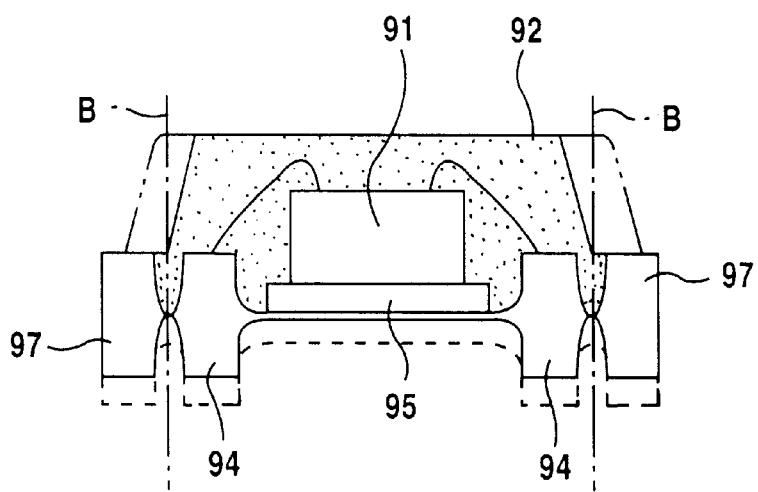

By the etching process, the thin layer portions 101, 102 are removed, the pad material 95 is exposed form the resin package 92, and the pole terminal portions are completely separated from the frame portion as shown in FIG. 30B. However, since the resin constituting the resin package 92 is formed between the pole terminal portion 94 and the frame portion 97, the frame portion 97 is not separated from the semiconductor device 90 in this step.

After the etching process, the resin package 92 is cut at portions shown by a one dotted chain line in FIG. 30B to separate the frame portion 92 from the semiconductor device 90 completely. Since the outer end portion 92a of the resin package 92 is positioned in the middle of the groove 99, this separation process can be conducted easily in this embodiment compared to a semiconductor device in which a resin package 92 is formed to the position shown by a two dotted chain line.

Next, a solder treatment is conducted to the pole terminal portions 94 of the separated and independent semiconductor device 90. In this case, the solder treatment is conducted to protruding portions of the pole terminal portions 94.

The above-mentioned solder treatment is conducted by dipping the protruding portions of the pole terminal portions 94 in a solder bath. Where the plating supplied in the above step remains in the semiconductor device 90, the plating is absorbed by the solder (or is rinsed by the solder).

In this step, both the soldering to the pole terminal portions 94 and the removal of the remaining plating can be conducted at the same time. The treatment to the pole terminal portions 94 is not limited to the soldering but a non-electrolytic plating can be conducted to the pole terminal portions 94 in order to form metallic layers on the pole terminal portions 94.

By the above-mentioned steps, the semiconductor device 90 shown in FIGS. 28A and 28B can be produced. In the method for producing the semiconductor 90 described above, the steps described with reference to FIG. 29C, FIG. 29D and FIG. 30A are conventional steps for forming the resin package. Accordingly, existing equipments can be utilized for a production of the semiconductor device 90. This feature also reduces a cost for producing the semiconductor device 90.

Figure 31A:
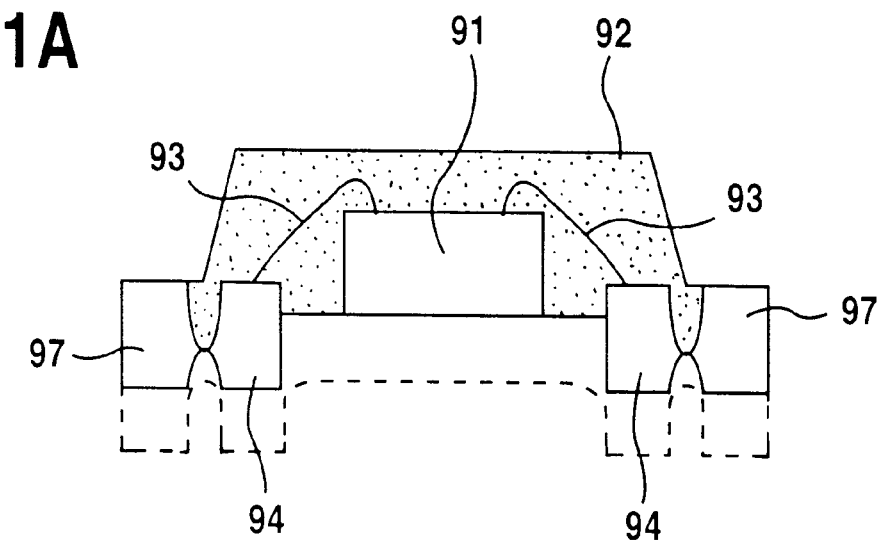
FIGS. 31A and 31B are schematic illustrations showing a variation of the method for producing the semiconductor device of the fifth embodiment.
Figure 31B:
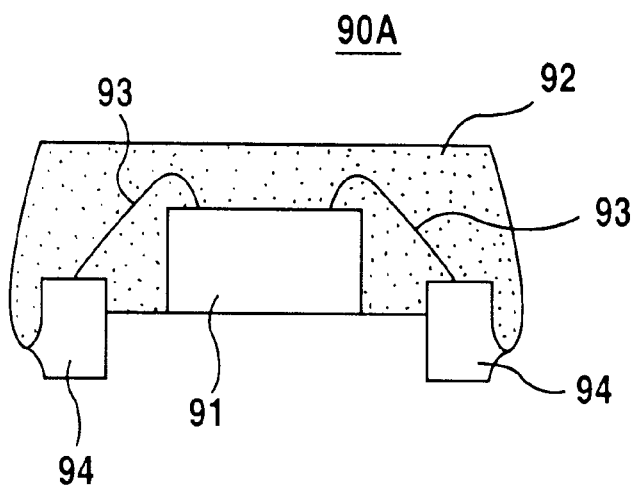

FIGS. 31A and 31B are schematic illustrations showing a variation of method for producing a semiconductor device 90 of the fifth embodiment. In the above-described embodiment, the etching process described with reference to FIG. 30B is finished when the thin portions 101, 102 are removed. However, this variation is characterized in that the pad material 95 is removed after the thin portions 101, 102 are removed as shown in FIG. 31A. The removal of the pad material 95 made of an adhesive can be done by using a solvent for resolving the pad material 95 or by a mechanical processing.

FIG. 31B shows the semiconductor device 90 in which the pad material 95 is removed as described above. As shown in FIG. 31B, by the removal of the pad material 95, the semiconductor device 90A can be further reduced both in size and in height. Also, since a bottom surface of the semiconductor chip 91 is exposed, a heat release efficiency of the semiconductor chip can be further improved.

Figure 32:
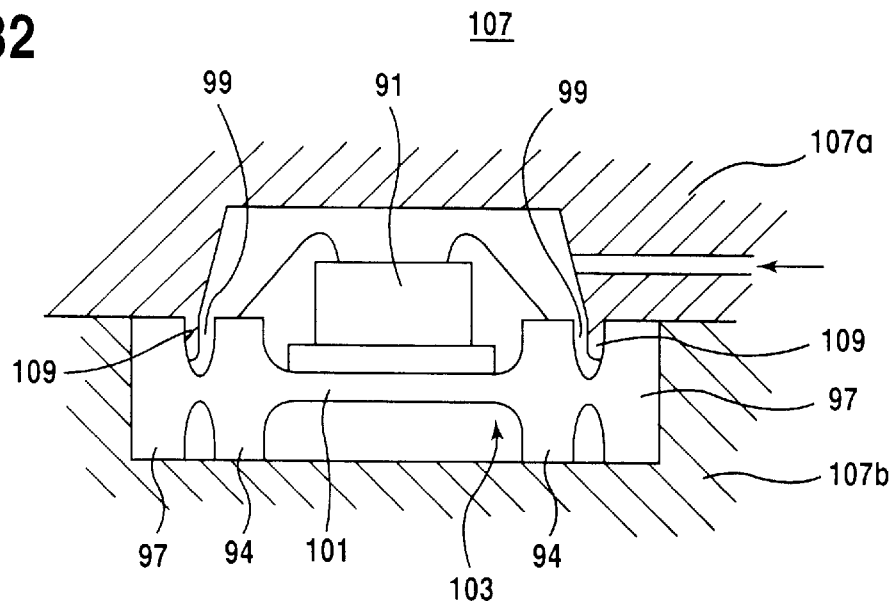
FIG. 32 is a sectional view showing a variation of a mold used in a resin molding step.

FIG. 32 shows a variation of the mold used in the resin molding step. In the mold 105 shown in FIG. 29D, the edge portion 106a of the cavity 106 formed by the upper mold 105a is positioned in the groove 99 formed between the frame portion 97 and the pole terminal portion 94 so that the frame portion 97 can be separated easily.

A mold 107 of this variation is characterized in that in a edge portion of a cavity 108 formed by an upper mold 107a, a projection 109 is provided to be inserted into the groove 99. By providing the projection 109 to be inserted into the groove 99, the resin package 92 at the separating portion can be made thinner, and the separation process can be conducted more easily. Also, since a position of the outer terminal 103 is determined by the projection 109 in the mold 107, a molding accuracy of the resin package to the outer terminal 103 can be improved.

In the above description of the embodiments and the drawings, only one outer terminal is made from the clad metal or the metal plate, and the semiconductor device is produced using the outer terminal, for a better understanding of the present invention. However, in the methods for producing the semiconductor device described above, a plurality of outer terminals can be made from the clad metal or the metal plate and the plurality of semiconductor devices can be produced at the same time. By this method, a production efficiency can be improved and a cost for the semiconductor device can be reduced.

Figure 34:
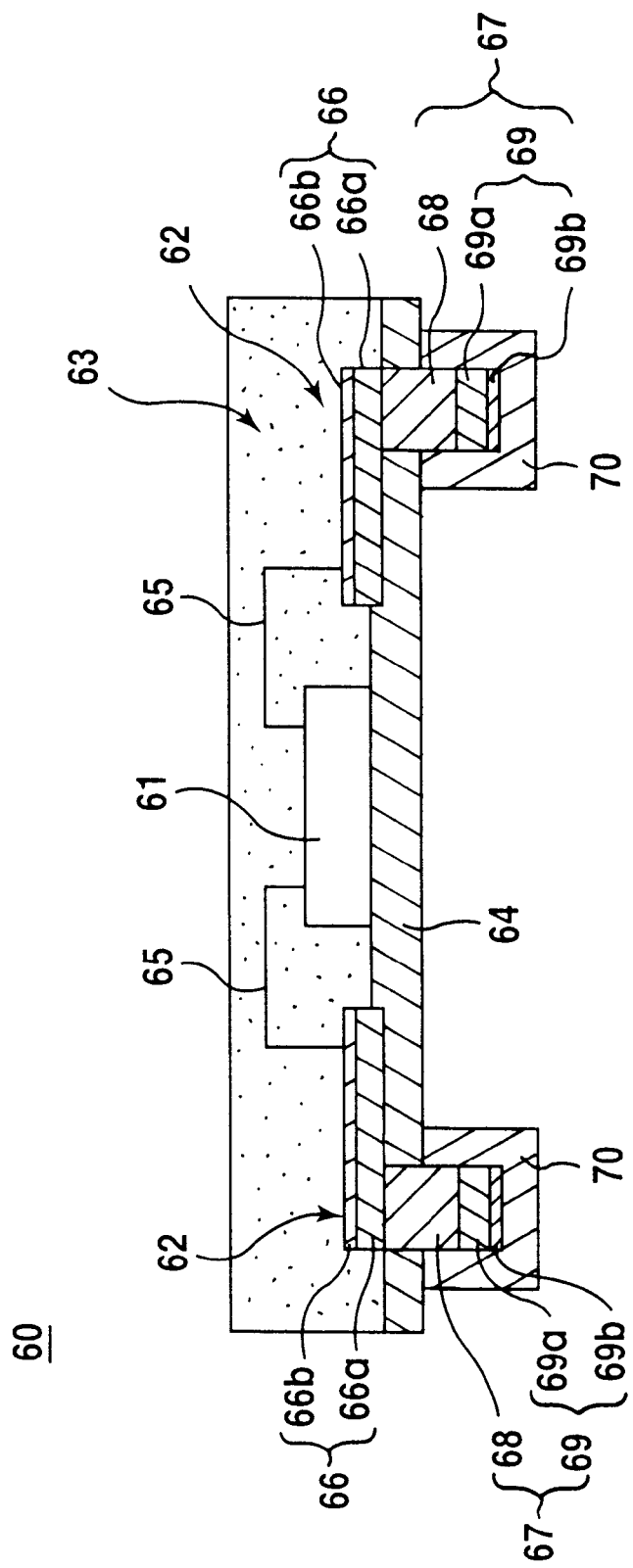
FIG. 34 is a schematic illustration showing a sixth embodiment of the present invention.

Next, a semiconductor device 60 of a sixth embodiment of the present invention will be described. FIG. 34 is a cross sectional view showing the sixth embodiment of the present invention. The semiconductor device 60 has a semiconductor chip 61, lead members 62, a sealing resin (package) 63 and a solder resist (insulating member) 64.

The semiconductor chip 61 is electrically connected to the lead members 62 through wires 65. The lead member 62 has a lead portion 66 extending outwardly from the semiconductor chip 61 and an outer connecting terminal portion 67 extending vertically downward from the lead portion 66. The lead portion 66 and the outer connecting terminal portion 67 are formed integrally in the lead members 62.

The lead portion has an inner layer 66a made of nickel (Ni), aluminum (Al) or titanium (Ti), and an outer layer 66b made of gold (Au), silver (Ag) or palladium (Pd) formed on the inner layer 66a.

The outer connecting terminal has a pole terminal portion 68 made of copper and a terminal end portion 69 formed under the pole terminal portion 68. The terminal end portion 69 has an inner layer 69a made of nickel (Ni), aluminum (Al) or titanium (Ti) and an outer layer 69b made of gold (Au), silver (Ag) or palladium (Pd) formed under the inner layer 69a.

As described later, though the pole terminal portions 68 are formed by etching using an alkali etchant (etching liquid), the lead portions 66 and the terminal end portions 69 are made of material which is not dissolved in the alkali etchant. Therefore, when the pole terminal portions 68 are formed by the etching, the lead portions 66 and the terminal end portions 69 may function as a resist.

One example of the sealing resin 63 is epoxy resin. The semiconductor chip 61, the lead portion 66 and the wires 65 are sealed in the sealing resin 63. A bottom face of the semiconductor chip 61 and a bottom face of the lead portions 66 are exposed from the sealing resin 63. The sealing resin 63 can be formed, for example, in a mold.

The solder resist 64 is made of electrical-insulating material (i.e. electrical-insulating resin). The solder resist 64 covers the bottom face of the semiconductor chip 61 and the bottom face of the lead portions 66. The outer connecting terminals 67 extending downward penetrate through the solder resist 64.

The portion of the outer connecting terminals 67 protruding from the solder resist 64 is plated with an outer layer 70 of gold or solder by an electroless plating. Since the solder resist 64 covers the bottom face of the semiconductor chip 61 and the bottom face of the lead portions 66, as described above, the outer layer 70 does not contact the semiconductor chip 61 or the lead portion 66 when the outer layer 70 is formed in the outer connecting terminals 67 by the electroless plating.

In the semiconductor device 60 described above, the lead member 62 has the lead portions 66 extending outwardly from the semiconductor chip 61 and the outer connecting terminals 67 extending downward from the lead portions 66. Thus, the position of the outer connecting terminal 67 is determined by a length of the lead portion. There are no constraints on the length of the lead portion. That is, since the position of the outer connecting terminal 67 can be decided regardless of the size of the semiconductor chip 61, the adaptability of the semiconductor device is improved.

Also, since the lead portion 66 and the outer connecting terminal 67 are formed integrally, through holes or wiring to electrically connect the lead portion 66 to the outer connecting terminal 67 is not required and production cost of the semiconductor device 60 can be reduced.

Next, a method for producing the semiconductor device 60 described above will be described referring to FIGS. 35–37. Hereinafter, the same features as those described in FIG. 34 will be denoted by the same reference numerals.

The method for producing the semiconductor device 60 includes a lead frame production step, a semiconductor chip mounting step, a resin sealing step, a substrate removal step, an insulating material providing step and a sheathing step.

Figure 35A:
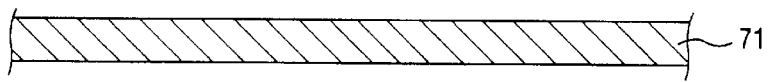
FIGS. 35A–35G are schematic illustrations showing a method for producing the semiconductor device of the sixth embodiment of the present invention.
Figure 35B:
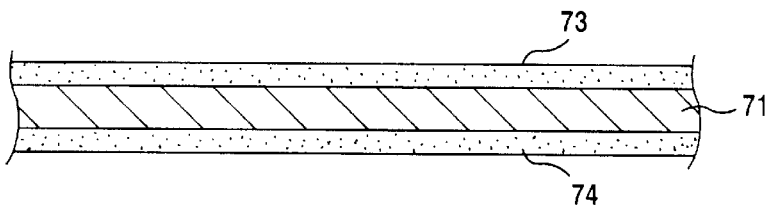

In the lead frame production step, the lead portions 66 and the terminal end portions 69 are formed on the substrate 71 to be a pole terminal portion 68, as shown in FIGS. 35A–35F. In order to form the lead frame 72, the substrate 71 is prepared, as shown in FIG. 35A. One example of the substrate 71 is a copper plate of 100 μm in thickness. Photoresist materials 73, 74 are applied in a predetermined thickness on an upper face and a bottom face of the substrate 71.

After the photoresist materials 73, 74 are exposed and developed, the photoresist materials 73, 74 are removed at positions which correspond to the lead portions 66 and the terminal end portions 69 to form openings 75, 76. As shown in FIG. 35D, in the openings 75, 76, the lead portions 66 and the terminal end portions 69 are formed by a plating method.

That is, a nickel, aluminum or titanium plating of 5 μm thickness is formed in the openings 75, 76 to form the inner layers 66a, 69a. On the inner layers 66a, 69a, a gold, silver or palladium plating of about 0.1 μm thickness is formed. The lead portions 66 and the terminal end portions 69 are formed in the openings 75, 76, as shown in FIG. 35D.

Figure 35C:
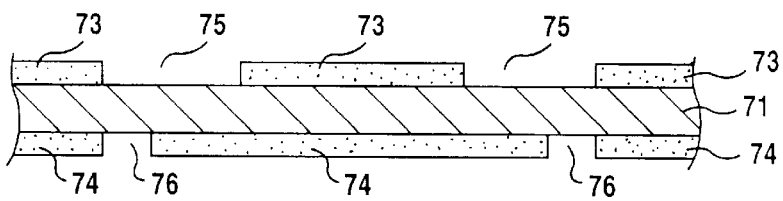
Figure 35D:
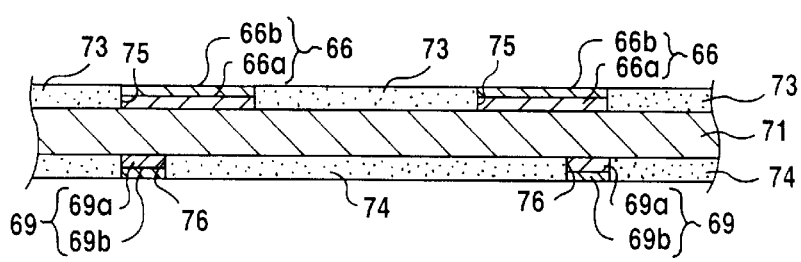
Figure 35E:
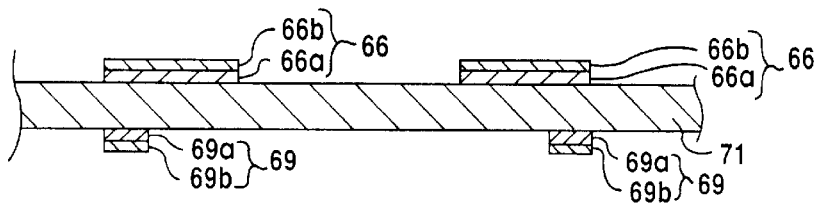
Figure 46:
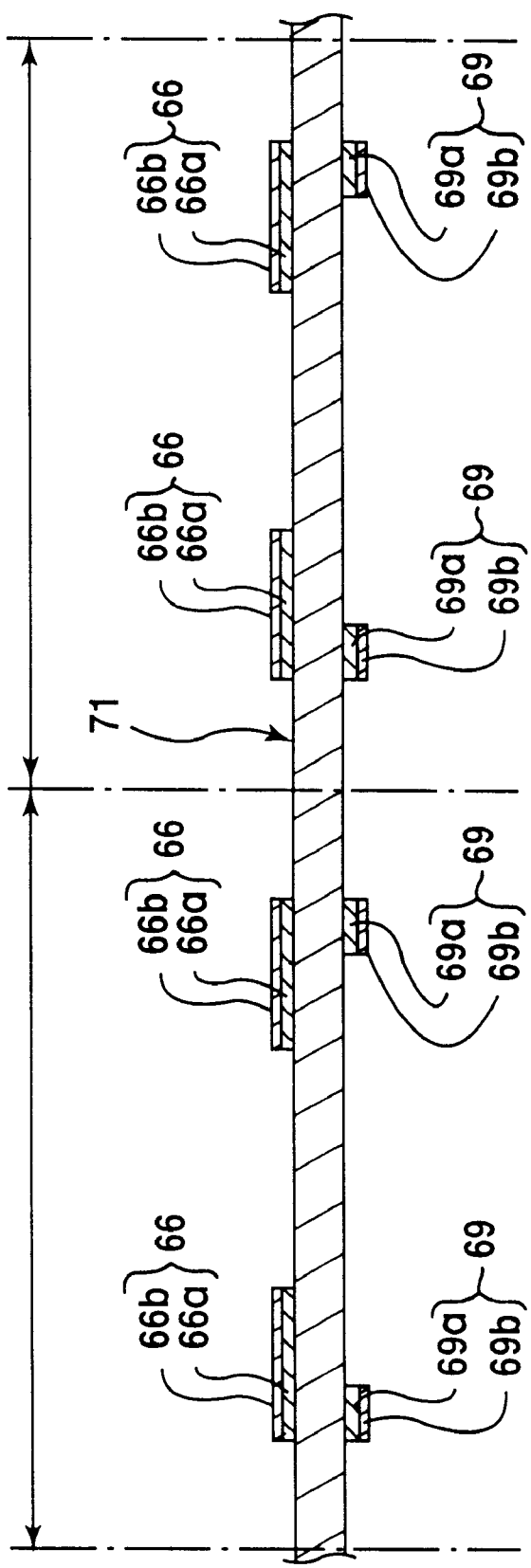
FIG. 46 is a schematic illustration showing a plurality of lead frames formed in a substrate.

After the lead portions 66 and the terminal end portions 69 are formed on the substrate 71, the photoresist materials 73, 74 are removed and the lead portions 66 and the terminal end portions 69 are formed in the substrate 71, as shown in FIG. 35E. At this time, one substrate 71 has the lead portions 66 and the terminal end portions 69 for a plurality of (in FIG. 46, two) semiconductor devices 60.

The substrate 71 having the lead portions 66 and the terminal end portions 69 for a plurality of semiconductor devices 60 is divided into several parts for each of the semiconductor devices 60. In one example shown in FIG. 46, the substrate is divided along one-dotted-chain-lines to prepare substrates 71 corresponding to each one of the semiconductor device 60 (hereinafter, referred to as lead frame 71).

In this method, after the lead portions 66 and the terminal end portions 69 for a plurality of the semiconductor devices 60 are formed in one substrate 71, the substrate 71 is divided into several parts to be the lead frames 72. Therefore, a plurality of the lead frames 72 can be prepared from one substrate 72 efficiently and accurately.

Figure 35F:
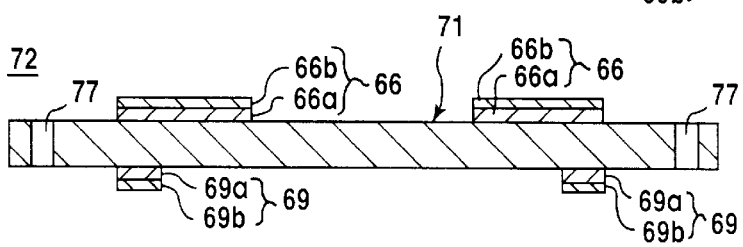

When one substrate 71 is divided into several lead frames 72 by a press-processing, positioning guide holes 77 and element throttles (not shown) are formed integrally. In this method, the lead frame can be prepared easily compared to a method in which the positioning guide holes 77 and the element throttles are formed separately by, for example, etching. FIG. 35F shows the lead frame 72 prepared by the above method.

Figure 35G:
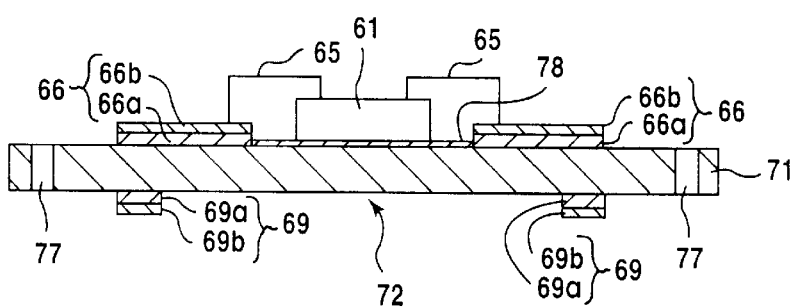

After the lead frames 72 are prepared in the lead frame production step, a semiconductor chip mounting step is performed. In this step, the semiconductor chip 61 is mounted at a certain position on the lead frame 72 and the semiconductor chip 61 is electrically connected to the lead portions 66, as shown in FIG. 35G.

In the semiconductor chip mounting step, at a position on the lead frame 72 where the semiconductor chip 61 is mounted, a soluble insulating material 78 which is soluble in an alkali etchant described later (i.e. poly (vinyl alcohol)) is applied. The semiconductor chip 61 is mounted on the upper face of the lead frame 72 through the soluble insulating material 78 as an adhesive. After that, the wires 65 of, for example, gold are provided between the semiconductor chip 61 and the lead portions 66 by a wire-bonding method. In this case, since the lead 66 has the inner layer 66a of, for example, nickel and the outer layer 66b of, for example, gold formed on the inner layer 66a, and the wires 65 are connected to the outer layers 66b of the same material as that of the wires 65, the wires 65 can be tightly connected to the outer layers 66b.

Figure 36A:
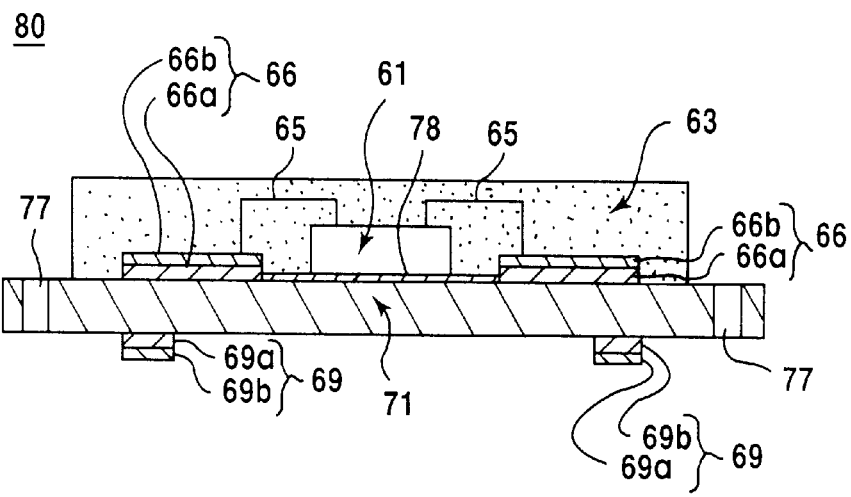
FIGS. 36A–36C are other schematic illustrations showing the method for producing the semiconductor device of the sixth embodiment of the present invention.

After the semiconductor chip 61 is mounted on the lead frame 72 in the semiconductor chip mounting step, the step for sealing resin is conducted. In this step, the semiconductor chip 61 and the lead portions 66 are sealed in the sealing resin 63, as shown in FIG. 36A. In this embodiment, the sealing resin 63 is formed by molding. The semiconductor chip 61 and the lead portions, except bottom surfaces thereof, and the wires 65 are protected by the sealing resin 63. One example of the sealing resin 63 is epoxy resin.

After the sealing resin 63 is provided in the step for sealing resin, the substrate removal step is conducted. In this step, the substrate 71, except the areas where the terminal end portions 69 are formed, and the soluble insulating material 78 is removed.

In this step, the semiconductor device assembly 80 shown in FIG. 36A is dipped in an alkali etchant (etching liquid) in an etching bath to remove the copper substrate 71 by etching. Since the lead portion 66 and the terminal end portion 69 are made of the material insoluble in the alkali etchant, as described above, the lead portion 66 and the terminal end portion 68 function as a resist.

Figure 36B:
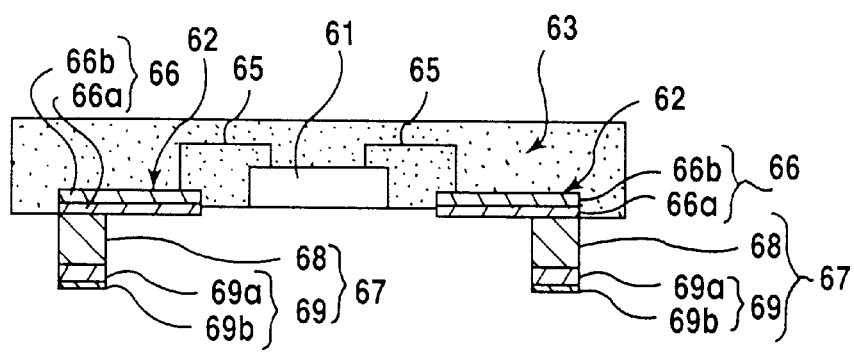

Therefore, the substrate 71, except the portion between the lead portions 66 and the terminal end portions 69, is dissolved in the alkali etchant and removed. FIG. 36B show the semiconductor device assembly after the substrate removal step. As shown in FIG. 36B, parts of the substrate between the lead portions 66 and the terminal end portions 69 remain even after the etching, and the pole terminal portions 68 are formed between the lead portions 66 and the terminal end portions 69.

Through the above processes, the lead portion 66 extending outwardly and the outer connecting terminal including pole terminal 68 and the terminal end portion 69, which extends downwardly from the lead portion are formed. Also, since the soluble insulating material 78 is removed by the etching, the bottom face of the semiconductor chip 61 and the bottom face of the lead portion 66 except where the outer connecting terminal 67 is formed, are exposed from the sealing resin 63.

Figure 36C:
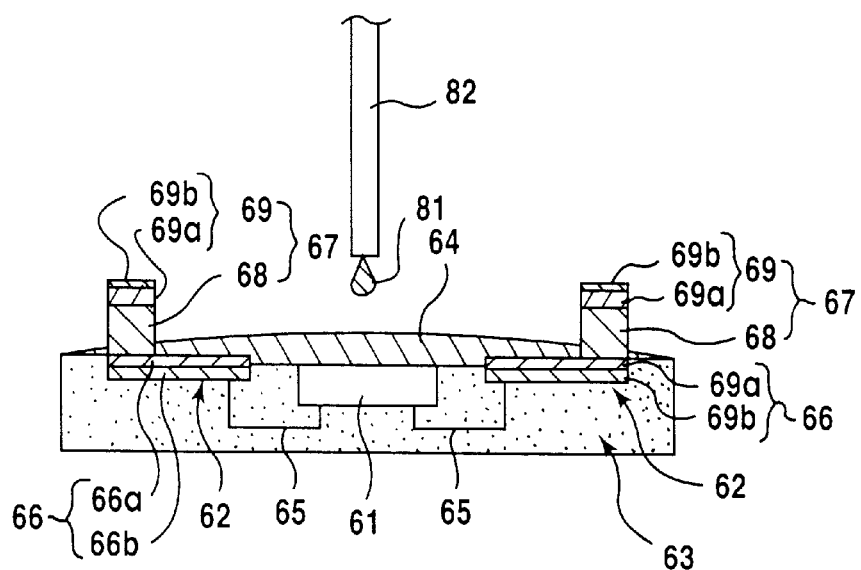

After the substrate 71 is removed in the substrate removal step, the insulating material providing step is performed. In this step, the bottom face of the semiconductor chip 61 and the bottom face of the lead portion 66, except the outer connecting terminal portion are covered with the solder resist 64 (insulating material), as shown in FIG. 36C.

In this step, a liquid insulating material 81 having a low viscosity is used as a solder resist. That is, after the liquid insulating material 81 is dropped from the potting nozzle 82, the semiconductor device is spun at a high speed to spread the liquid insulating material 81 uniformly, as shown in FIG. 36C to form the solder resist 64. Alternatively, the liquid insulating material 81 can be simply applied to the semiconductor chip 61 and the lead portion 66 to form the solder resist 64.

In the method in which the liquid insulating material 81 having a low viscosity dropped from the potting nozzle, the solder-resist can be provided efficiently. The reason is that the outer connecting terminal 67 extends downwardly from the lead portion 66.

When the liquid insulating material is dropped or simply applied on the outer connecting terminal 67 of a flat structure, such as a semiconductor device of LGA (Land Grid Array) structure, the outer connecting terminal is covered with the liquid insulating material and does not function as a connecting terminal. Thus, when the liquid insulating material is used in the LGA structure, the outer connecting terminal must be masked to prevent the liquid insulating material from being stuck to the outer connecting terminal.

Figure 37:
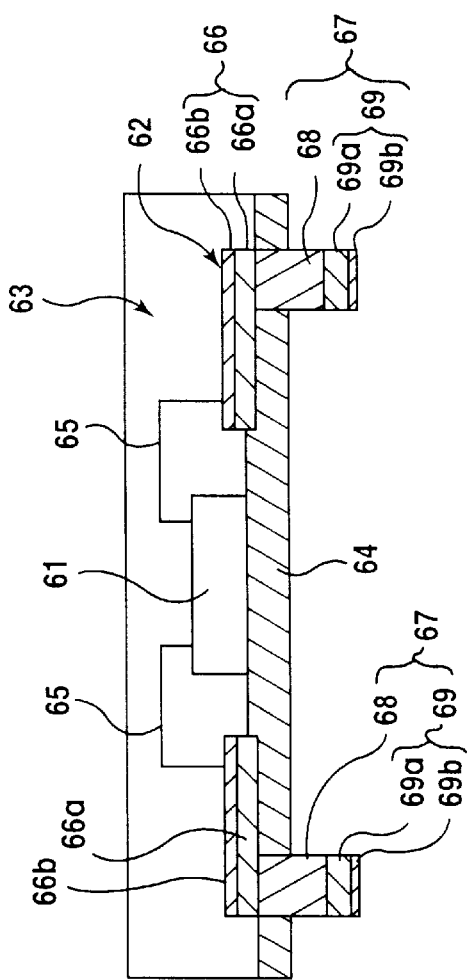
FIG. 37 is another schematic illustration showing the method for producing the semiconductor device of the sixth embodiment of the present invention.

On the other hand, in the semiconductor device in which the outer connecting terminals 67 extend downwardly from the lead portion 66, when the liquid insulating material 81 is applied, the masking described above is not necessary since the outer connecting terminal 67 protrudes from the liquid insulating material (solder resist) 81. Thus, the solder resist 64 can be provided easily. FIG. 37 shows the solder resist 64 formed by the methods described above.

After the solder resist is formed in the insulating material providing step, the sheathing step is performed. In this step, the outer layers 70 are formed on the outer connecting terminals 67 protruding from the solder resist 64. That is, on the portion of the outer connecting terminals protruding from the solder resist 64, the outer layers 70 of gold or solder are plated by, for example, electroless plating. In this case, since the solder resist 64 of an electric insulating material is provided under the semiconductor device and the lead portion as described above, the outer layer 70 does not stick to the semiconductor chip 61 and the lead portion 66 when the outer layers 70 are formed on the outer connecting terminals 67 by the electroless plating method.

Through all the steps described above, the semiconductor device 60 shown in FIG. 34 is produced. In the above method, since the semiconductor device 61 is manufactured from the lead frame 72 prepared in advance, the semiconductor device can be produced efficiently and accurately.

Also, the semiconductor chip 61 is mounted on the lead frame 72 through the soluble insulating material 78 which is removed in the substrate removal step, the bottom surface of the semiconductor chip 61 is exposed. Therefore, since the bottom surface of the semiconductor chip contacts the solder resist 64, heat release characteristics of the semiconductor chip 61 are improved.

After the substrate removal step, the outer layers 70 are formed on the outer connecting terminals 67 in the sheathing step. This prevents a short circuit between the lead portions 66 and between the semiconductor chip 61 and the lead portions 66, which may be made by the outer layers 70.

Figure 38:
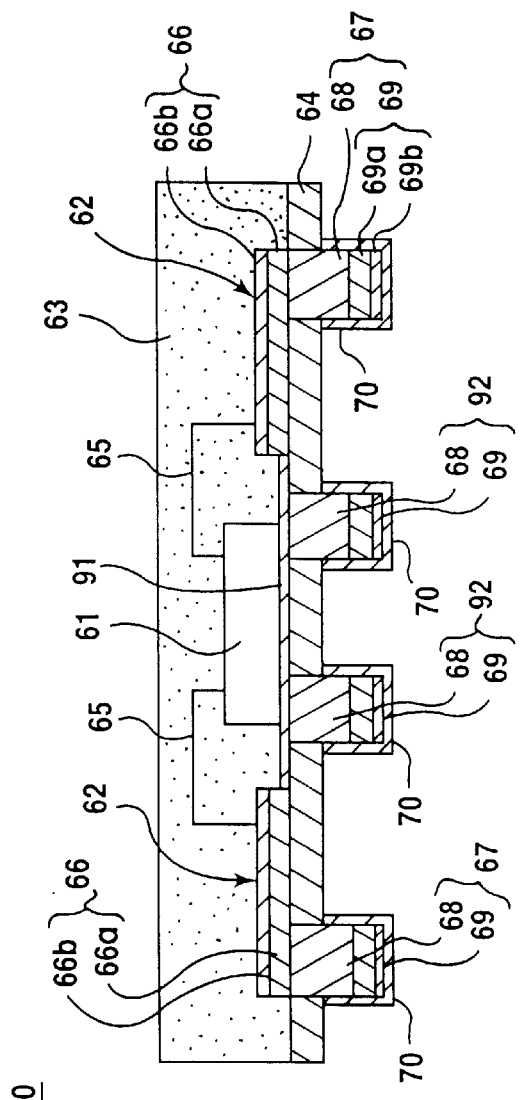
FIG. 38 is a schematic illustration showing a seventh embodiment of the present invention.

Next, the semiconductor device 90 of a seventh embodiment of the present invention will be described. FIG. 38 is a sectional view showing a semiconductor device of the seventh embodiment. In FIG. 38, the same features as those previously described with reference to FIG. 34 will be denoted by the same reference numerals and the detailed descriptions thereof are omitted.

In the semiconductor device 90 of the sixth embodiment, the semiconductor chip 61 is mounted on the lead frame 72 through the soluble insulating material 78. However, in the seventh embodiment of the present invention, the semiconductor chip 61 is mounted on the lead frame 72 through an insoluble insulating material 91. Therefore, after the substrate 71 is etched by the alkali etchant, the insoluble insulating material 91 is not etched and remains under the semiconductor chip 61.

In the semiconductor chip 90 of this embodiment, the outer connecting terminal 92 (hereinafter, this outer connecting terminal 92 is referred to as inner terminal portion 92) is provided under the insoluble insulating material 91 provided under the semiconductor chip 61. Therefore, in the semiconductor device 90 of this embodiment, the outer connecting terminals 67 are outwardly spaced from the semiconductor chip 61 and the inner terminals 92 are provided under the semiconductor chip 61.

Since the insoluble insulating material 91 remains under the semiconductor chip 61, the inner terminals 92 can be provided under the insoluble insulating material 91 (semiconductor chip 61). In the semiconductor chip 90 shown in FIG. 38, the inner terminals 92 function as a heat release member releasing heat generated in the semiconductor chip 61.

In the above structure, the heat generated in the semiconductor chip 61 is released by the inner terminals 92. An inner terminal 92 has the same structure as that of an outer connecting terminal 67 and the terminal end portion 69 comprises a nickel layer and a gold layer is formed under the pole terminal portion 68 which is made of copper and has high heat release characteristics. Accordingly, the heat generated in the semiconductor chip 61 can be released efficiently. Also, when the inner terminal 92 is connected to the lead portion 61, the inner terminal 92 can function as a signal terminal or a power-source terminal. In this case, the number of pins provided in the semiconductor device 90 can be increased and the semiconductor device 90 can be highly-integrated.

Next, referring to FIGS. 39 and 40, a method for producing the semiconductor device 90 described above will be described. In the following description, the same features as those described in FIG. 38 will be denoted by the same reference numerals. Also, in the following description, differences between this method and the method for producing the semiconductor device 60 are described and the descriptions of similarities are omitted.

The method for producing a semiconductor device 90 includes the lead frame production step, the semiconductor chip mounting step, the resin sealing step, the substrate removal step, the insulating material providing step and the sheathing step.

Figure 39A:
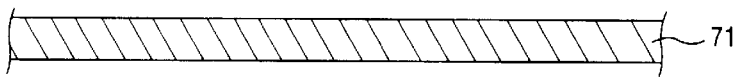
FIGS. 39A–39G are schematic illustrations showing a method for producing the semiconductor device of the seventh embodiment of the present invention.
Figure 39B:
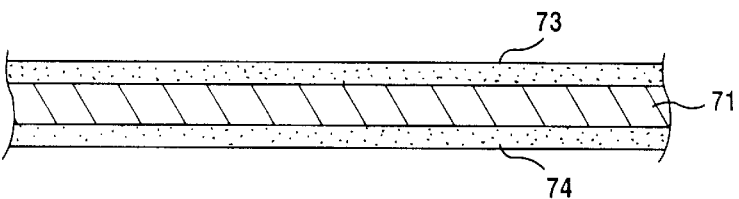
Figure 39C:
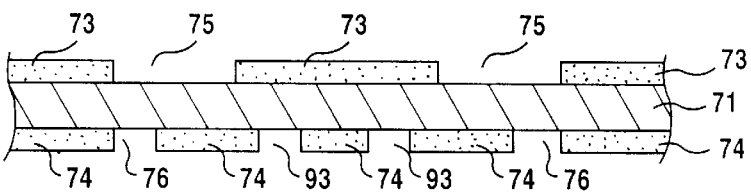
Figure 39D:
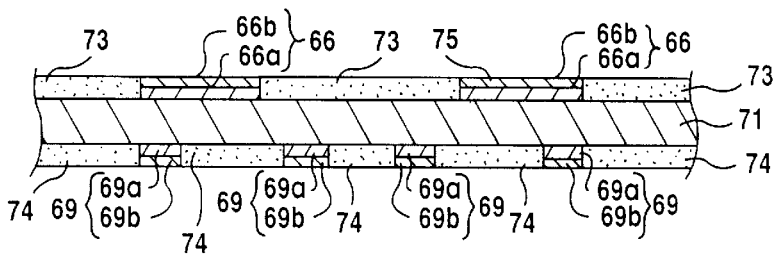
Figure 39E:
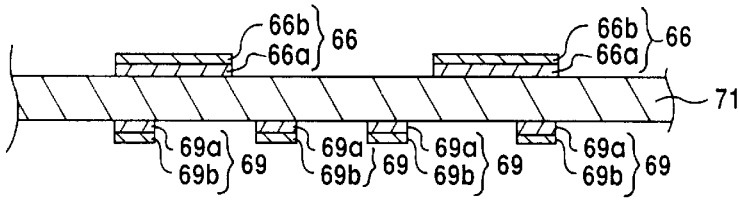
Figure 39F:
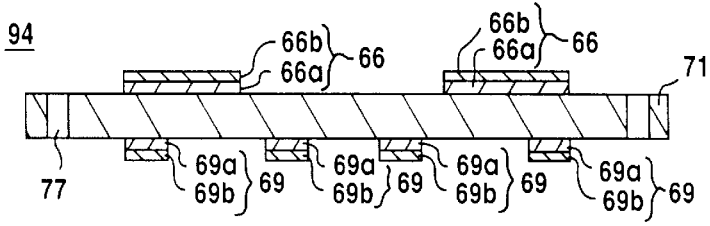

FIGS. 39–39F show the lead frame production step. A difference from the above-described method is that openings 93 are formed in the resist corresponding to the inner terminals 92 in addition to the openings 75, 76 corresponding to the lead portions 69 and the terminal end portions when the photoresist material 73, 74 is exposed and developed.

The openings 93 formed in the photoresist 74 are plated with nickel, aluminum or titanium to form the inner layers 69a. The inner layers 69a are plated with gold, silver or palladium to form the inner terminals 92. That is, the terminal end portion 69 for the inner terminal 92 is formed with the terminal end portion 69 for the outer connecting terminal 67. FIG. 39D shows the lead portion 66 and the terminal end portion 69 formed.

When the lead portions 66 and the terminal end portions 69 are formed on the substrate 71, the photoresist materials 73, 74 are removed. After the substrate 71 is divided into parts for each of the semiconductor device 90, the lead frames 94 are prepared, as shown in FIG. 39F.

Since the terminal end portion 69 for the inner terminal 92 is formed with the terminal end portion 69 for the outer connecting terminal 67, the lead frame having the inner terminal 92 is formed efficiently.

Figure 39G:
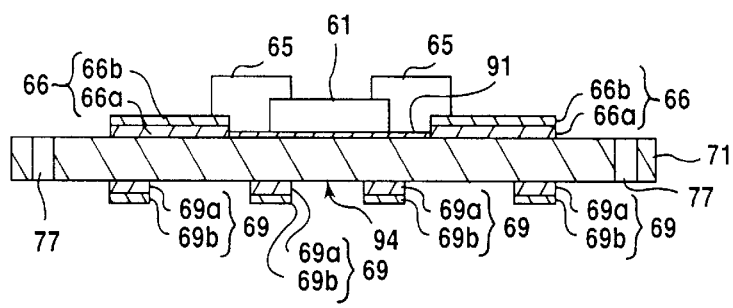

After the lead frame 94 is prepared in the lead frame production step, the semiconductor chip mounting step is performed. In this step, the semiconductor chip 61 is mounted on the lead frame 94 through an insoluble insulating material 91 (i.e. epoxy resin). The material 91 is insoluble in alkali etchant which dissolves the copper substrate 71. FIG. 39G shows the semiconductor chip 61 mounted on the lead frame 94 through the insoluble insulating material 91 as an adhesive.

Figure 40A:
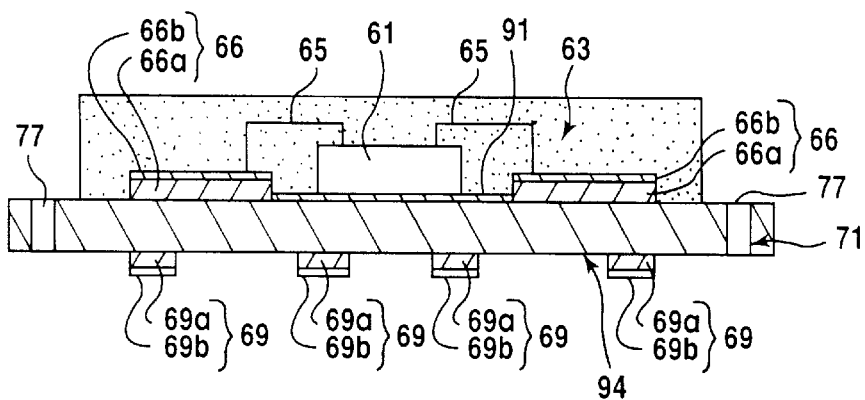
FIGS. 40A–40C are other schematic illustrations showing the method for producing the semiconductor device of the seventh embodiment of the present invention.

After the semiconductor chip mounting step, the sealing resin 63 is provided in the resin sealing step, as shown in FIG. 40A. After the resin sealing step, the substrate removal step is performed.

In the substrate removal step, the semiconductor device assembly 95 shown in FIG. 40A is dipped in the alkali etchant (etching liquid) in an etching bath to remove the copper substrate 71. As described above, the lead portions 66 and the terminal end portions 69 are made of the material which is not dissolved in the alkali etchant. Therefore, when the pole terminal portions 68 are formed by the etching method, the lead portions 66 and the terminal end portions 69 can function as a resist.

Figure 40B:
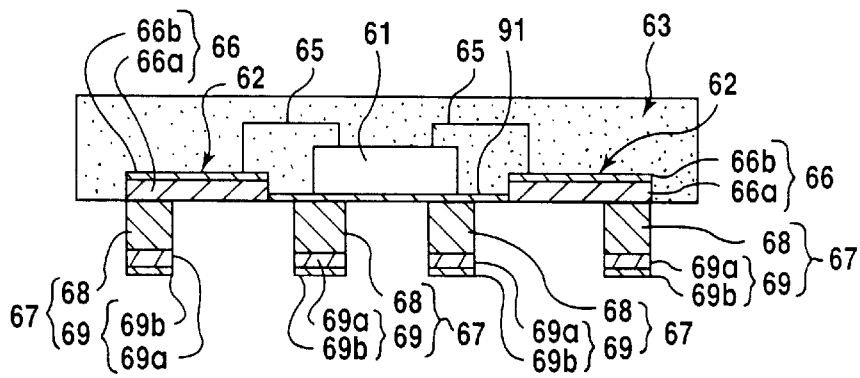

The substrate 71 except portions between the lead portions 66 and the terminal end portions 69 is dissolved in the alkali etchant and removed. FIG. 40B shows the semiconductor device assembly 95 in which the substrate is removed. As shown in FIG. 40B, even after the etching process, the portions of substrate 71 between the lead portions 66 and the terminal end portions 69 remain to be pole terminal portions 68.

Also, since the insoluble insulating material 91 is made of the material which is not dissolved in the alkali etchant which dissolves the substrate 71, the insoluble insulating material 91 is not removed and remains under the semiconductor chip 61 after the etching process.

Through the above processes, the lead member having the lead portion 66 extending outwardly and the outer connecting terminal 67 extending downwardly from the lead portion in which the terminal end portions 69 and the pole terminal portion 68, 68 are formed is provided. Since the inner terminals 92 are electrically insulated from the semiconductor chip 61 through the insoluble insulating material 91, the inner terminals 92 are not electrically connected to the semiconductor chip 61.

In this embodiment also, after the substrate removal step, the bottom face of the semiconductor chip 61 and the bottom face of the lead portion 66, except where the outer connecting terminal 67 is formed, are exposed from the sealing resin 63.

Figure 40C:
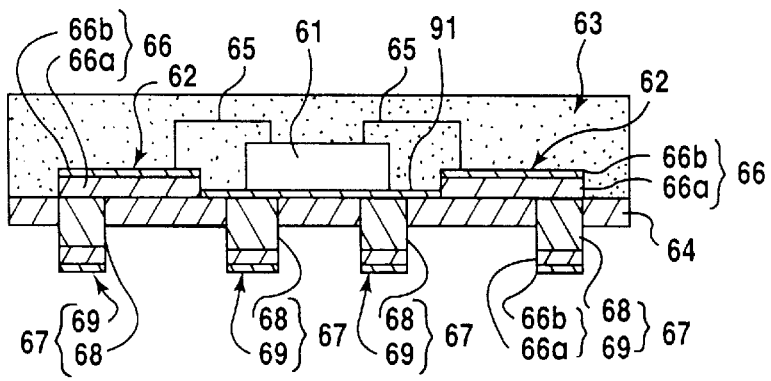

After the substrate 71 is removed in the substrate removal step, an insulating material providing step is performed to provide the solder resists 64 under the semiconductor chip 61 and the lead portion 66, as shown in FIG. 40C. After the solder resists are provided, the sheathing step is conducted to form the outer layers 70 on the surface of the outer connecting terminals 67 protruding from the solder resist 64.

Through the above steps, the semiconductor device shown in FIG. 38 is produced. According to the method described above, since the semiconductor device 60 is produced from the lead frame 94 prepared in the lead frame production step, which is similar to that described with reference to FIGS. 35–37, the semiconductor device can be produced efficiently and accurately.

Since the sheathing step to form the outer layers 70 on the outer connecting terminals 67 is performed after the insulating material providing step, a short circuit between the semiconductor chip 61 and the lead portion 66 and a short circuit between the lead portions 66 through the outer layers can be avoided. In addition, the semiconductor chip is mounted on the lead frame 94 through the insoluble insulating material in the semiconductor chip mounting step. The insoluble insulating material is not removed in the etching process. Therefore, the inner terminals 92 (heat release members) or the outer connecting terminals can be provided under the insoluble insulating material 91 or under the semiconductor chip 61.

Figure 41:
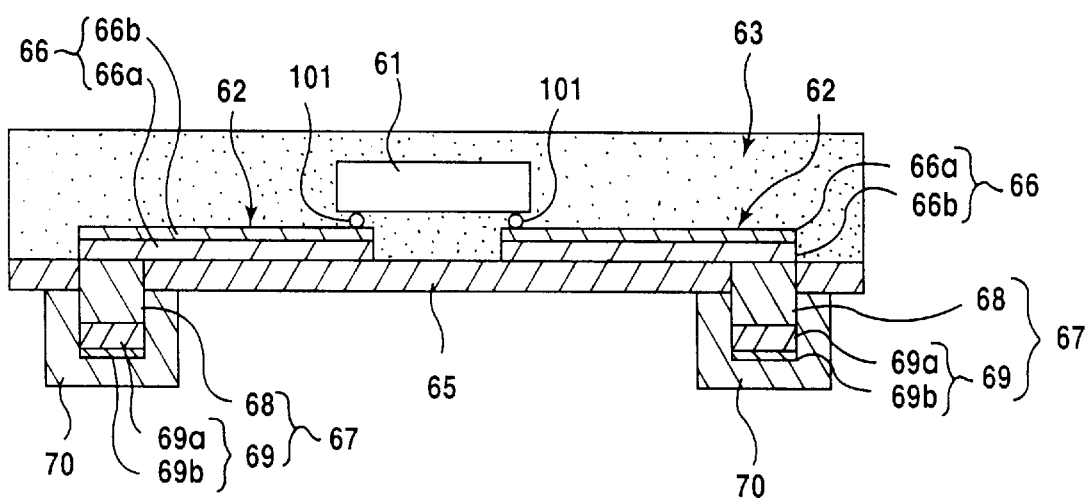
FIG. 41 is a schematic illustration showing a eighth embodiment of the present invention.

Next, a semiconductor device 100 of a eighth embodiment of the present invention will be described. FIG. 41 is a sectional view showing a semiconductor device 100 of the eighth embodiment of the present invention. In FIG. 41, the same features as those of the semiconductor device 60 of the sixth embodiment shown in FIG. 34 will be denoted by the same reference numerals and the descriptions thereof will be omitted.

In the semiconductor device 60 of the sixth embodiment, the semiconductor chip 61 is connected to the lead portions 66 through the wires 65. Instead, in the eighth embodiment, the semiconductor chip 61 is connected to the lead portion 66 by a flip-chip-bonding using bump electrodes 101.

In the semiconductor device in which the semiconductor chip 61 is connected to the lead portion 66 by the flip-chipbonding using the bump electrodes 101, electrical characteristics (i.e. impedance) can be improved. Also, the semiconductor device can be highly-integrated so that the number of pins provided in the semiconductor device 90 can be increased.

Hereinafter, a method for producing the semiconductor device 100 will be described referring to FIGS. 42 and 43. In this description, the same features described in FIG. 41 will be denoted by the same reference numerals. Also, in this description, the difference between this method and that described with reference to FIGS. 35–37 will be described and descriptions of the similarities are omitted.

The method for producing the semiconductor device 100 includes the lead frame production step, the semiconductor chip mounting step, the resin sealing step, the substrate removal step, the insulating material providing step and the sheathing step.

Figure 42A:
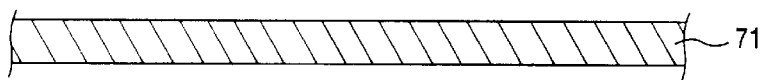
FIGS. 42A–42G are schematic illustrations showing a method for producing the semiconductor device of the eighth embodiment of the present invention.
Figure 42B:
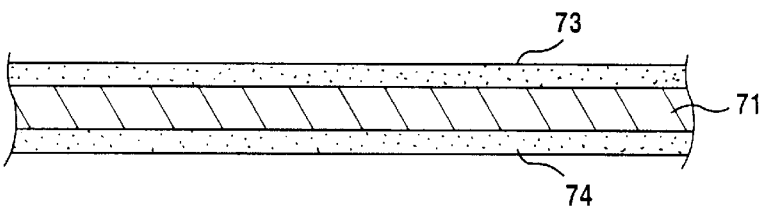
Figure 42C:
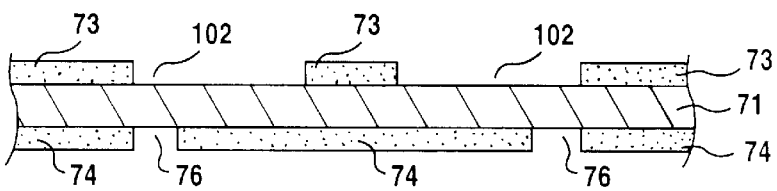
Figure 42D:
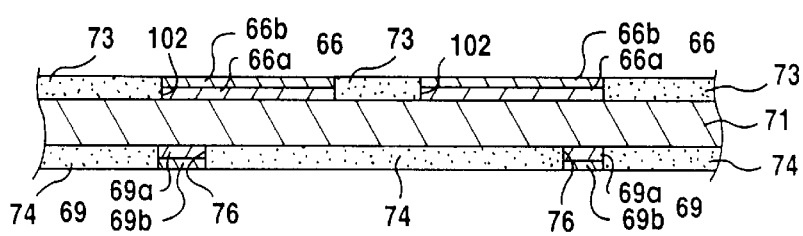
Figure 42E:
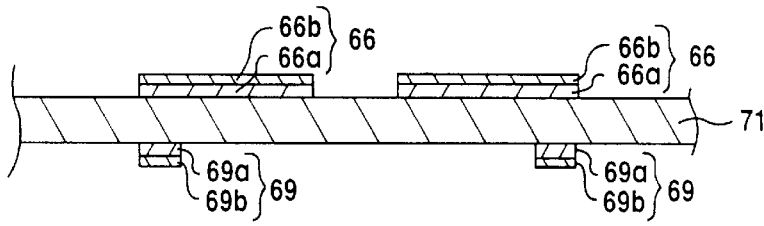
Figure 42F:
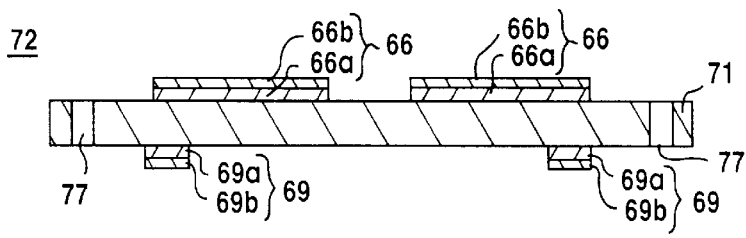

FIGS. 42A–42F show the lead frame production step. In the lead frame production step, when the photoresist material 73, 74 is exposed and developed to form the openings, the openings 102 corresponding to the lead portions 66 extend to the lower part of the semiconductor chip 61, as shown in FIG. 42C.

The openings 102 are plated with nickel, aluminum or titanium to form the inner layers 69a. The inner layer 69a are plated with gold, silver or palladium to form the inner terminals 92.

After the lead portions 66 and the terminal end portions 69 are formed in the substrate, as described above, the photoresist materials 73, 74 are removed. After that, the substrate 71 is divided into several parts for each semiconductor device to prepare the lead frame 72 shown in FIG. 42F.

In the lead frame production step, a length and a shape of the lead portion 66 can be determined as desired. Therefore, the flip-chip-bonding method can be utilized easily.

Figure 42G:
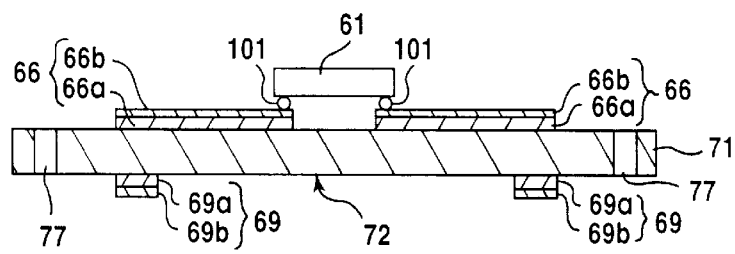

When the lead frame 72 is produced in the lead frame production step, the semiconductor chip mounting step will be performed. In this step, the bump electrodes 101 (i.e. solder bump or gold bump) are formed at electrode pads on the semiconductor chip 61 or at predetermined position in the lead portion 66 in advance. After the semiconductor chip is placed on the lead portion 66, the semiconductor chip 61 is connected to the lead portion 66 by heating. By the flip-chip-bonding method, electrical characteristics and integration of the semiconductor device can be improved. FIG. 42G shows the semiconductor device assembly after the semiconductor chip mounting portion is completed.

Though it is not shown in FIGS. 42 and 43, soluble or insoluble insulating material can be applied under the semiconductor chip 61. The advantage of applying the soluble or insoluble insulating material has been discussed above.

Figure 43A:
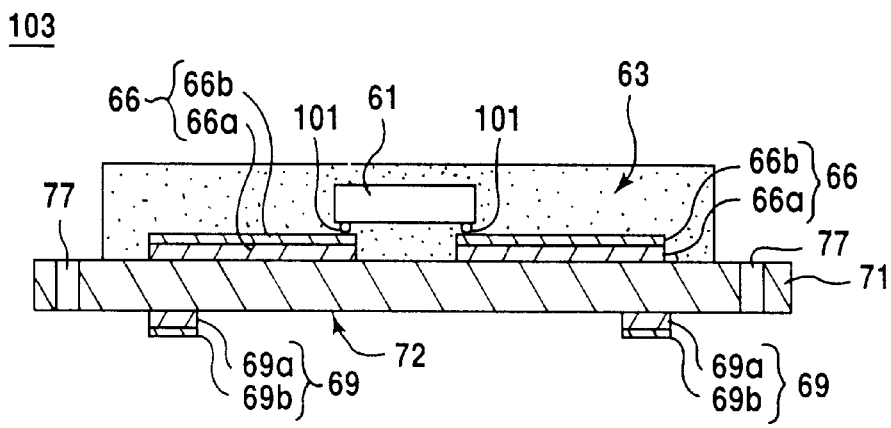
FIGS. 43A–43C are other schematic illustrations showing the method for producing the semiconductor device of the eighth embodiment of the present invention.

After the semiconductor chip mounting step, the sealing resin 63 is provided in the resin sealing step, as shown in FIG. 43A. After the step for sealing resin, the substrate removal step is performed.

Figure 43B:
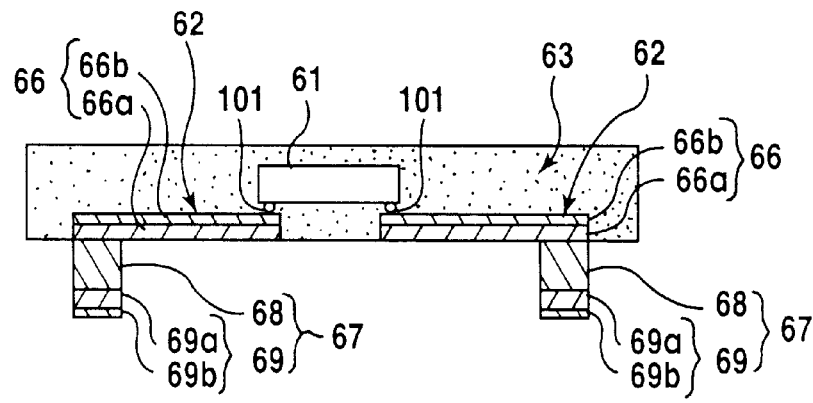

In this step, the semiconductor device assembly 103 shown in FIG. 43A is dipped in the alkali etchant (etching liquid) to remove the substrate 71 by the etching. By the etching process, the substrate 71 except the portions between the lead portions 66 and the terminal end portions 69, is dissolved in the alkali etchant and removed. FIG. 43B shows the semiconductor device assembly after the substrate removal step.

Figure 43C:
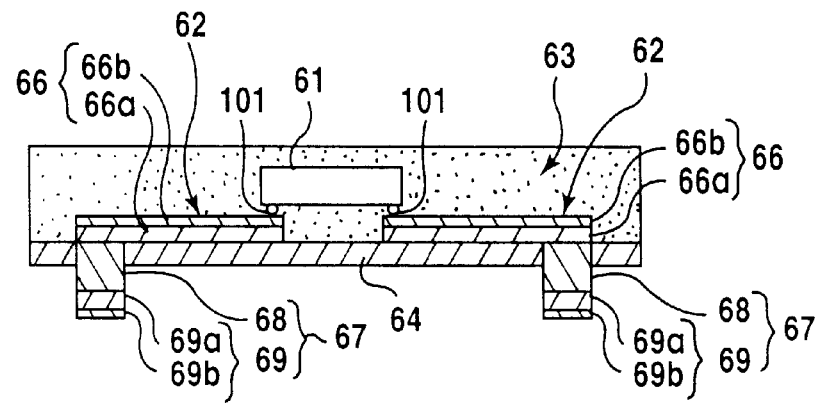

After the substrate 71 is removed in the substrate removal step, the insulating material providing step is performed to provide the solder resist 64 under the semiconductor chip 61 and the lead portion 66, as shown in FIG. 43C. After the solder resist 64 is provided, the sheathing step is performed to form the outer layers 70 on the outer connecting terminals 67 protruding from the solder resist 64. Through the above process, the semiconductor device 90 shown in FIG. 41 is produced.

Hereinafter, a variation of the lead frame production step will be described referring to FIGS. 44 and 45. FIGS. 44A–44D show a variation of the lead frame production step. In the lead frame production step described above, the opening 75, 76 are formed in the photoresist material 73, 74 to form the lead portion 66 and the terminal end portion 69.

Figure 44A:
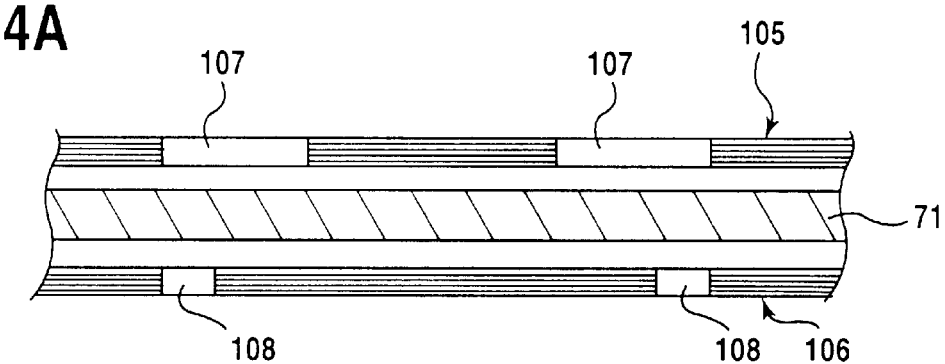
FIGS. 44A–44D are schematic illustrations showing a first variation of a lead frame production step.

In this variation, metal masks instead of photoresist material 73, 74 are used. That is, an upper metal mask 105 having openings at positions where the lead portions 66 are formed and a lower metal mask 106 having openings at positions where the terminal end portions 69 are formed are used, as shown in FIG. 44A.

Figure 44B:
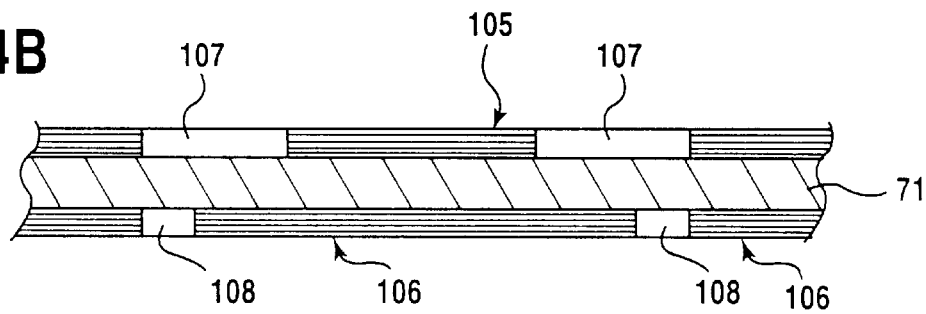
Figure 44C:
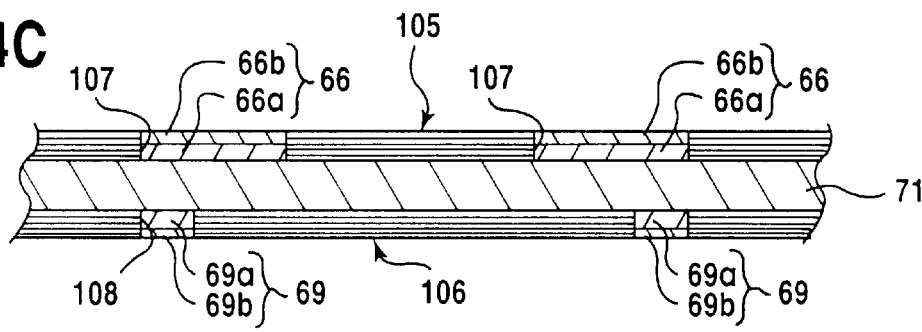

The upper metal mask 105 and the lower metal mask 106 are placed on the substrate 71, as shown in FIG. 44B. In this case, the upper metal mask 105 and the lower metal mask 106 are positioned on the substrate very accurately. After the metal masks 105, 106 are placed on the substrate 71, the substrate 71 is placed in a vaporization device or a sputtering device. Nickel, aluminum or titanium is vapored to the openings 107, 108 to form the inner layer 66a, 69a. On the inner layers 66a, 69a, gold, silver or palladium is vapored to form the outer layers 66b, 69b.

Figure 44D:
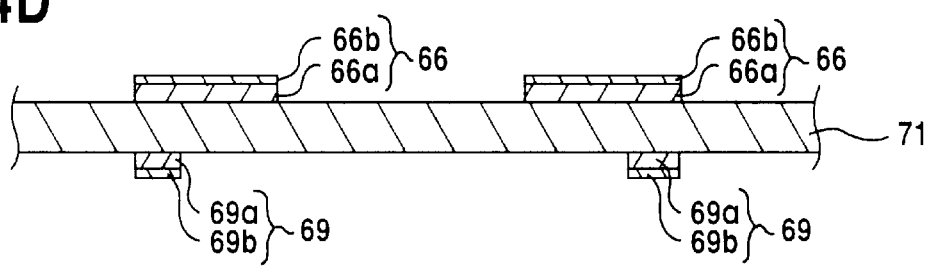

In the method described above, the lead portions 66 and the terminal end portions 69 are formed in the openings 107, 108 of the metal masks 105, 106. After the metal masks 105, 106 are removed from the substrate 71, the lead portions 66 and the terminal end portions 69 are formed in the substrate 71, as shown in FIG. 44D.

In the first variation described above, the lead portions 66 and the terminal end portions 69 are formed by the vaporization or the sputtering method. Also, since the metal masks 105, 106 have the openings 107, 108, the exposure and the development process required in the method using the photoresist materials 73, 74 can be omitted. Therefore, the lead frame production step can be simplified.

FIGS. 45A–45E show a second variation of the lead frame production step. In the lead frame production step described above, the inner layers 66a, 69a and the outer layers 66b, 69b defining the lead portion 66 and the terminal end portion 69 are formed in the openings 75, 76 of the photoresist materials 73, 74 provided on the substrate 71.

Figure 45A:
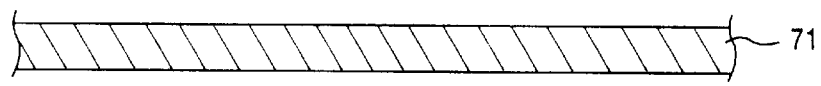
FIGS. 45A–45E are schematic illustrations showing a second variation of the lead frame production step.
Figure 45B:
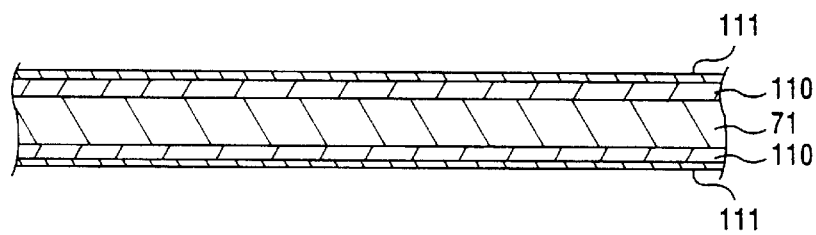

In this variation, after the inner layer 110 and the outer layer 111 defining the lead portion 66 and the terminal end portion 69 are formed on the surface of the substrate 71, the photoresist materials 112, 113 are provided. That is, on the upper surface and the lower surface of the substrate 71 shown in FIG. 45A, the inner layer 110 and the outer layer 111 are formed, as shown in FIG. 45B. The inner layer 110 and the outer layer 111 are formed by the plating method, the vaporization method or the sputtering method.

Figure 45C:
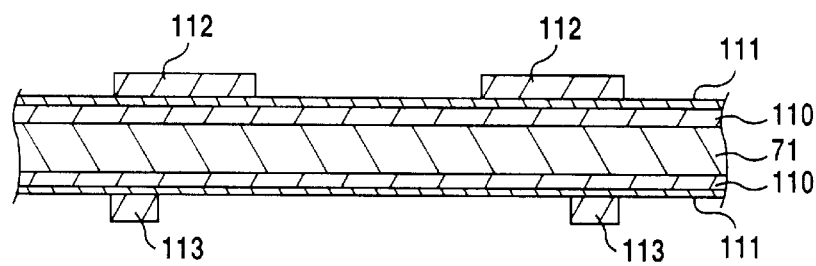

The photoresists 112, 113 are applied on the substrate 71 in which the inner layer 110 and the outer layer 111 are formed. By the photoresist material 112, 113 being exposed and developed, the photoresist material corresponding to the positions of the lead portions 66 and the terminal end portions 69 remain. FIG. 45C shows the substrate 71 after the above-described process.

Figure 45D:
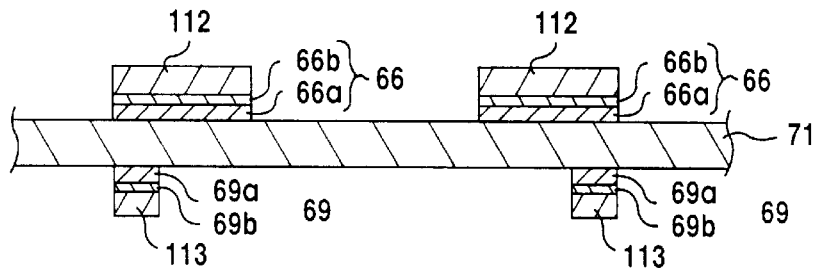
Figure 45E:
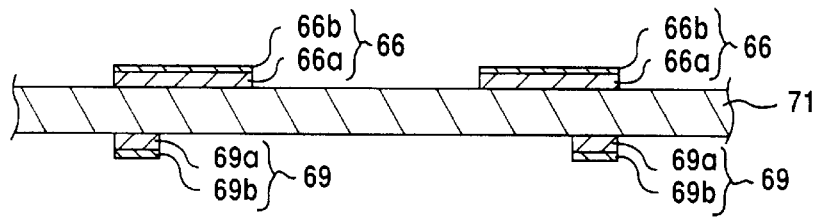

After that, the inner layer 110 and the outer layer 111 are etched by an etchant (etching liquid) which dissolves both the inner layer 110 and the outer layer 111. In this case, since the inner layer 110 and the outer layer 111 covered by the photoresist material 111 is not etched, the lead portions 66 and the terminal end portions 69 are formed on the substrate 71, as shown in FIG. 45D. After the photoresists 112, 113 remaining on the lead portions 66 and the terminal end portions 69 are removed, the substrate 71 having the lead portion 66 and the terminal end portion 69 is obtained, as shown in FIG. 45E.

In the second variation described above, the lead portion 66 and the terminal end portion 69 are formed by using the vaporization method or the sputtering method. The step using the photoresist materials 112, 113 is the same as that described above. In this variation, the production process can be simplified.

Next, a variation of the resin sealing step will be described. FIGS. 47A–47E show the variation of the resin sealing step. In the step for sealing resin described above, the sealing resin 63 is molded. However, since the production cost of the mold is high, the production cost of the semiconductor device is increased. In this variation of the resin sealing step, the sealing resin 116 is formed by a potting method instead of the molding method.

In this variation, a certain area of the substrate 71 where the sealing resin is provided is surrounded by a resin stopper 115 integrally provided on the substrate 71. The resin stopper 115 is a projection protruding from the substrate 71, which is formed by, for example, a pressing-process or a cutting-process.

Figure 47A:
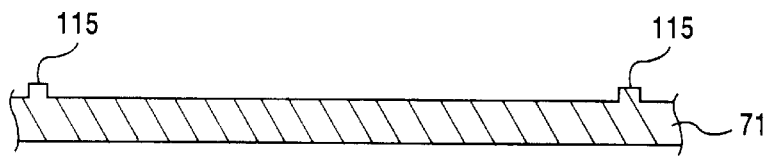
FIGS. 47A–47E are schematic illustrations showing a variation of a resin sealing step.
Figure 47B:
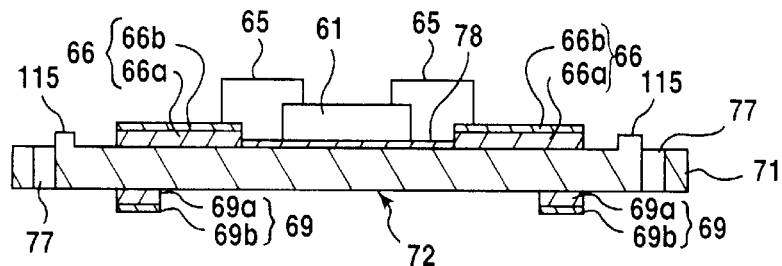

After that, through the lead frame production step and the semiconductor chip mounting step, the semiconductor chip 61, the wires 65, the lead portions 66 and the terminal end portions 69 are provided on the substrate 71, as shown in FIG. 47B. In the example shown in FIGS. 47A–47E, soluble insulating material 78 can be provided under the semiconductor chip 61.

Figure 47C:
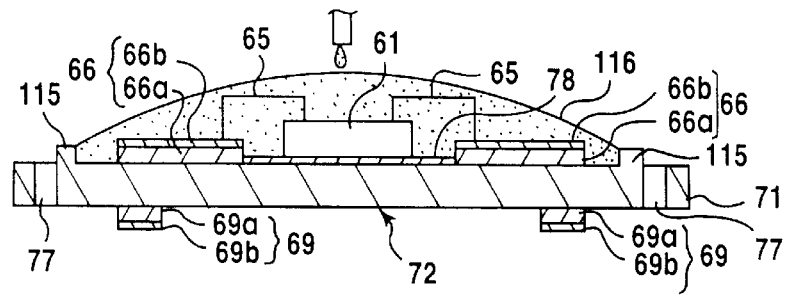
Figure 47D:
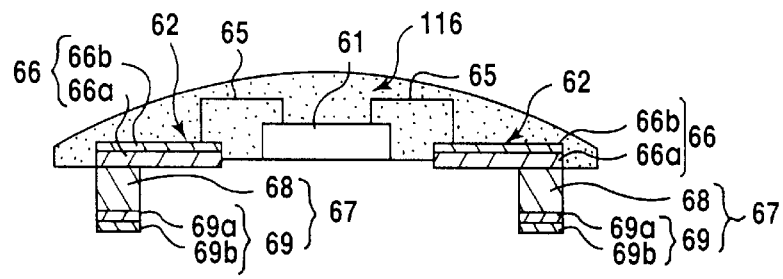

In the step for applying sealing resin, the sealing resin 116 is applied by the potting method, as shown in FIG. 47C. Since the resin stopper 115 is provided on the substrate 71, the resin potted in the resin sealing step does not leak outside of the resin stopper 116.

In the above method, the sealing resin 116 can be formed using the potting method. In this method, a mold is not used to form the sealing resin. Therefore, the step for applying sealing resin can be simplified and the production cost of the semiconductor device can be reduced.

After the sealing resin 116 is formed by the potting method, the substrate removal step is performed. The substrate 71 is etched, except for portions between the lead portions 66 and the terminal end portions 69, to form the outer connecting terminal 67 shown in FIG. 47D. In this case, since the resin stopper 115 is integrally formed on the substrate 71, the resin stopper 115 is removed by the etching process.

Figure 47E:
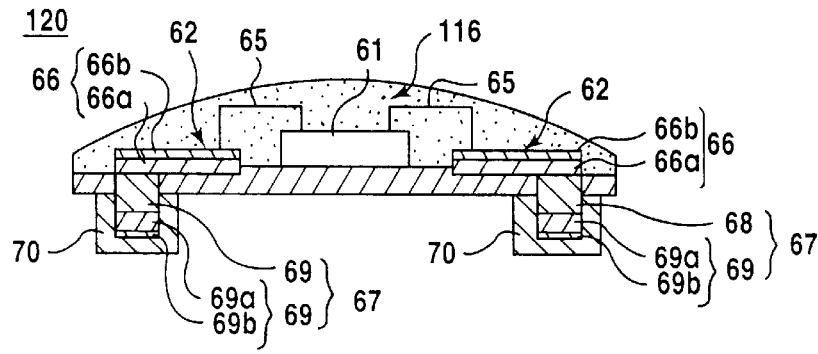

After the solder resist 64 is formed in the insulating material providing step, the outer layers 70 are formed on the outer connecting terminals 67 in the sheathing step to form the semiconductor device 120 shown in FIG. 47E. Since the resin stopper 115 is removed by the etching process in the substrate removal step, the resin stopper 115 does not remain in the semiconductor device 120 shown in FIG. 47E. Thus, an interruption of the surface due to the resin stopper 115 can be avoided and the semiconductor device can be miniaturized.

Figure 48A:
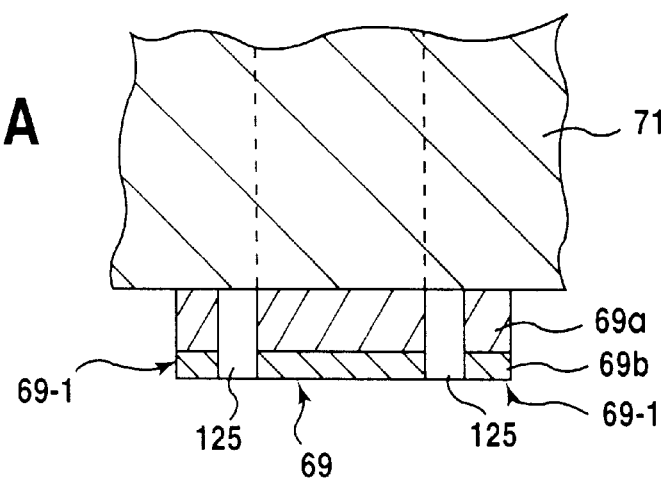
FIGS. 48A–48C are schematic illustrations showing a variation of a substrate removal step.
Figure 48B:
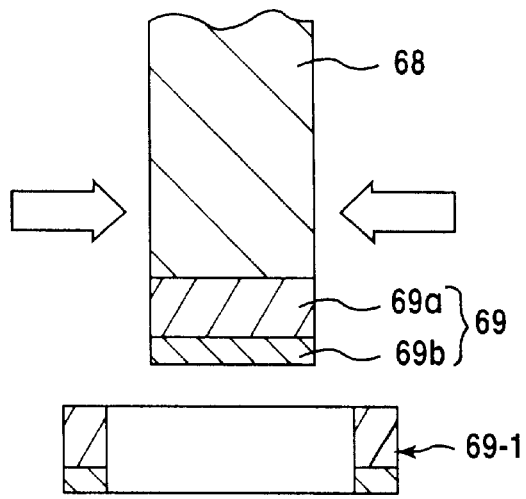
Figure 48C:
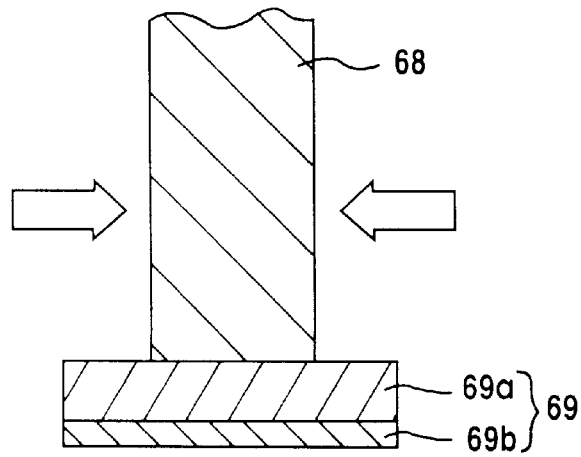

Next, a variation of the substrate removal step will be described. FIGS. 48A–48C show the variation of the substrate removal step. In the step for removing the substrate described above, the terminal end portions 69 do not have a cut portion and are used as the resist in order to form the pole terminal portions 68 by etching of the substrate 71. Thus, when the substrate 71 is over-etched, the terminal end portions 69 extend laterally from the pole terminal portions 68, as shown in FIG. 48C and terminal end portions having a proper shape can not be obtained.

In this embodiment, cut portions 125 having a cross-section corresponding to the outer connecting terminal 67 (pole terminal portion 68) are formed in the terminal end portion 69 before the substrate 71 is etched by the etching liquid in order to prevent the terminal end portion 69 from being extended laterally from the pole terminal portion 68. FIG. 48A is an enlarged view showing a terminal end portion 69 having the cut portion 125. As shown in FIG. 48A, the cut portion 125 is located in the terminal end portion 69 at positions corresponding to the shape of the pole terminal portion 68 (shown by dotted line in the drawing).

The cut portion 125 is formed by the photoresist 74 which remains at positions where the cut portions 125 are formed in the step shown in FIG. 35C. Alternatively, after the lead frame production step shown in FIGS. 35A–35F, the cut portions 125 can be formed in the terminal end portion 69 by a laser beam.

When the substrate 71 having terminal end portions 69 in which the cut portions are formed are etched, an outer portion from the cut portion 125 in the terminal end portion 69 (hereinafter, referred to as outer periphery portion 69-1) is fixed to the substrate 71 until the etching does not reach the cut portions 125 formed in the terminal end portion 69.

However, when the etching reaches the cut portions 125 formed in the terminal end portion 69, the outer periphery portions 69-1 are separated from the substrate 71 and the terminal end portion 69. Therefore, according to the present variation, the terminal end portion 69 is prevented from being extended laterally from the pole terminal portion 68 and a lead of proper shape is provided.

Figure 49A:
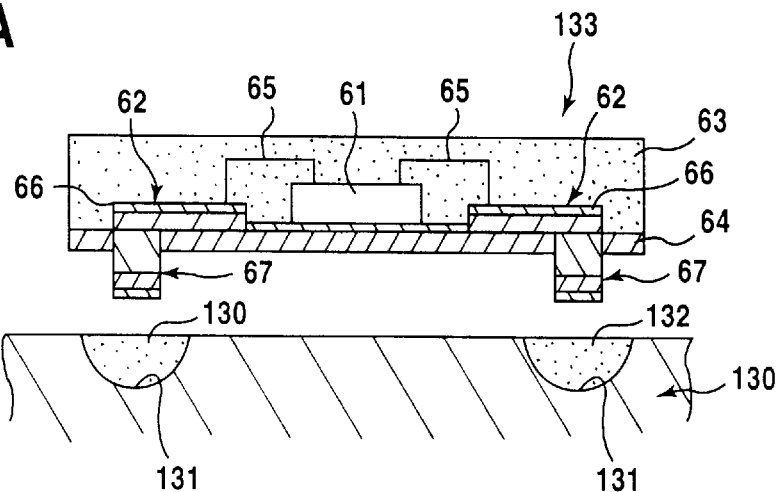
FIGS. 49A–49C are schematic illustrations showing a variation of a sheathing step.

Next, a variation of the sheathing step will be described, referring to FIGS. 49A, 49B, 49C. In the sheathing step described above, the outer layers 70 are plated on the outer connecting portions 67 by electroless plating. In this variation, the outer layers 70 are formed using a dimple plate 130. Hereinafter, this method is described in detail.

In order to form the outer layer 70, the dimple plate 130 having dimple portions 131 at positions corresponding to the outer connecting terminal 67 is prepared. The dimple plate 130 is made of, for example, ceramic or metal. The dimple portion is a hemispherical recess formed in the dimple plate 130.

A solder paste 132 is filled in the dimple portions 131 by a squeegee using a thick layer printing technique. Since each of the dimple portions 131 is uniformly formed, the amount of the solder paste filling in each of the dimple portion 131 is the same. FIG. 49A shows the dimple portion 131 which receive the solder paste 132.

Figure 49B:
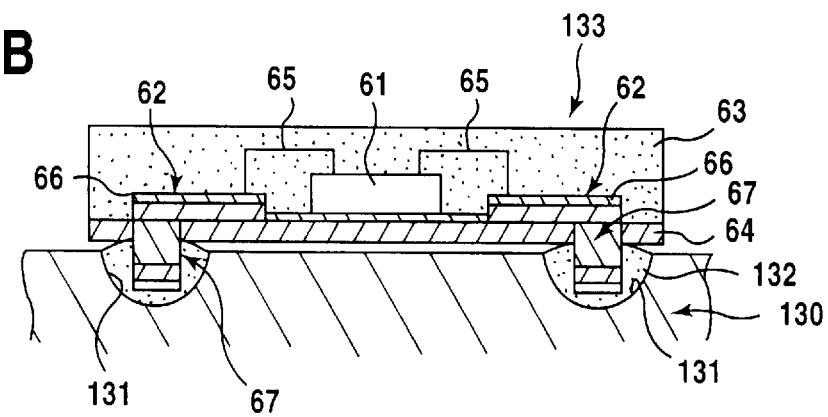
Figure 49C:
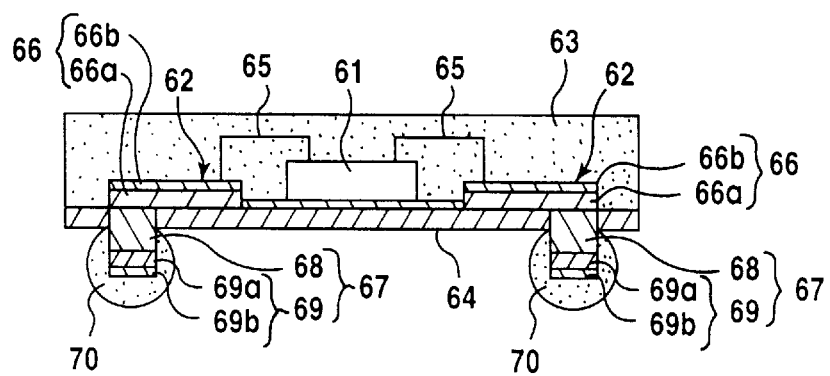

The outer connecting terminals 67 are inserted in the dimple portions 131 in which the solder paste 132 is filled, as shown in FIG. 49B. The semiconductor device assembly 133 is heated in a reflow furnace when the outer connecting terminal 67 is inserted in the dimple 131. Through the processes described above, the outer layers 70 made of solder are formed on the outer connecting terminals 67, as shown in FIG. 49C.

In this embodiment, after the outer connecting terminal 67 is inserted in the dimple portions 131 filled with the solder paste 132, the outer connecting terminal 67 is heated to form the outer layer 70 on the outer connecting terminal 67, as discussed above. Therefore, the sheathing step can be conducted easily.

In the conventional sheathing step using the dimple plate, after the solder paste is filled in the dimple portions of the dimple plate, a first heating treatment is conducted on the dimple plate to form the solder ball in the dimple. Next, a second heating treatment is conducted on the dimple plate to provide the solder ball to the outer connecting terminal.

In this variation of the sheathing step, the outer connecting terminal 67 inserted in the dimple 131 filled with the solder paste is heated to provide the solder to the outer connecting terminal 67. That is, the number of heat treatment can be reduced and the sheathing step can be simplified.

Figure 50A:
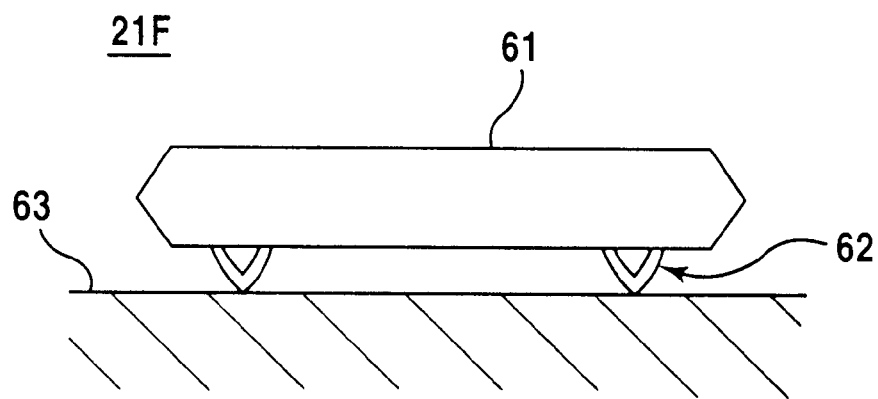
FIG. 50A is a schematic illustration showing a ninth embodiment of the present invention.
Figure 50B:
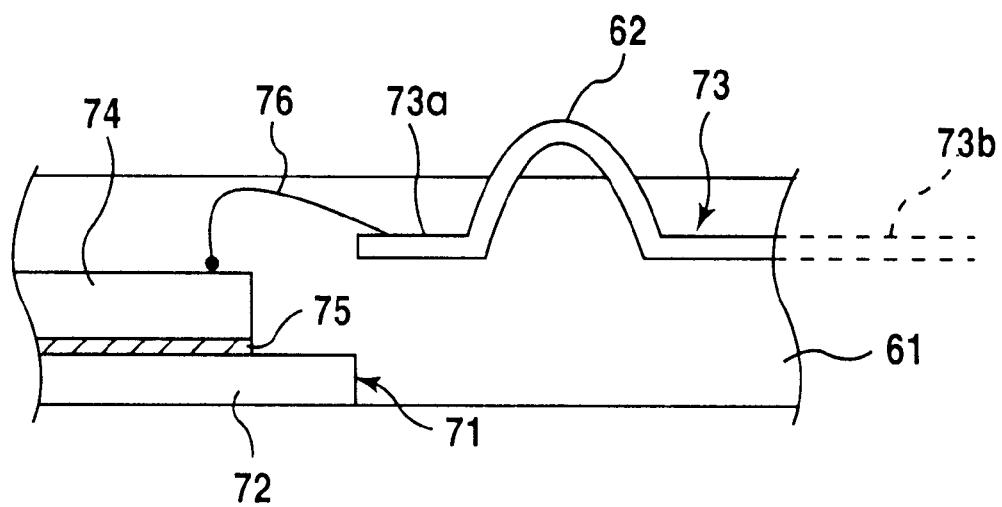
FIG. 50B is an enlarged sectional view showing the ninth embodiment of the present invention.

FIGS. 50A and 50B are schematic illustrations showing a ninth embodiment of the present invention, in which FIG. 50A is a side view and FIG. 50B is a sectional view.

The semiconductor device 21F shown in FIG. 50A is a SOJ (Small Outline J-Leaded Package) type semiconductor device, in which a predetermined number of terminal portions 62 of V-shape, arranged in two lines, protrude from one face of the package 61. The semiconductor device 21F is mounted on a pattern (not shown) formed on a substrate 63 through, for example, solder.

The semiconductor device 21F has a stage 72, which is a part of the lead frame, and leads 73 provided in both sides of the stage 72, as shown in FIG. 50B. The lead 73 has an inner lead 73a which is positioned in the package 61 and an outer lead 73b which is positioned outside the package and removed by a final cutting. The inner lead 73a is bent to form the V-shaped terminal portion 62.

Figure 51A:
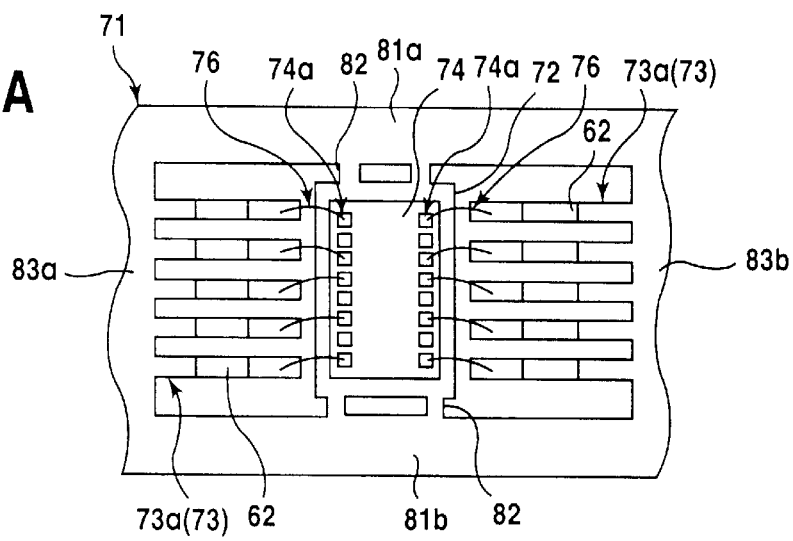
FIGS. 51A, 51B, 51C and 51D are schematic illustrations showing production steps of the semiconductor device of the ninth embodiment.

A semiconductor chip 74 having a plurality of electrode pads (not shown in FIG. 50B, Cf. FIG. 51A) is mounted on the stage 72 through an adhesive such as silver paste. Each of the electrode pads are electrically connected to a tip end of the inner lead 73 through a wire 76.

Since the part of the inner lead 73a, which functions as a terminal portion 62, is exposed from one face of the package 61, the semiconductor device 21F is decreased in size and the number of terminals provided therein can be reduced, compared with the conventional SOJ-type semiconductor device. Also, since an area required for packaging is reduced, a highly-integrated package structure semiconductor device can be realized. Further, by the V-shaped terminal portion 62, the mechanical strength thereof is increased and reliability of the semiconductor device is improved. Moreover, since the wiring board or the solder bump required in the production of the BGA-type semiconductor device is not required and the number of parts is reduced, the production cost thereof is lowered.

In the above embodiment, the terminal portion 62 has the V-shape. However, the terminal portion 62 may be formed in a U-shape or an arch projection shape.

FIGS. 51A, 51B, 51C and 51 are schematic illustrations showing production steps of the semiconductor device of the ninth embodiment. In FIG. 51A, the stage 72 is supported between cradles 81a, 81b by a support bar 82 in the lead frame 71. A predetermined number of leads 73 is formed integrally in the stage direction from the tiebar cross-link. The inner lead 73a of the lead 73 is bent to form the V-shaped terminal portion 62.

The semiconductor chip 74 having a plurality of clamped electrode pads 74a is mounted on the stage 72 through the adhesive 75. After that, the electrode pad 74a is connected to the tip end of the inner lead 73 through a gold wire 76.

Figure 51B:
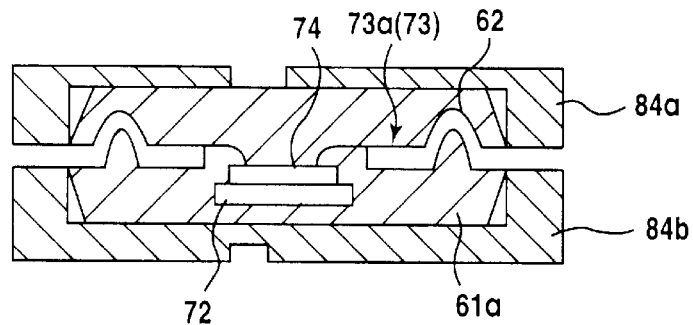
Figure 51C:
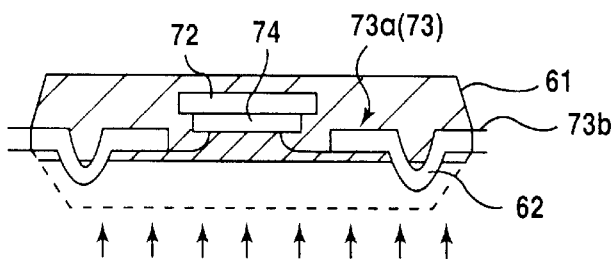

The lead frame 71 having a semiconductor chip 74 mounted thereon is clamped between molds 84a, 84b. A sealing resin is molded between the molds 84a, 84b to form the resin portion 61a, as shown in FIG. 51B. After the resin portion is molded, one face of the resin portion 61a which the terminal portions 62 face, is ground by a blasting method so that the terminal portions 62 are exposed. In the blasting method, abrasive is blown to the resin portion 61a to grind the resin portion 61a. The resin sticking to the inner side of the terminal portion 62 is removed by the abrasive blown from a different direction. By the grinding, contactivity of the solder is improved and the semiconductor device can be mounted securely. The grinding may be conducted by, for example, etching using chemicals.

After the blasting process, the outer leads 73b protruding from the side face of the package 61 are removed by cutting. The terminal portions 62 exposed from the package are plated with solder to secure mounting on the substrate.

Figure 51D:
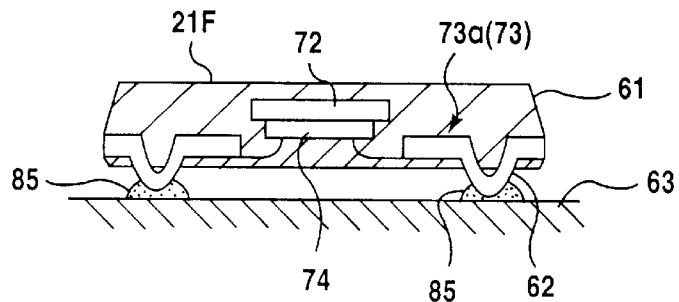

The semiconductor device 21F is mounted on the pattern of the substrate 62 through solder 85, as shown in FIG. 51D.

Figure 52:
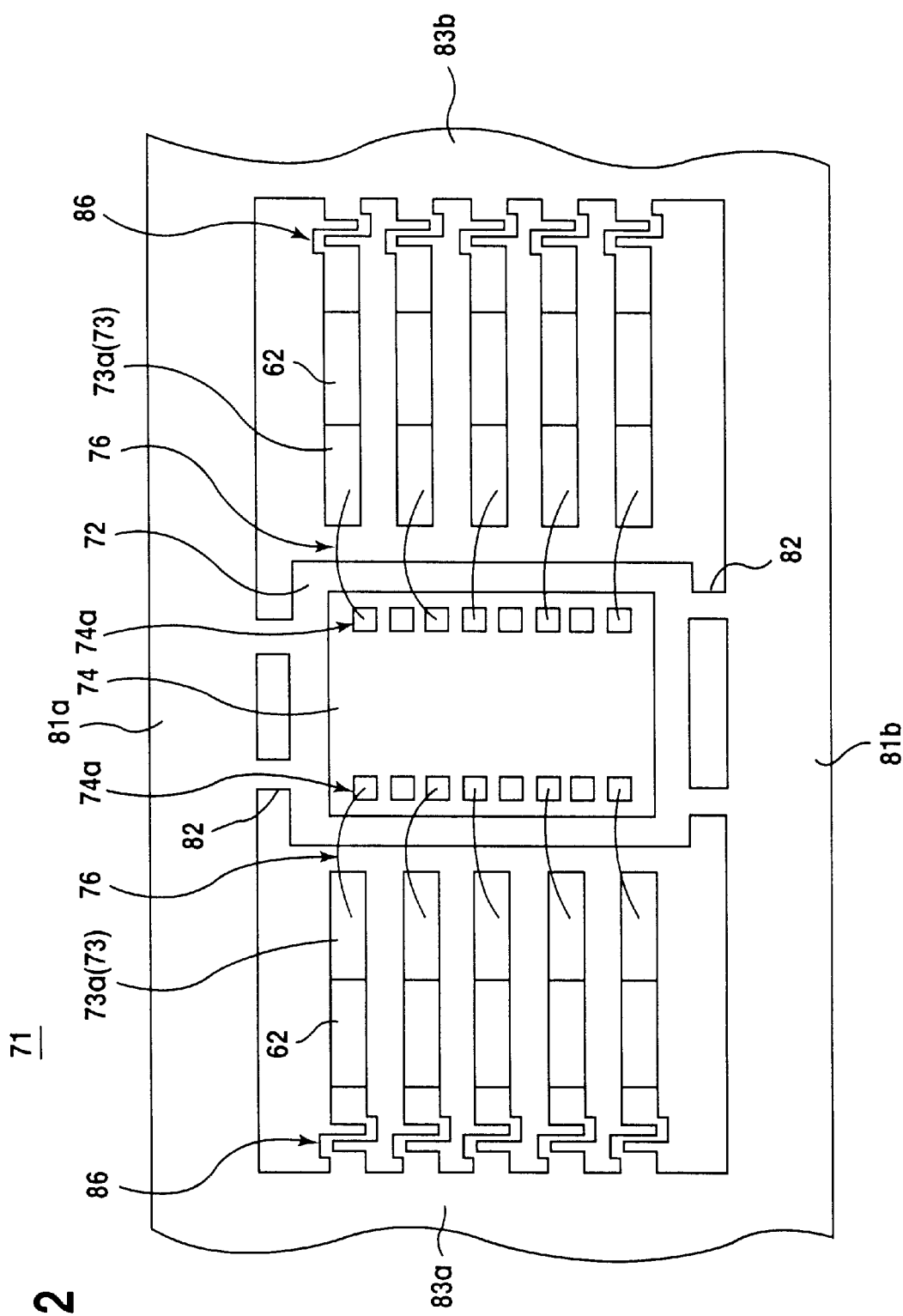
FIG. 52 is a schematic illustration showing a variation of the ninth embodiment of the present invention.
Figure 53A:
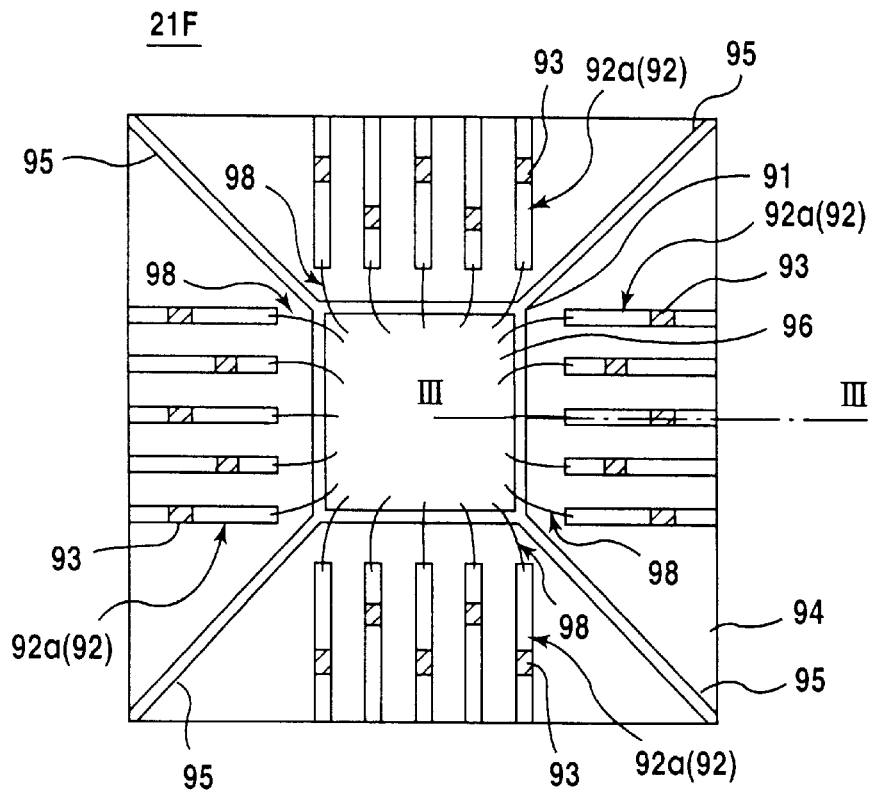
FIG. 53A is an inner plan view showing a variation of the ninth embodiment of the present invention.
Figure 53B:
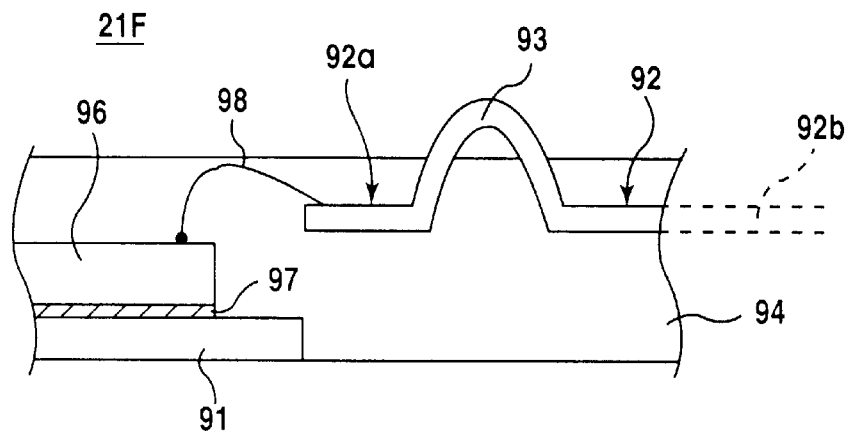
FIG. 53B is a sectional view taken on line III—III of FIG. 53A.

FIGS. 52, 53A and 53B show a variation of the ninth embodiment. FIG. 52 shows the lead frame 71 shown in FIG. 51A, in which expansion portions 86 are provide. The expansion portion 86 is a crank-shaped root portion of the lead 73 extending from the tiebar 83a, 83b. Other features are the same as those shown in FIG. 51A.

The expansion portion 86 prevents flexure of the lead frame 71 when the lead 73 is bent to form the terminal portion 62 of the inner lead 73a. The terminal portion 62 is provided in the inner lead 37a accurately in position.

FIGS. 53A and 53B show a QFP-type semiconductor 21G, in which FIG. 53A is an internal plan view and FIG. 53B is a sectional view taken on a line A—A of FIG. 53A. In the semiconductor device 21F shown in FIGS. 53A and 53B, the leads are provided along four edges of the stage 91. The lead 92 has an inner lead 92a which is positioned in the package 94 and an outer lead which is positioned outside the package 94 and is removed by cutting. The semiconductor device has a support bar 95 to support the stage 91 before assembling the semiconductor device.

In the inner lead 92a, the projecting terminal portions 93 of V-shape, U-shape or arch-shape formed by bending are arranged in a staggered configuration. The terminal portion 93 is exposed from one face of the package 94. On the package 94 also, the terminal portion is arranged in a staggered configuration.

The semiconductor chip 96 is mounted on the stage 91 through an adhesive 97 such as silver paste. The semiconductor chip 96 is electrically connected to the tip end of the inner leads 92a.

The semiconductor device 21F is produced in the same manner as that shown in FIGS. 51A–51D. Also, by providing the expansion portions in the lead frame, the terminal portion 62 can be provided accurately.

In this embodiment, the wiring board or solder bump required in the BGA technique can be omitted in the production of the QFP-type semiconductor device. Thus, the number of production steps and parts, and the production cost can be reduced.

By arranging the terminal portions in the staggered configuration, the connecting portion of the terminal portion 93 is provided even when the pattern formed in the substrate is integrated. Also, a highly-integrated package can be provided.

Further, the present inventions are not limited to these embodiments, but various variations and modifications may be made without departing form the scope of the present invention.

What is claimed is:

1. A semiconductor device comprising:

a semiconductor chip;

a lead member having a lead portion and an outer connecting terminal connected integrally to, and extending downward from, said lead portion, said lead portion being electrically connected to said semiconductor chip and extending outwardly from said semiconductor chip;

a sealing resin sealing said semiconductor chip and said lead portion, a bottom face of said semiconductor chip and a bottom face of said lead portion being exposed from said sealing resin; and an insulating member covering said bottom surface of said semiconductor chip and said bottom face of said lead portion, said outer connecting terminal having a pole terminal portion and a terminal end portion, the pole terminal portion partially embedded in said insulating member and protruding from a bottom surface of the insulating member, said terminal end portion including a stacked layer structure having a plurality of stacked layers, including an inner layer and an outer layer, made of different materials.

2. The semiconductor device according to claim 1, wherein said outer connecting terminal of said lead member has a pole terminal portion and a terminal end portion provided under said pole terminal portion, said lead portion and said terminal end portion being of a material which functions as a resist to said pole terminal portion.

3. The semiconductor device according to claim 2, wherein said lead portion has a lower layer made of a material selected from the group consisting of nickel, aluminum and titanium and an upper layer made of a material selected from the group consisting of gold, silver and palladium, said pole terminal portion being made of copper, and said terminal end portion having an upper layer made of a material selected from the group consisting of nickel, aluminum and titanium.

4. The semiconductor device according to claim 1, further comprising a second insulating member between said semiconductor chip and said insulating material.

5. The semiconductor device according to claim 1, wherein said outer connecting terminal is provided under said semiconductor chip.

6. The semiconductor device according to claim 1, wherein a plurality of outer connecting terminals are provided, at least one of said outer connecting terminal being provided under said semiconductor chip and at least one of said outer connecting terminal being provided outwardly of said semiconductor chip.

7. The semiconductor device as claimed in claim 1, wherein the plurality of stacked layers include a pole terminal portion made of material which is etched by an etchant and a terminal end portion made of material which is not etched thereby.

* * * * *